(12) United States Patent
Yamazaki et al.

(10) Patent No.: US 11,205,664 B2
(45) Date of Patent: Dec. 21, 2021

(54) SEMICONDUCTOR DEVICE AND METHOD FOR MANUFACTURING SEMICONDUCTOR DEVICE

(71) Applicant: Semiconductor Energy Laboratory Co., Ltd., Atsugi (JP)

(72) Inventors: Shunpei Yamazaki, Setagaya (JP); Ryota Hodo, Atsugi (JP); Tomoyo Kamogawa, Kako (JP); Katsuaki Tochibayashi, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/770,670

(22) PCT Filed: Dec. 19, 2018

(86) PCT No.: PCT/IB2018/060305
§ 371 (c)(1),
(2) Date: Jun. 8, 2020

(87) PCT Pub. No.: WO2019/130162
PCT Pub. Date: Jul. 4, 2019

(65) Prior Publication Data
US 2021/0183906 A1    Jun. 17, 2021

(30) Foreign Application Priority Data

Dec. 27, 2017   (JP) .............................. JP2017-250397
Jan. 24, 2018   (JP) .............................. JP2018-009944

(51) Int. Cl.
*H01L 27/00*   (2006.01)
*H01L 29/00*   (2006.01)
(Continued)

(52) U.S. Cl.
CPC .......... *H01L 27/1225* (2013.01); *H01L 29/24* (2013.01); *H01L 29/66742* (2013.01); *H01L 29/7869* (2013.01)

(58) Field of Classification Search
CPC ............. H01L 27/1225; H01L 27/1207; H01L 27/1156; H01L 27/1255; H01L 27/0688;
(Continued)

(56) References Cited

U.S. PATENT DOCUMENTS 9,812,587 B2 * 11/2017 Yamazaki ........... H01L 29/4908
9,947,777 B2    4/2018 Yamazaki et al.
(Continued)

FOREIGN PATENT DOCUMENTS

| CN | 107046040 A | 8/2017 |
|---|---|---|
| JP | 2017-098535 A | 6/2017 |

(Continued)

OTHER PUBLICATIONS

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

(Continued)

*Primary Examiner* — Nikolay K Yushin
(74) *Attorney, Agent, or Firm* — Robinson Intellectual Property Law Office; Eric J. Robinson

(57) ABSTRACT

A highly reliable semiconductor device having a high on-state current is provided. The semiconductor device includes a first insulator, a second insulator over the first insulator, a first oxide over the first insulator, a second oxide over the first oxide, a first conductor and a second conductor over the second oxide, a third insulator over the first conductor, a fourth insulator over the second conductor, a third oxide over the second oxide, a fifth insulator over the third oxide, (Continued)

a third conductor that is positioned over the fifth insulator and overlaps with the third oxide, a sixth insulator covering the first to fifth insulators, the first oxide, the second oxide, and the first to third conductors, and a seventh insulator over the sixth insulator.

12 Claims, 26 Drawing Sheets

(51) Int. Cl.
  *H01L 27/12* (2006.01)
  *H01L 29/24* (2006.01)
  *H01L 29/66* (2006.01)
  *H01L 29/786* (2006.01)

(58) Field of Classification Search
  CPC ............... H01L 29/24; H01L 29/66742; H01L 29/7869
  See application file for complete search history.

(56) References Cited

U.S. PATENT DOCUMENTS

| | | | |
|---|---|---|---|
| 10,032,918 | B2 | 7/2018 | Yamazaki et al. |
| 10,096,720 | B2 | 10/2018 | Ando |
| 10,115,741 | B2 | 10/2018 | Matsuda et al. |
| 2016/0218225 | A1* | 7/2016 | Yamazaki ........... H01L 27/1225 |
| 2017/0229486 | A1 | 8/2017 | Matsuda et al. |
| 2017/0263651 | A1 | 9/2017 | Tochibayashi et al. |
| 2017/0278973 | A1 | 9/2017 | Ando |
| 2017/0309732 | A1 | 10/2017 | Yamazaki et al. |
| 2017/0309752 | A1 | 10/2017 | Yamazaki et al. |
| 2018/0233588 | A1 | 8/2018 | Yamazaki et al. |

FOREIGN PATENT DOCUMENTS

| | | |
|---|---|---|
| JP | 2017-143255 A | 8/2017 |
| JP | 2017-168839 A | 9/2017 |
| JP | 2017-183718 A | 10/2017 |
| JP | 2017-199900 A | 11/2017 |
| JP | 2017-199901 A | 11/2017 |
| KR | 2017-0093709 A | 8/2017 |
| TW | 201738978 | 11/2017 |
| WO | WO-2017/072627 | 5/2017 |

OTHER PUBLICATIONS

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

International Search Report (Application No. PCT/IB2018/060305) dated Mar. 26, 2019.

Written Opinion (Application No. PCT/IB2018/060305) dated Mar. 26, 2019.

* cited by examiner

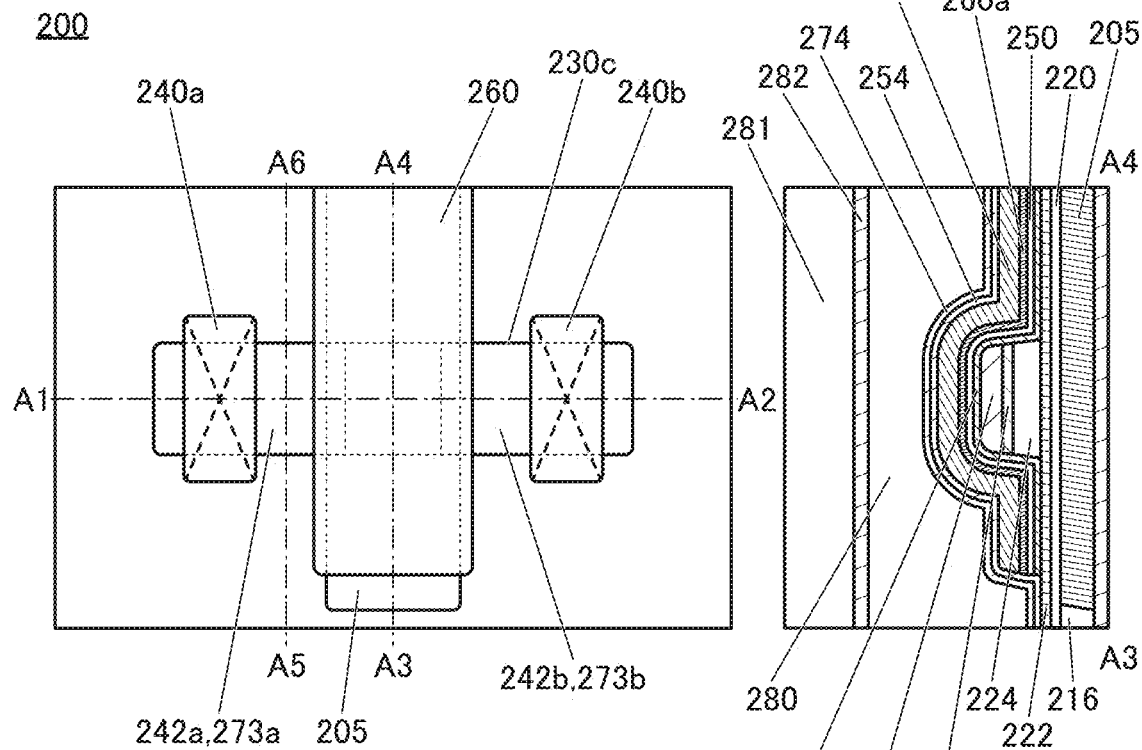
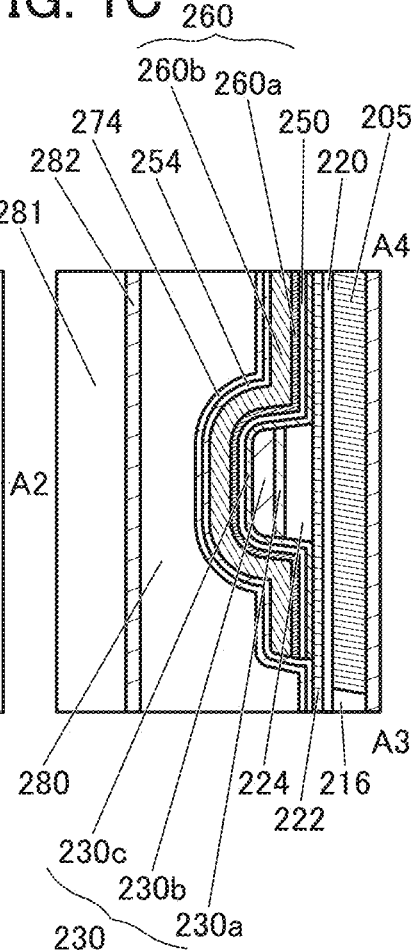
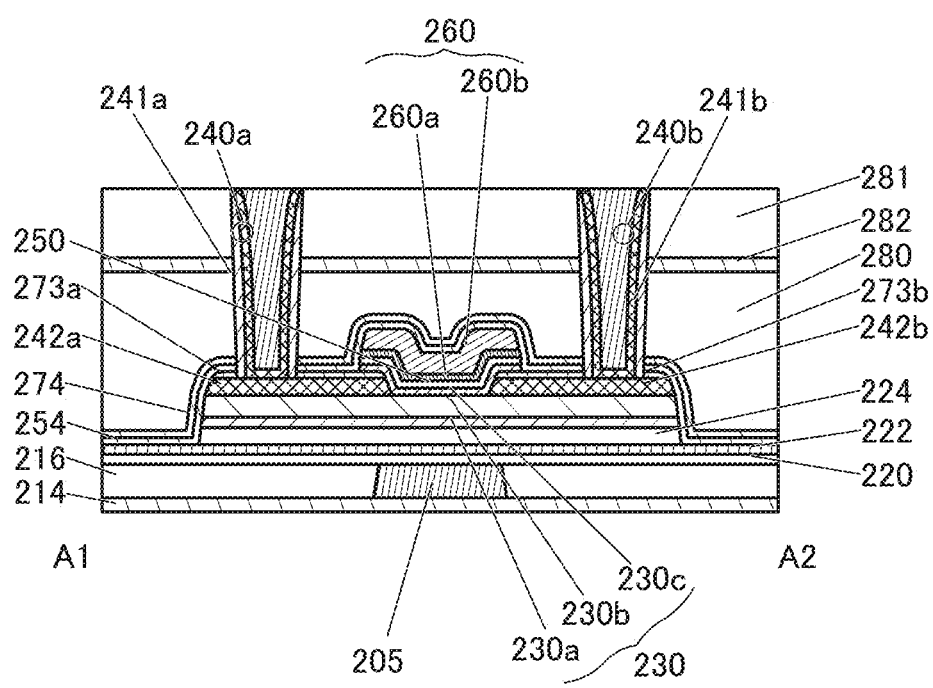

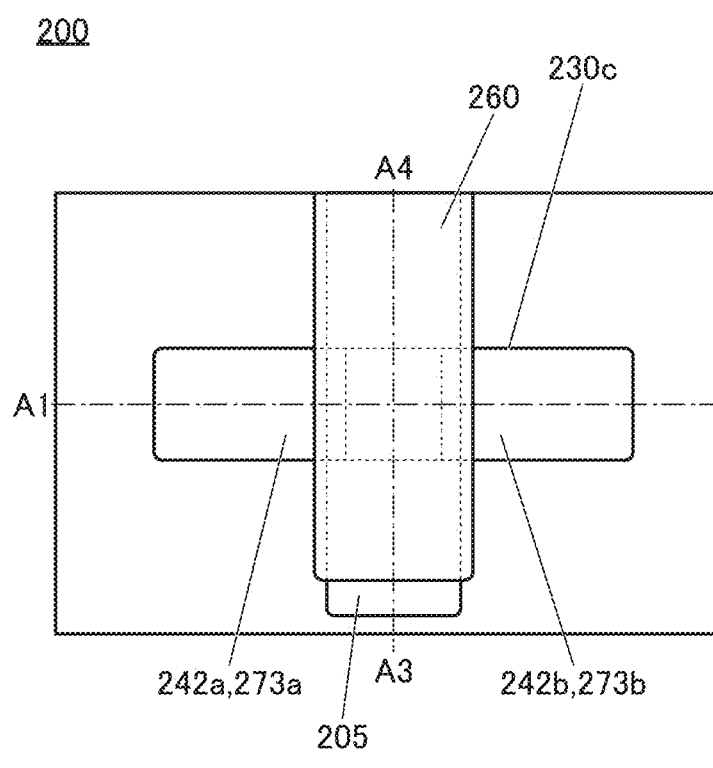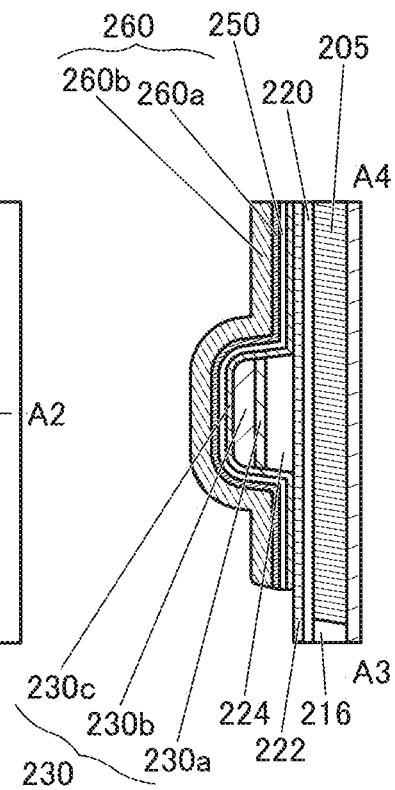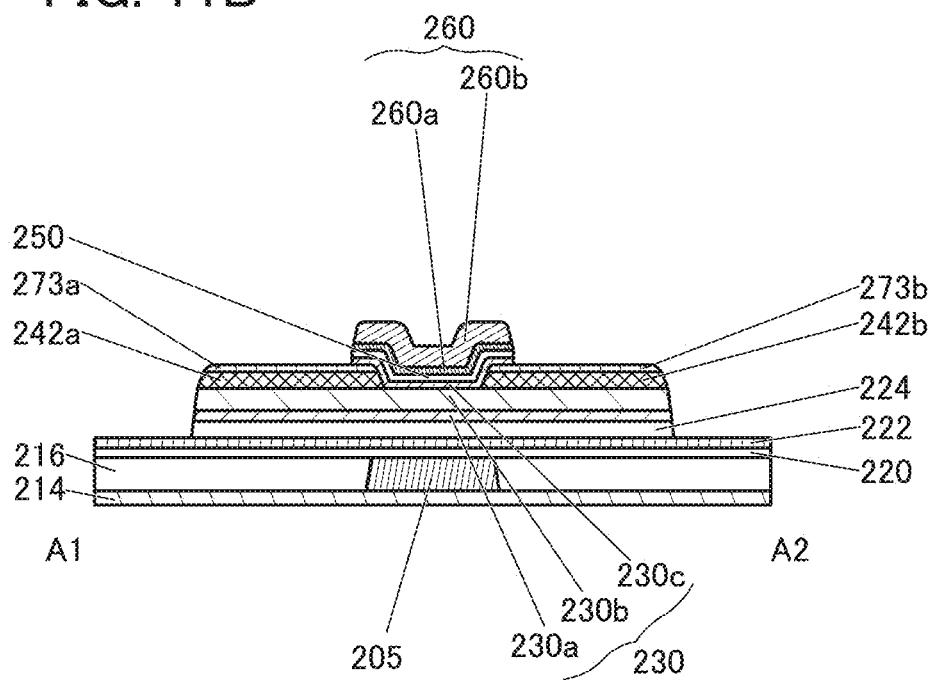

FIG. 21A
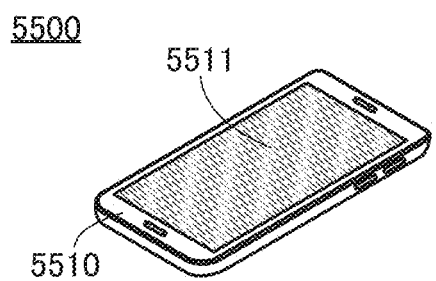
FIG. 21B
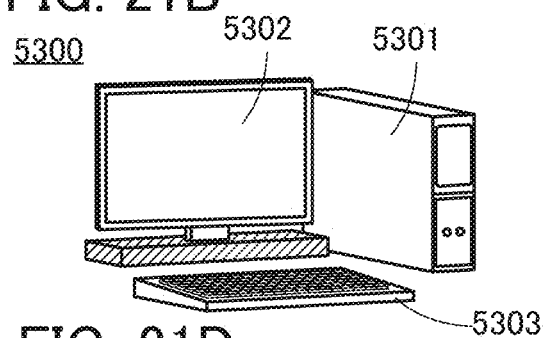
FIG. 21C
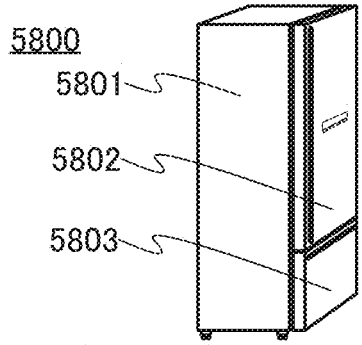
FIG. 21D
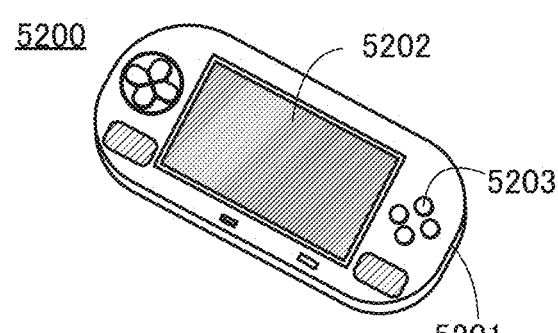
FIG. 21E1
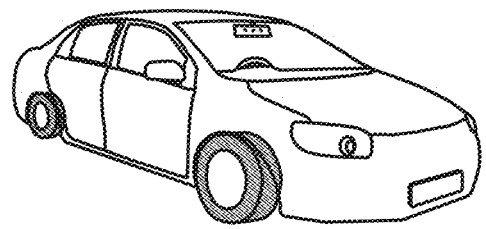
FIG. 21E2
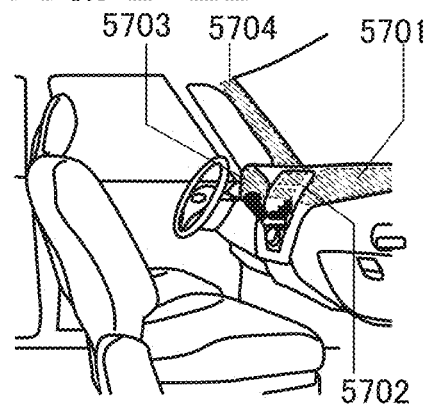
FIG. 21F
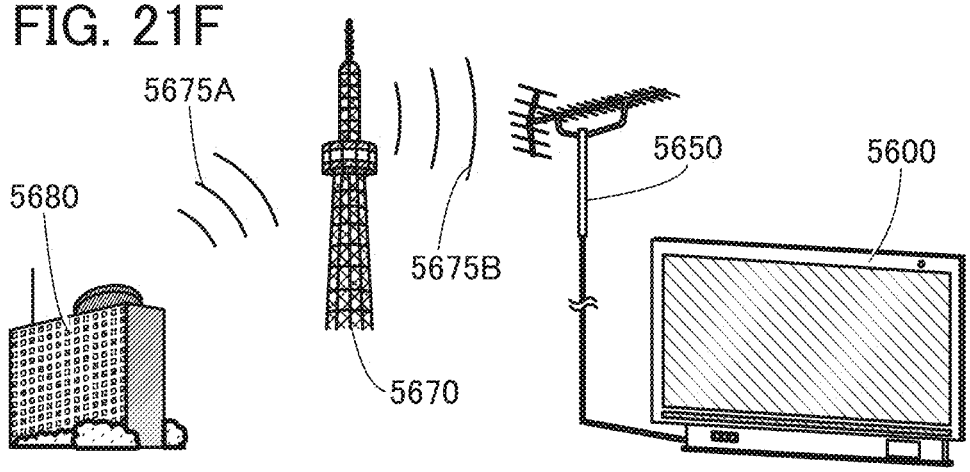

| Polygons | |
|---|---|
| Type | Proportion[%] |
| triangle | 0 |
| tetragon | 0.88 |
| pentagon | 20.35 |
| hexagon | 58.37 |
| heptagon | 18.86 |
| octagon | 1.51 |
| more than nonagon | 0.03 |

| Polygons | |
|---|---|
| Type | Proportion[%] |
| triangle | 0 |
| tetragon | 0.5 |
| pentagon | 18.56 |
| hexagon | 62.71 |
| heptagon | 17.02 |
| octagon | 1.19 |
| more than nonagon | 0.02 |

| Polygons | |
|---|---|
| Type | Proportion[%] |
| triangle | 0 |
| tetragon | 0.49 |
| pentagon | 18.98 |
| hexagon | 61.94 |
| heptagon | 17.37 |
| octagon | 1.19 |
| more than nonagon | 0.03 |

SEMICONDUCTOR DEVICE AND METHOD FOR MANUFACTURING SEMICONDUCTOR DEVICE

TECHNICAL FIELD

One embodiment of the present invention relates to a semiconductor device and a method for manufacturing the semiconductor device. Another embodiment of the present invention relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

A silicon-based semiconductor material is widely known as a material of a semiconductor thin film that can be used in a transistor, and as another material, an oxide semiconductor has attracted attention. As the oxide semiconductor, not only single-component metal oxides, such as indium oxide and zinc oxide, but also multi-component metal oxides are known. Among the multi-component metal oxides, in particular, an In—Ga—Zn oxide (hereinafter also referred to as IGZO) has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3). In Non-Patent Document 1 and Non-Patent Document 2, a technique for manufacturing a transistor using an oxide semiconductor having a CAAC structure is also disclosed. Moreover, Non-Patent Document 4 and Non-Patent Document 5 show that a fine crystal is included even in an oxide semiconductor which has lower crystallinity than an oxide semiconductor having the CAAC structure or the nc structure.

In addition, a transistor that uses IGZO for an active layer has an extremely low off-state current (see Non-Patent Document 6), and an LSI and a display utilizing the characteristics have been reported (see Non-Patent Document 7 and Non-Patent Document 8).

PRIOR ART DOCUMENTS

Non-Patent Documents

[Non-Patent Document 1] S. Yamazaki et al., "SID Symposium Digest of Technical Papers", 2012, volume 43, issue 1, pp. 183-186.

[Non-Patent Document 2] S. Yamazaki et al., "Japanese Journal of Applied Physics", 2014, volume 53, Number 4S, pp. 04ED18-1-04ED18-10.

[Non-Patent Document 3] S. Ito et al., "The Proceedings of AM-FPD '13 Digest of Technical Papers", 2013, pp. 151-154.

[Non-Patent Document 4] S. Yamazaki et al., "ECS Journal of Solid State Science and Technology", 2014, volume 3, issue 9, pp. Q3012-Q3022.

[Non-Patent Document 5] S. Yamazaki, "ECS Transactions", 2014, volume 64, issue 10, pp. 155-164.

[Non-Patent Document 6] K. Kato et al., "Japanese Journal of Applied Physics", 2012, volume 51, pp. 021201-1-021201-7.

[Non-Patent Document 7] S. Matsuda et al., "2015 Symposium on VLSI Technology Digest of Technical Papers", 2015, pp. T216-T217.

[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

An object of one embodiment of the present invention is to provide a semiconductor device having a high on-state current. Another object of one embodiment of the present invention is to provide a semiconductor device having excellent frequency characteristics. Alternatively, an object of one embodiment of the present invention is to provide a semiconductor device having favorable reliability. Alternatively, an object of one embodiment of the present invention is to provide a semiconductor device that can be miniaturized or highly integrated. Alternatively, an object of one embodiment of the present invention is to provide a semiconductor device having favorable electrical characteristics. Alternatively, an object of one embodiment of the present invention is to provide a semiconductor device having high productivity.

An object of one embodiment of the present invention is to provide a semiconductor device capable of retaining data for a long time. An object of one embodiment of the present invention is to provide a semiconductor device capable of high-speed information writing. An object of one embodiment of the present invention is to provide a semiconductor device having high design flexibility. An object of one embodiment of the present invention is to provide a semiconductor device in which power consumption can be reduced. An object of one embodiment of the present invention is to provide a novel semiconductor device.

Note that the descriptions of these objects do not preclude the existence of other objects. Note that one embodiment of the present invention does not necessarily achieve all of these objects. Objects other than these will be apparent from the description of the specification, the drawings, the claims, and the like, and objects other than these can be derived from the description of the specification, the drawings, the claims, and the like.

Means for Solving the Problems

One embodiment of the present invention is a semiconductor device including a first insulator, a second insulator over the first insulator, a first oxide over the first insulator, a second oxide over the first oxide, a first conductor and a second conductor over the second oxide, a third insulator over the first conductor, a fourth insulator over the second conductor, a third oxide over the second oxide, a fifth insulator over the third oxide, a third conductor that is positioned over the fifth insulator and overlaps with the third oxide, a sixth insulator covering the first to fifth insulators, the first oxide, the second oxide, and the first to third conductors, and a seventh insulator over the sixth insulator; and the sixth insulator is in contact with part of a top surface of the first insulator, a side surface of the second insulator, a side surface of the fifth insulator, side surfaces of the first to third oxides, side surfaces of the first to third conductors, and a top surface of the third conductor.

It is preferable that each of the first insulator, the sixth insulator, and the seventh insulator be less likely to transmit one or both of oxygen and hydrogen than the second insulator.

Furthermore, it is preferable that each of the first insulator, the sixth insulator, and the seventh insulator be less likely to transmit one or both of oxygen and hydrogen than the fifth insulator.

Furthermore, it is preferable that each of the first insulator and the sixth insulator be an oxide including one or both of aluminum and hafnium.

Furthermore, it is preferable that each of the first insulator and the sixth insulator be aluminum oxide.

Furthermore, it is preferable that the seventh insulator include silicon and nitrogen.

Furthermore, it is preferable that the first to third oxides contain In, an element M (M is Al, Ga, Y, or Sn), and Zn.

Furthermore, it is preferable that the second oxide include a lattice point group obtained by analyzing a transmission electron microscope images of a top surface of the second oxide, and the proportion of hexagon Voronoi regions in the Voronoi diagram composed of the lattice point group be higher than or equal to 50% and lower than or equal to 80%.

One embodiment of the present invention is a semiconductor device including a transistor; the transistor includes a first insulator, a second insulator over the first insulator, a first oxide over the first insulator, a second oxide over the first oxide, a first conductor and a second conductor over the second oxide, a third insulator over the first conductor, a fourth insulator over the second conductor, a third oxide over the second oxide, a fifth insulator over the third oxide, and a third conductor that is positioned over the fifth insulator and overlaps with the third oxide; in a cross section in the channel length direction of the transistor, when a level of a bottom surface of the first insulator is used as a reference, the level of a bottom surface of a region of the third conductor that overlaps with the second oxide is lower than the level of a top surface of the second conductor; and in a cross section in the channel width direction of the transistor, when the level of the bottom surface of the first insulator is used as a reference, the level of a bottom surface of the third conductor that does not overlap with the second oxide is lower than the level of a bottom surface of the second oxide.

One embodiment of the present invention is a method for manufacturing a semiconductor device, which includes the steps of: depositing a first insulating film; depositing a second insulating film over the first insulating film; depositing a third insulating film over the second insulating film; depositing a first oxide over the third insulating film; depositing a second oxide over the first oxide film; depositing a first conductive film over the second oxide film; depositing a fourth insulating film over the first conductive film; depositing a second conductive film over the fourth insulating film; processing part of the second conductive film by a lithography method to form an opening in which the fourth insulating film is exposed in the second conductive film; processing the second conductive film, the fourth insulating film, and the first conductive film by a lithography method to form a first layer including the opening, the second conductive film, the fourth insulating film, and the first conductive film; processing the second oxide and the first oxide using the first layer as an etching mask; removing the fourth insulating film exposed in the opening to expose the first conductive film in the opening; removing the second conductive film and the first conductive film exposed in the opening to expose the second oxide in the opening, divide the first conductive film into a first conductor and a second conductor, and divide the fourth insulating film into a first insulator and a second insulator; processing the second insulating film to form a second layer including the second insulating film, the first oxide, the second oxide, the first conductor, the second conductor, the first insulator, and second insulator; depositing a third oxide over the first insulating film and the second layer; depositing a fifth insulating film over the third oxide; depositing a second conductive film over the fifth insulating film; processing the second conductive film, the fifth insulating film, and the third oxide by a lithography method to form a third layer including the second conductive film, the fifth insulating film, and the third oxide; and depositing a sixth insulating film over the first insulating film, the second layer, and the third layer.

Furthermore, it is preferable that the first insulating film, the second insulating film, the third insulating film, the first oxide, the second oxide, the first conductive film, the fourth insulating film, and the second conductive film be successively deposited under a reduced pressure using a deposition apparatus including a plurality of treatment chambers.

Furthermore, it is preferable that the third oxide, the fifth insulating film, and the second conductive film be successively deposited under a reduced pressure using a deposition apparatus including a plurality of treatment chambers.

In the treatment chamber, deposition may be performed by a sputtering method.

Effect of the Invention

According to one embodiment of the present invention, a semiconductor device having a high on-state current can be provided. Alternatively, according to one embodiment of the present invention, a semiconductor device having excellent frequency characteristics can be provided. Alternatively, according to one embodiment of the present invention, a semiconductor device having favorable reliability can be provided. Alternatively, according to one embodiment of the present invention, a semiconductor device that can be miniaturized or highly integrated can be provided. Alternatively, according to one embodiment of the present invention, a semiconductor device having favorable electrical characteristics can be provided. Alternatively, according to one embodiment of the present invention, a semiconductor device having high productivity can be provided.

Alternatively, a semiconductor device capable of retaining data for a long time can be provided. Alternatively, a semiconductor device capable of high-speed data writing can be provided. Alternatively, a semiconductor device with high design flexibility can be provided. Alternatively, a semiconductor device in which power consumption can be reduced can be provided. Alternatively, a novel semiconductor device can be provided.

Note that the descriptions of these effects do not preclude the existence of other effects. Note that one embodiment of the present invention does not necessarily have all of these effects. Effects other than these will be apparent from the description of the specification, the drawings, the claims, and the like, and effects other than these can be derived from the description of the specification, the drawings, the claims, and the like.

BRIEF DESCRIPTION OF THE DRAWINGS

FIGS. 1A-1C A top view and cross-sectional views of a semiconductor device of one embodiment of the present invention.

FIGS. 11A-11C A top view and cross-sectional views illustrating a method for manufacturing a semiconductor device of one embodiment of the present invention.

FIGS. 21A-21F Views illustrating electronic devices of one embodiment of the present invention.

MODE FOR CARRYING OUT THE INVENTION

Figure 2A:
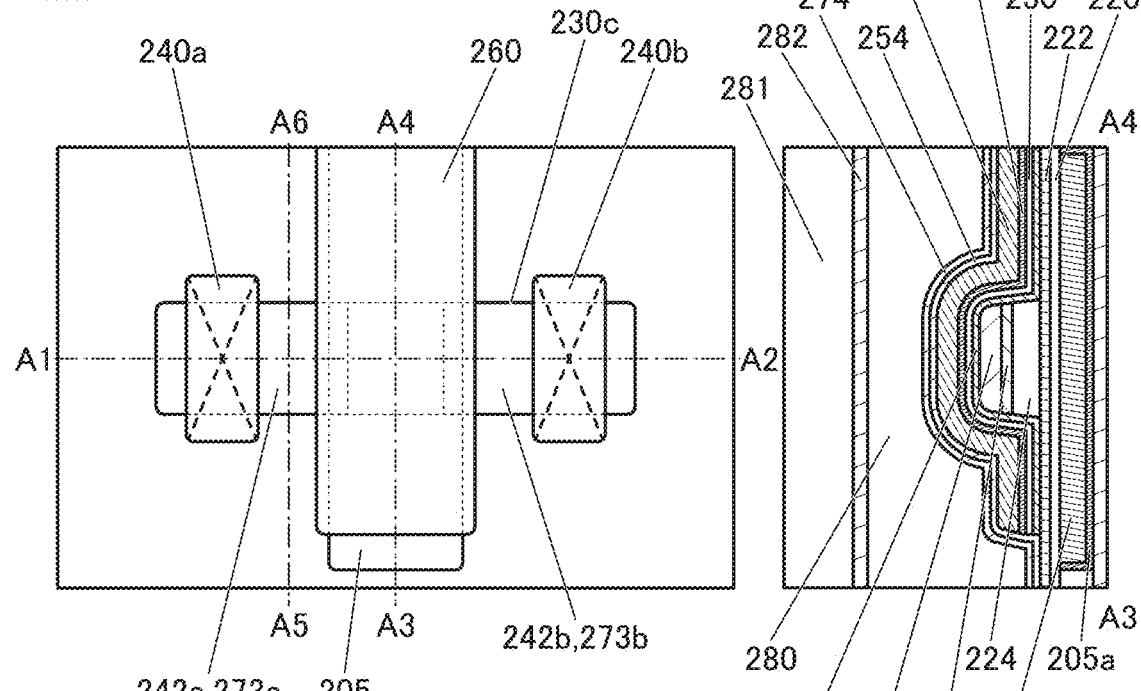
FIGS. 2A-2C A top view and cross-sectional views of a semiconductor device of one embodiment of the present invention.

Hereinafter, embodiments will be described with reference to drawings. Note that the embodiments can be implemented with many different modes, and it will be readily appreciated by those skilled in the art that modes and details thereof can be changed in various ways without departing from the spirit and scope thereof. Thus, the present invention should not be interpreted as being limited to the following descriptions of the embodiments.

In the drawings, the size, the layer thickness, or the region is exaggerated for clarity in some cases. Therefore, the size, the layer thickness, or the region is not limited to the scale. Note that the drawings are schematic views showing ideal examples, and embodiments of the present invention are not limited to shapes, values, or the like shown in the drawings. For example, in the actual manufacturing process, a layer, a resist mask, or the like might be unintentionally reduced in size by treatment such as etching, which is not reflected in the drawings in some cases for easy understanding. Note that in drawings, the same reference numerals are used, in different drawings, for the same portions or portions having similar functions, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. Furthermore, the description of some hidden lines and the like might be omitted.

Note that in this specification and the like, the ordinal numbers such as first and second are used for convenience and do not denote the order of steps or the stacking order of layers. Therefore, for example, description can be made even when "first" is replaced with "second", "third", or the like, as appropriate. In addition, the ordinal numbers in this specification and the like do not correspond to the ordinal numbers which are used to specify one embodiment of the present invention in some cases.

In this specification and the like, terms for describing arrangement, such as "over" and "under", are used for convenience in describing a positional relationship between components with reference to drawings. Furthermore, the positional relationship between components is changed as appropriate in accordance with a direction in which each component is described. Thus, without limitation to terms described in this specification, the description can be changed appropriately depending on the situation.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relationship shown in drawings or texts, a connection relationship other than one shown in drawings or texts is disclosed in the drawings or the texts.

Here, X and Y denote an object (e.g., a device, an element, a circuit, a wiring, an electrode, a terminal, a conductive film, or a layer).

Functions of a source and a drain might be switched when a transistor of opposite polarity is employed or a direction of current is changed in circuit operation. Therefore, the terms "source" and "drain" can be interchanged with each other in this specification and the like in some cases.

Note that in this specification and the like, depending on transistor structures, a channel width in a region where a channel is actually formed (hereinafter, referred to as an "effective channel width") is different from a channel width shown in a top view of a transistor (hereinafter, referred to as an "apparent channel width") in some cases. For example, when a gate electrode covers a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is greater than an apparent channel width.

In such a case, an effective channel width is difficult to estimate by actual measurement in some cases. For example, estimation of an effective channel width from a design value requires an assumption that the shape of a semiconductor is known. Accordingly, in the case where the shape of a semiconductor is not known accurately, it is difficult to measure an effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that an impurity in a semiconductor refers to, for example, elements other than the main components of a semiconductor. For example, an element with a concentration of lower than 0.1 atomic % can be regarded as an impurity. When an impurity is contained, for example, DOS (Density of States) in a semiconductor may be increased or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also functions as an impurity in some cases. In addition, in the case of an oxide semiconductor, oxygen vacancies are formed by entry of impurities, for example. Furthermore, in the case where the semiconductor is silicon, examples of an impurity which changes the characteristics of the semiconductor include oxygen, Group 1 elements except hydrogen, Group 2 elements, Group 13 elements, and Group 15 elements.

Note that in this specification and the like, silicon oxynitride contains more oxygen than nitrogen as its composition. More silicon nitride oxide contains more nitrogen than oxygen as its composition.

In addition, in this specification and the like, the term "insulator" can be replaced with an insulating film or an insulating layer. Moreover, the term "conductor" can be replaced with a conductive film or a conductive layer. Furthermore, the term "semiconductor" can be replaced with a semiconductor film or a semiconductor layer.

In this specification and the like, the term "parallel" indicates a state where two straight lines are placed such that the angle formed therebetween is greater than or equal to −10° and less than or equal to 10°. Thus, the case where the angle is greater than or equal to −5° and less than or equal to 5° is also included. Furthermore, the term "substantially parallel" indicates a state where two straight lines are placed such that the angle formed therebetween is greater than or equal to −30° and less than or equal to 30°. Moreover, "perpendicular" indicates a state where two straight lines are placed such that the angle formed therebetween is greater than or equal to 80° and less than or equal to 100°. Thus, the case where the angle is greater than or equal to 85° and less than or equal to 95° is also included. In addition, "substantially perpendicular" indicates a state where two straight lines are placed such that the angle formed therebetween is greater than or equal to 60° and less than or equal to 120°.

Note that in this specification, a barrier film means a film having a function of inhibiting transmission of oxygen and impurities such as water and hydrogen, and the barrier film having conductivity is referred to as a conductive barrier film in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, in the case where an OS FET or an OS transistor is stated, it can also be referred to as a transistor including an oxide or an oxide semiconductor.

In this specification and the like, the term of normally off means that current per micrometer of channel width flowing through a transistor when no potential is applied to a gate or the gate is supplied with a ground potential is lower than or equal to $1 \times 10^{-20}$ A at room temperature, lower than or equal to $1 \times 10^{-18}$ A at 85° C., or lower than or equal to $1 \times 10^{-16}$ A at 125° C.

Embodiment 1

An example of a semiconductor device including a transistor 200 of one embodiment of the present invention is described below.

<Structure Example of Semiconductor Device>

FIG. 1(A), FIG. 1(B), and FIG. 1(C) are a top view and cross-sectional views of the transistor 200 of one embodiment of the present invention and the periphery of the transistor 200.

FIG. 1(A) is a top view of the semiconductor device including the transistor 200. FIG. 1(B) and FIG. 1(C) are cross-sectional views of the semiconductor device. Here, FIG. 1(B) is a cross-sectional view of a portion indicated by the dashed-dotted line A1-A2 in FIG. 1(A), and is also a cross-sectional view in the channel length direction of the transistor 200. FIG. 1(C) is a cross-sectional view of a portion indicated by the dashed-dotted line A3-A4 in FIG. 1(A), and is also a cross-sectional view in the channel width direction of the transistor 200. Note that for simplification of the drawing, some components are not illustrated in the top view in FIG. 1(A).

The semiconductor device of one embodiment of the present invention includes the insulator 214, the transistor 200 over the insulator 214, the insulator 280 provided over the transistor 200, the insulator 282 over the insulator 280, and the insulator 281 provided over the insulator 282. The insulator 214, insulator 280, insulator 281, and insulator 282 function as interlayer films. The conductor 240 (the conductor 240a and the conductor 240b) that functions as a plug and is electrically connected to the transistor 200 is also included. Note that an insulator 241 (an insulator 241a and an insulator 241b) is provided in contact with a side surface of the conductor 240 functioning as a plug.

The insulator 241a is provided in contact with the inner wall of an opening in the insulator 273a, the insulator 254, the insulator 274, the insulator 280, insulator 282, and the insulator 281, a first conductor of the conductor 240a is provided in contact with the side surface of the insulator 241a, and a second conductor of the conductor 240a is provided on the inner side thereof. The insulator 241b is provided in contact with the inner wall of an opening in the insulator 273b, the insulator 254, the insulator 274, the insulator 280, the insulator 282, and the insulator 281, a first conductor of the conductor 240b is provided in contact with the side surface of the insulator 241b, and a second conductor of the conductor 240b is provided on the inner side thereof. Here, the top surface of the conductor 240 and the top surface of the insulator 281 can be substantially level with each other. Note that although the transistor 200 having a structure in which the first conductor of the conductor 240 and the second conductor of the conductor 240 are stacked is illustrated, the present invention is not limited thereto. For example, the conductor 240 may be provided as a single layer or to have a stacked-layer structure of three or more layers. When a component has a stacked-layer structure, the layers may be distinguished by ordinal numbers corresponding to the formation order.

[Transistor 200]

As illustrated in FIG. 1, the transistor 200 includes an insulator 216 over an insulator 214 positioned over a substrate (not illustrated); a conductor 205 positioned to be embedded in the insulator 216; an insulator 220 positioned over the insulator 216 and the conductor 205; the insulator 222 positioned over the insulator 222; the insulator 224 positioned over the insulator 222; an oxide 230 (an oxide 230a, an oxide 230b, and an oxide 230c) positioned over the insulator 224; an insulator 250 positioned over the oxide 230; a conductor 260 (a conductor 260a and a conductor 260b) positioned over the insulator 250; a conductor 242a and a conductor 242b in contact with part of a top surface of the oxide 230b; an insulator 273a positioned over the conductor 242a; an insulator 273b positioned over the conductor 242b; an insulator 254 positioned to be in contact with part of a top surface of the insulator 222, a side surface of the insulator 224, a side surface of the oxide 230a, a side surface of oxide 230b, a side surface of the conductor 242a, a side surface of the conductor 242b, a side surface of the insulator 273a, a top surface of the insulator 273a, a side surface of the insulator 273b, a top surface of the insulator 273b, a side surface of oxide 230c, a side surface of insulator 250, a side surface of conductor 260, and a top surface of the conductor 260; and an insulator 274 positioned over the insulator 254.

Preferably, the insulator 222, the insulator 254, and the insulator 274 have a function of inhibiting diffusion of hydrogen (e.g., at least one of a hydrogen atom, a hydrogen molecule, and the like). Preferably, the insulator 222, the insulator 254, and the insulator 274 also have a function of inhibiting diffusion of oxygen (e.g., at least one of an oxygen atom, an oxygen molecule, and the like). For example, preferably, the insulator 222, the insulator 254, and the insulator 274 each have the property to be less likely to transmit one or both of oxygen and hydrogen than the insulator 224. Preferably, the insulator 222, the insulator 254, and the insulator 274 each have the property to be less likely to transmit one or both of oxygen and hydrogen than the insulator 250. Preferably, the insulator 222, the insulator 254, and the insulator 274 each have the property to be less likely to transmit one or both of oxygen and hydrogen than the insulator 280.

The oxide 230 preferably includes the oxide 230a placed over the insulator 224, the oxide 230b placed over the oxide 230a, and the oxide 230c which is placed over the oxide 230b and at least partly in contact with a top surface of the oxide 230b.

The transistor 200 has, in the region where a channel is formed (hereinafter also referred to as a channel formation region) and its vicinity, a structure in which three layers of the oxide 230a, the oxide 230b, and the oxide 230c are stacked; however, the present invention is not limited thereto. For example, a structure may be employed in which a single-layer structure of the oxide 230b, a two-layer structure of the oxide 230b and the oxide 230a, a two-layer structure of the oxide 230b and the oxide 230c, or a stacked-layer structure of four or more layers is provided. Although the transistor 200 with a structure in which the conductor 260 has a stacked-layer structure of two layers is described, the present invention is not limited thereto. For example, the conductor 260 may have a single-layer structure or a stacked-layer structure of three or more layers.

In the transistor 200, as the oxide 230 (the oxide 230a, the oxide 230b, and the oxide 230c), which includes a channel formation region, a metal oxide functioning as an oxide semiconductor (hereinafter also referred to as an oxide semiconductor) is preferably used.

The transistor 200 using an oxide semiconductor in a channel formation region has an extremely low leakage current (off-state current) in a non-conduction state; thus, a semiconductor device with low power consumption can be provided. An oxide semiconductor can be deposited by a sputtering method or the like, and thus can be used for the transistor 200 included in a highly integrated semiconductor device.

For example, as the oxide 230, a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, as the oxide 230, an In—Ga oxide, an In—Zn oxide, a Ga—Zn oxide, and a Ga oxide may be used.

A transistor using an oxide semiconductor is likely to have its electrical characteristics changed when impurities and oxygen vacancies exist in a region of the oxide semiconductor where a channel is formed, which may affect the reliability. Moreover, if the region of the oxide semiconductor where a channel is formed includes oxygen vacancies, the transistor tends to have normally-on characteristics. Therefore oxygen vacancies in the region where a channel is formed are preferably reduced as much as possible. For example, oxygen is preferably supplied to the oxide 230 through the insulator 250 or the like to fill the oxygen vacancies. Thus, a transistor that has stable electrical characteristics with a small variation in electrical characteristics and improved reliability can be provided.

The conductor 260 functions as a gate electrode of the transistor 200. The conductor 242 (the conductor 242a and the conductor 242b) serves as the source electrode or the drain electrode of the transistor 200.

As illustrated in FIG. 1(B), in the case where an element included in the conductor 242 (the conductor 242a and the conductor 242b) that is provided over and in contact with the oxide 230 and function as a source electrode or a drain electrode of the transistor 200 has a function of absorbing oxygen of the oxide 230, a low-resistance region is sometimes partly formed between the oxide 230 and the conductor 242 or in the vicinity of the surface of the oxide 230, which serves as a source region or a drain region of the transistor 200. In that case, in the low-resistance region, an impurity (such as hydrogen, nitrogen, metal elements, or the like) entering oxygen vacancies serves as a donor, which causes an increase in carrier density in some cases. Note that in the following description, hydrogen that enters oxygen vacancies is referred to as VoH in some cases. The oxide 230 includes a region functioning as a channel formation region of the transistor 200 in a region not overlapping with the conductor 242a or the conductor 242b. The region preferably has a smaller carrier density and less VoH than the low-resistance regions.

As illustrated in FIGS. 1(B) and 1(C), the insulator 254 is preferably in contact with part of the top surface of the insulator 222, the side surface of the insulator 224, the side surface of the oxide 230, the side surface of the conductor 242a, the side surface of the conductor 242b, and the side surface of the insulator 250, the side surface of the conductor 260, and the top surface of the conductor 260. Furthermore, the insulator 274 is preferably positioned over the insulator 254. Thus, the insulator 280 is isolated from the insulator 224, the insulator 250, and the oxide 230 by the insulator 254 and the insulator 274. With such a structure, entry of impurities such as hydrogen and water contained in the insulator 280 or entry of impurities such as hydrogen from the outside of the transistor 200 can be prevented; thus, the transistor 200 can have favorable electrical characteristics and reliability.

The insulator 273 (the insulator 273a and the insulator 273b) has a function of inhibiting the passage of oxygen and impurities such as hydrogen and water. The insulator 273a is over the conductor 242a and can prevent oxygen and impurities such as hydrogen and water from above the conductor 242a. The insulator 273b can be positioned over the conductor 242b and can prevent oxygen diffusion from above the conductor 242b.

Figure 3:
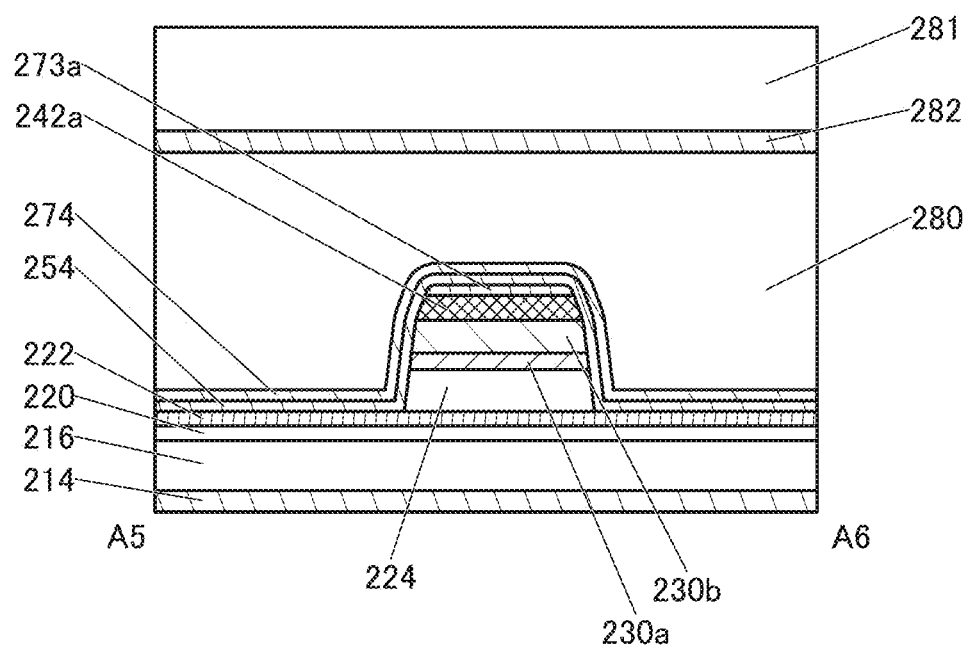
FIG. 3 A cross-sectional view of a semiconductor device of one embodiment of the present invention.
Figure 4A:
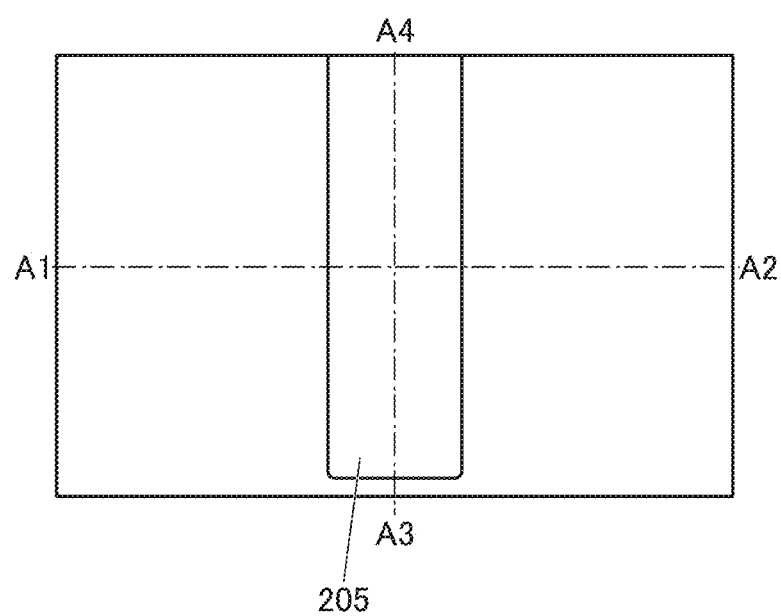
FIGS. 4A-4C A top view and cross-sectional views illustrating a method for manufacturing a semiconductor device of one embodiment of the present invention.
Figure 4C:
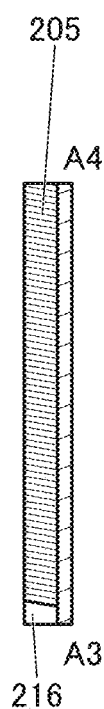
Figure 4B:
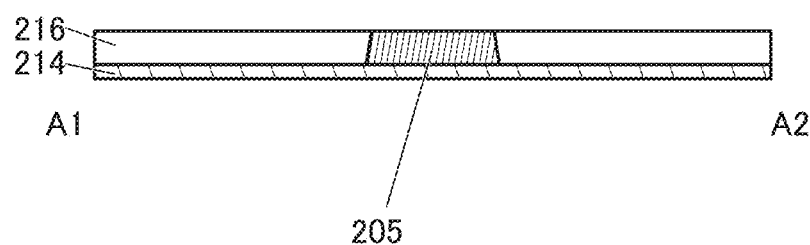

FIG. 3 is a cross-sectional view of a portion indicated by a dashed-dotted line A5-A6 in FIG. 1(A), and is also a cross-sectional view in the channel width direction of one of a source region and a drain region of the transistor 200. As illustrated in FIG. 3, the side surface of the conductor 242a is covered with the insulator 254 and the insulator 274, and thus, oxygen and impurities such as hydrogen and water are prevented from diffusing from the side surface of the conductor 242a. Thus, the top surface and the side surfaces of the conductor 242a are covered with the insulator 273a, the insulator 254, and the insulator 274, so that oxidation of the conductor 242a can be suppressed. Note that the same effect can be obtained in the conductor 242b.

In FIG. 1(B), when a bottom surface of the insulator 224 is used as a reference, the level of the bottom surface of conductor 260 in a region that does not overlap with the conductor 242a and the conductor 242b is preferably lower than the level of each of the top surfaces of the conductor 242a and the conductor 242b. This can allow an electric field from the conductor 260 functioning as the gate electrode to affect the entire channel formation region, which is preferable because operation of the transistor becomes favorable.

As illustrated in FIG. 1(C), when the bottom surface of the insulator 224 is used as a reference, the level of the bottom surface of the conductor 260 in a region where the oxide 230a and the oxide 230b do not overlap with the conductor 260 is preferably positioned lower than the level of a bottom surface of the oxide 230b. A difference between the level of the bottom surface of the conductor 260 in a region where the oxide 230b does not overlap with the conductor 260 and the level of the bottom surface of the oxide 230b is set to greater than or equal to 0 nm and less than or equal to 100 nm, preferably greater than or equal to 3 nm and less than or equal to 50 nm, and further preferably greater than or equal to 5 nm and less than or equal to 20 nm.

As described above, the conductor 260, which functions as the gate electrode, covers the side surface and the top surface of the oxide 230b of the channel formation region, with the oxide 230c and the insulator 250 positioned therebetween; this enables the electrical field of the conductor 260 to easily affect the entire oxide 230b of the channel formation region. Consequently, the on-state current of the transistor 200 can be increased and the frequency characteristics can be improved.

Accordingly, a semiconductor device that includes a transistor having a high on-state current can be provided. Alternatively, a semiconductor device that includes a transistor having high frequency characteristics can be provided. Alternatively, a semiconductor device that has a small variation in electrical characteristics, stable electrical characteristics, and high reliability can be provided. Alternatively, a semiconductor device that includes a transistor having a low off-state current can be provided.

The structure of the semiconductor device including the transistor 200 of one embodiment of the present invention is described in detail below.

The conductor 205 is placed to overlap with the oxide 230 and the conductor 260. Furthermore, the conductor 205 is preferably provided to be embedded in the insulator 216.

The conductor 260 sometimes functions as a first gate (also referred to as a top gate) electrode. The conductor 205 sometimes functions as a second gate (also referred to as a bottom gate) electrode. In that case, the Vth of the transistor 200 can be controlled by changing a potential applied to the conductor 205 independently of a potential applied to the conductor 260. In particular, the Vth of the transistor 200 can be higher than 0 V and the off-state current can be reduced by applying a negative potential to the conductor 205. Thus, a drain current when a potential applied to the conductor 260 is 0 V can be smaller in the case where a negative potential is applied to the conductor 205 than in the case where the negative potential is not applied to the conductor 205.

As illustrated in FIG. 1(A), the conductor 205 is preferably provided to extend in the channel width direction beyond a region of the oxide 230 that does not overlap with the conductor 242a or the conductor 242b. As illustrated in FIG. 1(C), it is particularly preferable that the conductor 205 extend to a region outside an end portion of the oxide 230 that intersects with the channel width direction. That is, the conductor 205 and the conductor 260 preferably overlap with each other with the insulators therebetween, outside the side surface of the oxide 230 in the channel width direction.

With the above structure, the channel formation region in the oxide 230 can be electrically surrounded by the electric field of the conductor 260 having a function of the first gate electrode and the electric field of the conductor 205 having a function of the second gate electrode. In this specification, the transistor structure in which the channel formation region is electrically surrounded by the electric fields of the first gate electrode and the second gate electrode is referred to as a surrounded channel (S-channel) structure.

Moreover, a conductive material containing tungsten, copper, or aluminum as its main component is preferably used for the conductor 205. Note that the conductor 205 is illustrated as a single layer but may have a stacked-layer structure, for example, a stacked layer of the above conductive materials and titanium or titanium nitride.

Here, it is preferable that as an oxide semiconductor, an insulator or a conductor positioned below the oxide semiconductor, and an insulator or a conductor positioned over the oxide semiconductor, different kinds of films are successively deposited without being exposed to the air, whereby a substantially highly purified intrinsic oxide semiconductor film whose impurity (hydrogen and water, in particular) concentration is reduced can be formed.

For example, insulating films to be the insulator 220, the insulator 222, and the insulator 224, an oxide film to be the oxide 230a, an oxide film to be the oxide 230b, a conductive film to be the conductor 242, and an insulating film to be the insulator 273 that are provided over the insulator 216 and the conductor 205 may be successively formed in this order using a deposition apparatus including seven treatment chambers.

The insulator 214 and the insulator 274 preferably function as a barrier insulating film that inhibits impurities such as water or hydrogen from entering the transistor 200 from the substrate side or from above. Accordingly, for the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom (or through which the above impurities are less likely to pass). Alternatively, it is preferable to use an insulating material having a function of inhibiting diffusion of oxygen (e.g., at least one of an oxygen atom, an oxygen molecule, and the like) (or through which the above oxygen is less likely to pass).

For example, it is preferable that silicon nitride or the like be used for the insulator 214 and the insulator 274. In that case, impurities such as water or hydrogen can be inhibited from diffusing into the transistor 200 side from a side closer to the substrate than the insulator 214. Alternatively, oxygen contained in the insulator 224 and the like can be prevented from being diffused to the substrate side of the insulator 214. Impurities such as water or hydrogen can be inhibited from diffusing into the transistor 200 side from the insulator 280 and the like, which are provided above the insulator 274.

The insulator 214 may have a stacked-layer structure. For example, a stacked-layer structure of an aluminum oxide film and a silicon nitride film can be favorably used for the insulator 214. With the aluminum oxide film, oxygen can be supplied above the insulator 214. Furthermore, with the silicon nitride film, diffusion of impurities such as hydrogen and water from the substrate side to the transistor 200 side can be inhibited.

The insulator 216, the insulator 280, and the insulator 281 preferably have a lower dielectric constant than the insulator 214. When a material having a low dielectric constant is used for an interlayer film, parasitic capacitance generated between wirings can be reduced. As the insulator 216, the insulator 280, and the insulator 281, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used, for example.

The insulator 220, the insulator 222, and the insulator 224 have a function of a gate insulator.

For example, silicon oxide, silicon oxynitride, or the like may be used for the insulator 220 appropriately.

Here, it is preferable that oxygen be released from the insulator 224 in contact with the oxide 230 by heating. In this specification, oxygen that is released by heating is referred to as excess oxygen in some cases. For example, silicon oxide, silicon oxynitride, or the like is used for the insulator 224 as appropriate. When an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating is preferably used. An oxide from which oxygen is released by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the film surface temperature in the TDS analysis is preferably higher than or equal to 100° C. and lower than or equal to 700° C., or higher than or equal to 100° C. and lower than or equal to 400° C.

The insulator 222 preferably functions as a barrier insulating film that inhibits impurities such as water and hydrogen from entering the transistor 200 from the substrate side. For example, the insulator 222 has a lower hydrogen-transmitting property than the insulator 224. Surrounding the insulator 224, the oxide 230, and the like by the insulator 222, the insulator 274, and the insulator 254 can inhibit entry of impurities such as water or hydrogen into the transistor 200 from the outside.

Furthermore, the insulator 222 preferably has a function of inhibiting diffusion of oxygen (e.g., at least one of an oxygen atom, an oxygen molecule, and the like) (or is less likely to transmit the above oxygen). For example, the insulator 222 preferably has a lower oxygen-transmitting property than the insulator 224. When the insulator 222 has a function of inhibiting diffusion of oxygen or impurities, diffusion of oxygen included in the oxide 230 into the insulator 220 side can be reduced, which is preferable. Furthermore, the conductor 205 can be inhibited from reacting with oxygen included in the insulator 224 or the oxide 230.

It is preferable to use an insulator containing an oxide of one or both of aluminum and hafnium, which is an insulating material, as the insulator 222. As the insulator containing an oxide of one or both of aluminum and hafnium, aluminum oxide, hafnium oxide, an oxide containing aluminum and hafnium (hafnium aluminate), or the like is preferably used.

When the insulator 222 is formed using such a material, the insulator 222 functions as a layer that inhibits release of oxygen from the oxide 230 and entry of impurities such as hydrogen from the periphery of the transistor 200 into the oxide 230.

Alternatively, to these insulators, aluminum oxide, bismuth oxide, germanium oxide, niobium oxide, silicon oxide, titanium oxide, tungsten oxide, yttrium oxide, or zirconium oxide may be added, for example. Alternatively, these insulators may be subjected to nitriding treatment. Silicon oxide, silicon oxynitride, or silicon nitride may be stacked over the insulator.

For example, a single layer or a stacked layer of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) may be used for the insulator 222. With miniaturization and high integration of a transistor, a problem such as leakage current may arise because of a thinner gate insulator. When a high-k material is used for an insulator functioning as the gate insulator, a gate potential during operation of the transistor can be reduced while the physical thickness of the gate insulator is kept.

Note that the insulator 222 and the insulator 224 may each have a stacked-layer structure of two or more layers. In that case, without limitation to a stacked-layer structure formed of the same material, a stacked-layer structure formed of different materials may be employed.

The oxide 230 includes the oxide 230a, the oxide 230b over the oxide 230a, and the oxide 230c over the oxide 230b. When the oxide 230a is provided below the oxide 230b, impurities can be inhibited from diffusing into the oxide 230b from the components formed below the oxide 230a. When the oxide 230c is provided over the oxide 230b, impurities can be inhibited from diffusing into the oxide 230b from the components formed above the oxide 230c.

Note that the oxide 230 preferably has a stacked-layer structure using oxides which differ in the atomic ratio of metal elements. Specifically, the atomic proportion of the element M in constituent elements in the metal oxide used as the oxide 230a is preferably greater than the atomic proportion of the element M in constituent elements in the metal oxide used as the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a. A metal oxide that can be used as the oxide 230a or the oxide 230b can be used as the oxide 230c.

The oxide 230b preferably has crystallinity. For example, a CAAC-OS (c-axis aligned crystalline oxide semiconductor) described later is preferably used. An oxide having crystallinity, such as a CAAC-OS, has a dense structure with small amounts of impurities and defects (oxygen vacancies or the like) and high crystallinity. This can inhibit oxygen extraction from the oxide 230b by the source electrode or the drain electrode. This can reduce oxygen extraction from the oxide 230b even when heat treatment is performed; hence, the transistor 200 is stable with respect to high temperatures in the manufacturing process (what is called thermal budget).

The energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b.

Here, the energy level of the conduction band minimum is gradually varied at a junction region of the oxide 230a, the oxide 230b, and the oxide 230c. In other words, the energy level of the conduction band minimum at a junction region of each of the oxide 230a, the oxide 230b, and the oxide 230c is continuously varied or continuously connected. To obtain this, the densities of defect states in mixed layers formed at an interface between the oxide 230a and the oxide 230b and an interface between the oxide 230b and the oxide 230c are preferably made low.

Specifically, as the oxide 230a, a metal oxide having In:Ga:Zn=1:3:4 [atomic ratio] or In:Ga:Zn=1:1:0.5 [atomic ratio] is used. As the oxide 230b, a metal oxide having In:Ga:Zn=4:2:3 [atomic ratio] or In:Ga:Zn=3:1:2 [atomic ratio] can be used. As the oxide 230c, a metal oxide having In:Ga:Zn=1:3:4 [atomic ratio], In:Ga:Zn=4:2:3 [atomic ratio], Ga:Zn=2:1 [atomic ratio], or Ga:Zn=2:5 [atomic ratio] can be used. Furthermore, as a specific example of the oxide 230c having a stacked-layer structure, a stacked-layer structure of a metal oxide having In:Ga:Zn=4:2:3 [atomic ratio] and a metal oxide having Ga:Zn=2:1 [atomic ratio], a stacked-layer structure of a metal oxide having In:Ga:Zn=4:2:3 [atomic ratio] and a metal oxide having Ga:Zn=2:5 [atomic ratio], or a stacked-layer structure of a metal oxide having In:Ga:Zn=4:2:3 [atomic ratio] and a gallium oxide can be given.

At this time, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have a high on-state current and excellent frequency characteristics. Note that in the case where the oxide 230c has a stacked-layer structure, not only the effect of reducing the density of defect state at the interface between the above oxide 230b and the oxide 230c but also the effect of inhibiting diffusion of a constituent element included in the oxide 230c into the insulator 250 side can be expected. More specifically, the oxide 230c has a stacked-layer structure and an oxide not including In is positioned in the upper portion of the stacked layer structure, so that In, which can diffuse into the insulator 250 side, can be inhibited. Since the insulator 250 functions as the gate insulator, the transistor has defects in characteristics if In diffuses. Thus, when the oxide 230c has a stacked-layer structure, a highly reliable semiconductor device can be provided.

As the oxide 230, a metal oxide functioning as an oxide semiconductor is preferably used. For example, as a metal oxide to be the channel formation region, a metal oxide having a band gap of 2 eV or more, preferably 2.5 eV or more, is preferably used. With the use of a metal oxide having such a wide band gap, the off-state current of the transistor can be reduced. With the use of such a transistor, a semiconductor device with low power consumption can be provided.

The conductor 242 (the conductor 242a and the conductor 242b) functioning as the source electrode and the drain electrode is provided over the oxide 230b. The thickness of the conductor 242 is, for example, greater than or equal to 1 nm and less than or equal to 50 nm, preferably greater than or equal to 2 nm and less than or equal to 25 nm.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

The insulator 250 functions as a gate insulator. The insulator 250 is preferably placed in contact with the top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

The insulator 250 is preferably formed using an insulator from which oxygen is released by heating as in the insulator 224. When an insulator from which oxygen is released by heating is provided as the insulator 250 in contact with the top surface of the oxide 230c, oxygen can be efficiently supplied to the channel formation region of the oxide 230. Furthermore, as in the insulator 224, the concentration of impurities such as water or hydrogen in the insulator 250 is preferably reduced. The thickness of the insulator 250 is preferably greater than or equal to 1 nm and less than or equal to 20 nm.

Furthermore, a metal oxide may be provided between the insulator 250 and the conductor 260. The metal oxide preferably inhibits diffusion of oxygen from the insulator 250 to the conductor 260. Provision of the metal oxide that inhibits diffusion of oxygen inhibits diffusion of oxygen from the insulator 250 to the conductor 260. That is, a reduction in the amount of oxygen supplied to the oxide 230 can be inhibited. In addition, oxidation of the conductor 260 due to oxygen from the insulator 250 can be inhibited.

The metal oxide has a function of part of the gate insulator in some cases. Therefore, when silicon oxide, silicon oxynitride, or the like is used for the insulator 250, a metal oxide that is a high-k material with a high dielectric constant is preferably used as the metal oxide. When the gate insulator has a stacked-layer structure of the insulator 250 and the metal oxide, the stacked-layer structure can be thermally stable and have a high dielectric constant. Accordingly, a gate potential that is applied during operation of the transistor can be reduced while the physical thickness of the gate insulator is kept. In addition, the equivalent oxide thickness (EOT) of an insulator functioning as the gate insulator can be reduced.

Specifically, a metal oxide containing one or more kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium such as aluminum oxide, hafnium oxide, or an oxide containing aluminum and hafnium (hafnium aluminate).

Although the conductor 260 has a two-layer structure in FIG. 1, a single-layer structure or a stacked-layer structure of three or more layers may be employed.

For the conductor 260a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 260a has a function of inhibiting diffusion of oxygen, the conductivity of the conductor 260b can be inhibited from being lowered because of oxidation due to oxygen included in the insulator 250. As a conductive material having a function of inhibiting diffusion of oxygen, for example, tantalum, tantalum nitride, ruthenium, ruthenium oxide, or the like is preferably used.

Moreover, a conductive material containing tungsten, copper, or aluminum as its main component is preferably used for the conductor 260b. As the conductor 260 also functioning as a wiring, a conductor having high conductivity is preferably used. For example, a conductive material containing tungsten, copper, or aluminum as its main component can be used. In addition, the conductor 260b may have a stacked-layer structure, for example, a stacked-layer structure of any of the above conductive materials and titanium or titanium nitride.

For example, the insulator 280 preferably includes silicon oxide, silicon oxynitride, silicon nitride oxide, silicon oxide to which fluorine is added, silicon oxide to which carbon is added, silicon oxide to which carbon and nitrogen are added, porous silicon oxide, or the like. In particular, silicon oxide and silicon oxynitride, which are thermally stable, are preferable. Materials such as silicon oxide, silicon oxynitride, and porous silicon oxide, in each of which a region containing oxygen that is released by heating can be easily formed, are particularly preferable.

The concentration of impurities such as water or hydrogen included in the insulator 280 is preferably lowered. A top surface of the insulator 280 may be planarized.

The insulator 282 preferably functions as a barrier insulating film that inhibits impurities such as water or hydrogen from entering the insulator 280 from the above. The insulator 282 is formed using an insulator that can be used as the insulator 254, for example.

The insulator 282 functioning as an interlayer film is preferably provided over the insulator 281. As in the insulator 224 or the like, the concentration of impurities such as water or hydrogen included in the film of the insulator 281 is preferably lowered.

The conductor 240a and the conductor 240b are placed in the openings formed in the insulator 281, the insulator 282, the insulator 280, the insulator 274, the insulator 254, and the insulator 273. The conductor 240a and the conductor 240b are placed to face each other with the conductor 260 interposed therebetween. Note that the top surfaces of the conductor 240a and the conductor 240b may be on the same surface as the top surface of the insulator 281.

Note that the insulator 241a is provided in contact with the inner wall of the opening in the insulator 281, the insulator 282, the insulator 280, the insulator 274, the insulator 254, and the insulator 273a and the first conductor of the conductor 240a is formed on the side surface. The conductor 242a is located on at least part of the bottom portion of the opening, and thus the conductor 240a is in contact with the conductor 242a. Similarly, the insulator 241b is provided in contact with the inner wall of the opening in the insulator 281, the insulator 282, the insulator 280, the insulator 274, the insulator 254, and the insulator 273b, and the first conductor of the conductor 240b is formed on the side surface. The conductor 242b is located on at least part of the bottom portion of the opening, and thus the conductor 240b is in contact with the conductor 242b.

For the conductor 240a and the conductor 240b, a conductive material containing tungsten, copper, or aluminum as its main component is preferably used. In addition, the conductor 240a and the conductor 240b may each have a stacked-layer structure.

In the case where the conductor 240 has a stacked-layer structure, a conductive material having a function of inhibiting the transmission of impurities such as water or hydrogen is preferably used for a conductor in contact with at least the conductor 242. For example, tantalum, tantalum nitride, titanium, titanium nitride, ruthenium, ruthenium oxide, or the like is preferably used. A single layer or a stacked layer of the conductive material having a function of inhibiting the transmission of impurities such as water or hydrogen may be used. The use of the conductive material can prevent oxygen added to the insulator 280 from being absorbed by the conductor 240a and the conductor 240b. Moreover, impurities such as water or hydrogen can be inhibited from entering the oxide 230 through the conductor 240a and the conductor 240b from a layer above the insulator 281.

For the insulator 241a and the insulator 241b, an insulator that can be used for the insulator 254 is used, for example. Since the insulator 241a and the insulator 241b are provided in contact with the insulator 254, impurities such as water or hydrogen can be inhibited from entering the oxide 230 through the conductor 240a and the conductor 240b from the insulator 280 or the like. In addition, oxygen included in the insulator 280 can be prevented from being absorbed by the conductor 240a and the conductor 240b.

Although not illustrated, a conductor functioning as a wiring may be placed in contact with the top surface of the conductor 240a and the top surface of the conductor 240b. For the conductor functioning as a wiring, a conductive material containing tungsten, copper, or aluminum as its main component is preferably used. The conductor may have a stacked-layer structure, for example, a stacked layer of any of the above conductive materials and titanium or titanium nitride. Note that the conductor may be formed to be embedded in an opening provided in an insulator.

<Constituent Material of Semiconductor Device>

Constituent materials that can be used for the semiconductor device will be described below.

<<Substrate>>

As a substrate over which the transistor 200 is formed, an insulator substrate, a semiconductor substrate, or a conductor substrate may be used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate of silicon, germanium, or the like and a compound semiconductor substrate including silicon carbide, silicon germanium, gallium arsenide, indium phosphide, zinc oxide, or gallium oxide. Moreover, a semiconductor substrate in which an insulator region is included in the above semiconductor substrate, e.g., an SOI (Silicon On Insulator) substrate or the like is used. Examples of the conductor substrate include a graphite substrate, a metal substrate, an alloy substrate, and a conductive resin substrate. A substrate including a metal nitride, a substrate including a metal oxide, or the like is used. Moreover, an insulator substrate provided with a conductor or a semiconductor, a semiconductor substrate provided with a conductor or an insulator, a conductor substrate provided with a semiconductor or an insulator, or the like is used. Alternatively, any of these substrates provided with an element may be used. Examples of the element provided for the substrate include a capacitor, a resistor, a switching element, a light-emitting element, and a memory element.

<<Insulator>>

Examples of an insulator include an oxide, a nitride, an oxynitride, a nitride oxide, a metal oxide, a metal oxynitride, and a metal nitride oxide, each of which has an insulating property.

With miniaturization and high integration of a transistor, a problem such as leakage current may arise because of a thinner gate insulator. When a high-k material is used for an insulator functioning as the gate insulator, a voltage during operation of the transistor can be reduced while the physical thickness of the gate insulator is kept. By contrast, when a material with a low dielectric constant is used for the insulator functioning as an interlayer film, the parasitic capacitance generated between wirings can be reduced. Accordingly, a material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by insulators having a function of inhibiting transmission of oxygen and impurities such as hydrogen (e.g., the insulator 214, the insulator 222, the insulator 254, the insulator 274, and the like), the electrical characteristics of the transistor can be stable. As the insulator having a function of inhibiting transmission of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; a metal nitride such as aluminum nitride, aluminum nitride titanium, titanium nitride, silicon nitride oxide, or silicon nitride; or the like can be used.

In addition, the insulator functioning as the gate insulator is preferably an insulator including a region containing oxygen that is released by heating. When a structure is employed in which silicon oxide or silicon oxynitride including a region containing oxygen that is released by heating is in contact with the oxide 230, oxygen vacancies included in the oxide 230 can be compensated for.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electrical conductivity, typified by polycrystalline silicon containing an impurity element such as phosphorus, or silicide such as nickel silicide may be used.

Furthermore, a stack including a plurality of conductive layers formed with the above materials may be used. For example, a stacked-layer structure combining a material containing the above metal element and a conductive material containing oxygen may be employed. Furthermore, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably employed for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide in which a channel is formed. Furthermore, a conductive material containing the above metal element and nitrogen may be used. For example, a conductive material containing nitrogen, such as titanium nitride or tantalum nitride, may be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen included in the metal oxide in which a channel is formed can be trapped in some cases. Alternatively, hydrogen entering from an external insulator or the like can be trapped in some cases.

<<Metal Oxide>>

As the oxide 230, a metal oxide functioning as an oxide semiconductor is preferably used. A metal oxide that can be used as the oxide 230 of the present invention will be described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Examples of other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements may be combined as the element M.

Note that in this specification and the like, a metal oxide containing nitrogen is also referred to as a metal oxide in some cases. Alternatively, a metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of the non-single-crystal oxide semiconductors include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) is difficult to observe even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, an In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Furthermore, entry of impurities, formation of defects, or the like might decrease the crystallinity of a metal oxide, which means that the CAAC-OS is a metal oxide having small amounts of impurities and defects (e.g., oxygen vacancies (Vo)). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In some cases, IGZO has a stable structure when formed of smaller crystals (e.g., the above-described nanocrystals) rather than larger crystals (here, crystals with a size of several millimeters or several centimeters) because crystal growth tends to hardly occur particularly in the air.

An a-like OS is a metal oxide having a structure between those of the nc-OS and an amorphous oxide semiconductor. The a-like OS contains a void or a low-density region. That is, the a-like OS has low crystallinity as compared with the nc-OS and the CAAC-OS.

The oxide semiconductor (metal oxide) can have various structures which show different properties. Two or more kinds of the amorphous oxide semiconductor, the polycrystalline oxide semiconductor, the a-like OS, the nc-OS, and the CAAC-OS may be included in the oxide semiconductor of one embodiment of the present invention.

[Impurities]

Here, the influence of each impurity in the metal oxide will be described.

When the metal oxide contains an alkali metal or an alkaline earth metal, defect states are formed and carriers are generated, in some cases. Thus, a transistor using a metal oxide that contains an alkali metal or an alkaline earth metal in its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS (the concentration of an alkali metal or an alkaline earth metal obtained by secondary ion mass spectrometry) is set lower than or equal to $1 \times 10^{18}$ atoms/cm$^3$, preferably lower than or equal to $2 \times 10^{16}$ atoms/cm$^3$.

Hydrogen included in a metal oxide reacts with oxygen bonded to a metal atom to become water, and thus forms an oxygen vacancy, in some cases. When hydrogen enters the oxygen vacancy, an electron which is a carrier is generated in some cases. Furthermore, in some cases, bonding of part of hydrogen to oxygen bonded to a metal atom causes generation of an electron which is a carrier. Thus, a transistor using a metal oxide containing hydrogen is likely to have normally-on characteristics.

Accordingly, hydrogen in the metal oxide is preferably reduced as much as possible. Specifically, the hydrogen concentration of the metal oxide, which is obtained by SIMS, is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide in which impurities are sufficiently reduced is used in a channel formation region of a transistor, stable electrical characteristics can be given.

Note that as a metal oxide used for a semiconductor of a transistor, a thin film having high crystallinity is preferably used. With the use of the thin film, the stability or the reliability of the transistor can be improved. Examples of the thin film include a thin film of a single-crystal metal oxide and a thin film of a polycrystalline metal oxide. However, to form the thin film of a single-crystal metal oxide or the thin film of a polycrystalline metal oxide over a substrate, a high-temperature process or a laser heating process is needed. Thus, the manufacturing process cost is increased, and in addition, the throughput is decreased.

Non-Patent Document 1 and Non-Patent Document 2 have reported that an In—Ga—Zn oxide having a CAAC structure (referred to as CAAC-IGZO) was found in 2009. It has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, in 2013, an In—Ga—Zn oxide having an nc structure (referred to as nc-IGZO) was found (see Non-Patent Document 3). It has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 4 and Non-Patent Document 5 have shown a change in average crystal size due to electron beam irradiation to thin films of the above CAAC-IGZO, the above nc-IGZO, and IGZO having low crystallinity. In the thin film of IGZO having low crystallinity, crystalline IGZO of approximately 1 nm was observed even before the electron beam irradiation. Thus, it has been reported that the existence of a completely amorphous structure was not observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for a semiconductor of a transistor.

Non-Patent Document 6 shows that a transistor using a metal oxide has an extremely low leakage current in an off state; specifically, the off-state current per micrometer in the channel width of the transistor is of the order of yA/μm ($10^{-24}$ A/μm). For example, a low-power-consumption CPU applying a characteristic of low leakage current of the transistor using a metal oxide is disclosed (see Non-Patent Document 7).

Furthermore, application of a transistor using a metal oxide to a display device that utilizes the characteristic of a low leakage current of the transistor has been reported (see Non-Patent Document 8). In the display device, a displayed image is changed several tens of times per second. The number of times an image is changed per second is referred to as a refresh rate. The refresh rate is also referred to as driving frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate enables the power consumption of the display device to be reduced. Such a driving method is referred to as idling stop (IDS) driving.

The discovery of the CAAC structure and the nc structure has contributed to an improvement in electrical characteristics and reliability of a transistor using a metal oxide having the CAAC structure or the nc structure, a reduction in manufacturing cost, and an improvement in throughput. Furthermore, applications of the transistor to a display device and an LSI utilizing the characteristics of a low leakage current of the transistor have been studied.

<Method of Fabricating Semiconductor Device>

Next, a method for fabricating a semiconductor device including the transistor 200 of the present invention, which is illustrated in FIG. 1, will be described with reference to FIG. 4 to FIG. 13. In FIG. 4 to FIG. 13, (A) of each drawing is a top view. Moreover, (B) of each drawing is a cross-sectional view corresponding to a portion indicated by the dashed-dotted line A1-A2 in (A), and is also a cross-sectional view in the channel length direction of the transistor 200. Furthermore, (C) of each drawing is a cross-sectional view corresponding to a portion indicated by the dashed-dotted line A3-A4 in (A), and is also a cross-sectional view in the channel width direction of the transistor 200. Note that for simplification of the drawings, some components are not illustrated in the top view of (A) of each drawing.

First, a substrate (not illustrated) is prepared, and the insulator 214 is deposited over the substrate. The insulator 214 can be deposited by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object. For example, a wiring, an electrode, an element (e.g., transistor or capacitor), or the like included in a semiconductor device might be charged up by receiving charges from plasma. In this case, accumulated charges might break the wiring, electrode, element, or the like included in the semiconductor device. By contrast, in the case of a thermal CVD method that does not use plasma, such plasma damage is not caused and the yield of the semiconductor device can be increased. Furthermore, a thermal CVD method does not cause plasma damage during deposition, so that a film with few defects can be obtained.

In an ALD method, one atomic layer can be deposited at a time using self-regulating characteristics of atoms. Hence, an ALD method has various advantages such as deposition of an extremely thin film, deposition on a component with a large aspect ratio, deposition of a film with a small number of detects such as pinholes, deposition with excellent coverage, and low-temperature deposition. The ALD method includes a plasma-enhanced ALD (PEALD) method using plasma. The use of plasma is sometimes preferable because deposition at a lower temperature is possible. A precursor used in an ALD method sometimes contains impurities such as carbon. Thus, a film formed by an ALD method may contain impurities such as carbon in a larger amount than a film formed by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, a CVD method and an ALD method are deposition methods that enable favorable step coverage almost regardless of the shape of an object. In particular, an ALD method enables excellent step coverage and excellent thickness uniformity and thus is suitable for covering a surface of an opening with a high aspect ratio, for example. On the other hand, an ALD method has a relatively low deposition rate; thus, it is sometimes preferable to combine an ALD method with another deposition method with a high deposition rate such as a CVD method.

A CVD method and an ALD method enable control of the composition of a film to be obtained with a flow rate ratio of the source gases. For example, by a CVD method or an ALD method, a film with a certain composition can be deposited depending on a flow rate ratio of the source gases. Moreover, by a CVD method or an ALD method, by changing the flow rate ratio of the source gases during the deposition, a film whose composition is continuously changed can be deposited. In the case of depositing while changing the flow rate ratio of the source gases, as compared with the case of depositing with the use of a plurality of deposition chambers, time taken for the deposition can be shortened because time taken for transfer and pressure adjustment is omitted. Thus, productivity of semiconductor devices can be improved in some cases.

In this embodiment, for the insulator 214, silicon nitride is deposited by a CVD method. As described here, an insulator through which copper is less likely to pass, such as silicon nitride, is used for the insulator 214; accordingly, even when a metal that is likely to diffuse, such as copper, is used for a conductor of a lower layer (not illustrated) of the insulator 214, diffusion of the metal into the upper layer of the insulator 214 can be inhibited.

Then, a conductive film to be the conductor 205 is deposited over the insulator 214. The conductive film to be the conductor 205 can be deposited by a sputtering method, a CVD method, an MBE method, a PLD method, an ALD method, or the like. The conductive film to be the conductor 205 can be a multilayer film. In this embodiment, tungsten is deposited as the conductive film to be the conductor 205.

Next, the conductive film to be the conductor 205 is processed by a lithography method, so that the conductor 205 is formed.

In the lithography method, first, a resist is exposed to light through a mask. Next, a region exposed to light is removed or left using a developing solution, so that a resist mask is formed. Then, etching treatment through the resist mask is conducted, whereby a conductor, a semiconductor, an insulator, or the like can be processed into a desired shape. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask is not necessary in the case of using an electron beam or an ion beam. Note that the resist mask can be removed by dry etching treatment such as ashing, wet etching treatment, wet etching treatment after dry etching treatment, or dry etching treatment after wet etching treatment.

A hard mask formed of an insulator or a conductor may be used instead of the resist mask. In the case where a hard mask is used, a hard mask with a desired shape can be formed by forming an insulating film or a conductive film that is the hard mask material over the conductive film to be the conductor 205, forming a resist mask thereover, and then etching the hard mask material. The etching of the conductive film to be the conductor 205 may be performed after removal of the resist mask or with the resist mask remaining. In the latter case, the resist mask sometimes disappears during the etching. The hard mask may be removed by etching after the etching of the conductive film to be the conductor 205. The hard mask does not need to be removed in the case where the material of the hard mask does not affect the following process or can be utilized in the following process.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power is applied to one of the parallel plate type electrodes. Alternatively, a structure may be employed in which different high-frequency powers are applied to one of the parallel plate type electrodes. Alternatively, a structure may be employed in which high-frequency power sources with the same frequency are applied to the parallel plate type electrodes. Alternatively, a structure may be employed in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Next, an insulating film to be the insulator 216 is deposited over the insulator 214 and the conductor 205. The insulating film to be insulator 216 can be deposited by a sputtering method, a CVD method, an MBE method, a PLD method, an ALD method, or the like. In this embodiment, for the insulating film to be insulator 216, silicon oxide is deposited by a CVD method.

Here, the thickness of the insulating film to be the insulator 216 is preferably greater than or equal to the thickness of the conductor 205. For example, when the thickness of the conductor 205 is 1, the thickness of the insulating film to be the insulator 216 is greater than or equal to 1 and less than or equal to 3. In this embodiment, the thickness of the thickness of the conductor 205 is 150 nm and the thickness of the insulating film to be the insulator 216 is 350 nm.

Next, CMP (Chemical Mechanical Polishing) treatment is performed on the insulating film to be the insulator 216, so that part of the insulating film to be the insulator 216 is removed and a surface of the conductor 205 is exposed. Thus, the conductor 205 and the insulator 216 whose top surfaces are flat can be formed (see FIG. 4).

Here, a method for forming the conductor 205 which is different from the above will be described below.

Next, an insulator 216 is deposited over the insulator 214. The insulator 216 can be deposited by a sputtering method, a CVD method, an MBE method, a PLD method, an ALD method, or the like.

Then, an opening reaching the insulator 214 is formed in the insulator 216. Note that examples of the opening include a groove and a slit. A region where the opening is formed may be referred to as an opening portion. Wet etching can be used for the formation of the openings; however, dry etching is preferably used for microfabrication. As the insulator 214, it is preferable to select an insulator that functions as an etching stopper film used in forming the groove by etching the insulator 216. For example, in the case where a silicon oxide film is used as the insulator 216 in which the groove is to be formed, a silicon nitride film, an aluminum oxide film, or a hafnium oxide film is preferably used as the insulator 214.

After the formation of the opening, a conductive film to be the conductor 205a is deposited. The conductive film preferably includes a conductor that has a function of inhibiting the passage of oxygen. For example, tantalum nitride, tungsten nitride, or titanium nitride can be used. Alternatively, a stacked-layer film with tantalum, tungsten, titanium, molybdenum, aluminum, copper, or a molybdenum-tungsten alloy can be used. The conductive film to be the conductor 205a can be deposited by a sputtering method, a CVD method, an MBE method, a PLD method, an ALD method, or the like.

In this embodiment, the conductive film to be the conductor 205a has a multilayer structure. First, tantalum nitride is deposited by a sputtering method, and titanium nitride is stacked over the tantalum nitride. Since such metal nitrides are used for a lower layer of the conductive film to be the conductor 205a, even when a metal that is likely to diffuse, such as copper, is used for the conductive film to be the conductor 205b described below, the metal can be prevented from diffusing into the outside from the conductor 205.

Next, a conductive film to be the conductor 205b is deposited. The conductive film can be deposited by a plating method, a sputtering method, a CVD method, an MBE method, a PLD method, an ALD method, or the like. In this embodiment, for the conductive film to be the conductor 205b, a low-resistance conductive material such as copper is deposited.

Figure 2C:
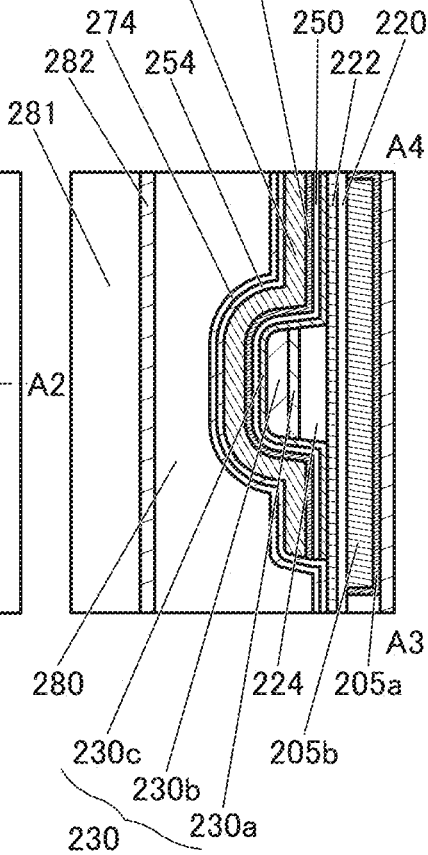
Figure 2B:
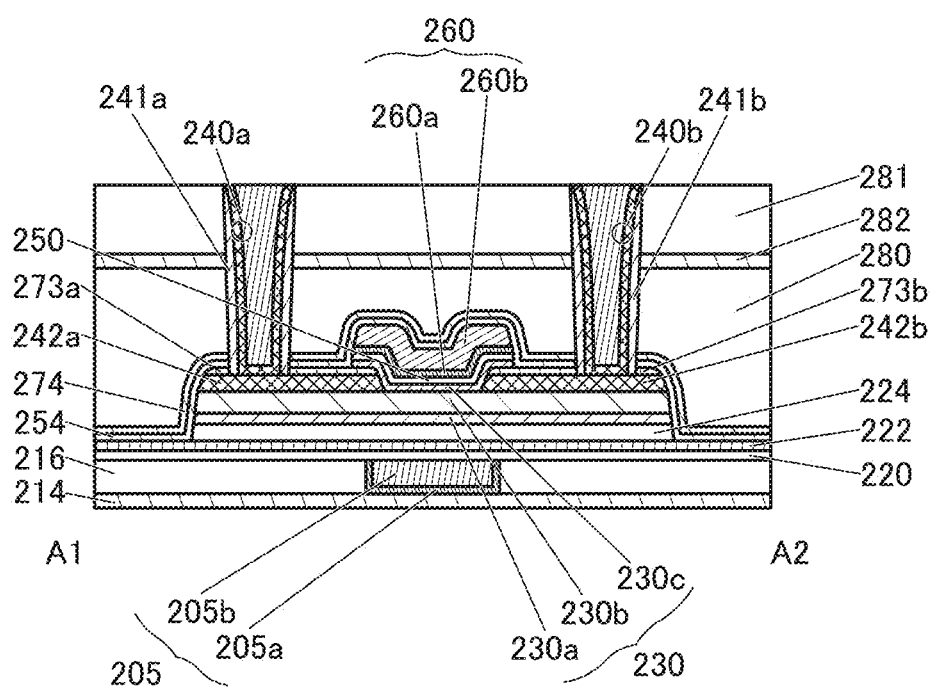

Next, CMP treatment is performed to remove parts of the conductive film to be the conductor 205a and the conductive film to be the conductor 205b, so that the insulator 216 is exposed. As a result, the conductive film to be the conductor 205 remains only in the opening portion. Thus, the conductor 205 whose top surface is flat can be formed. Note that the insulator 216 is partly removed by the CMP treatment in some cases. The above is the different method for forming the conductor 205. FIG. 2 illustrates an example of a semiconductor device including the conductor 205 formed by this method.

Figure 5A:
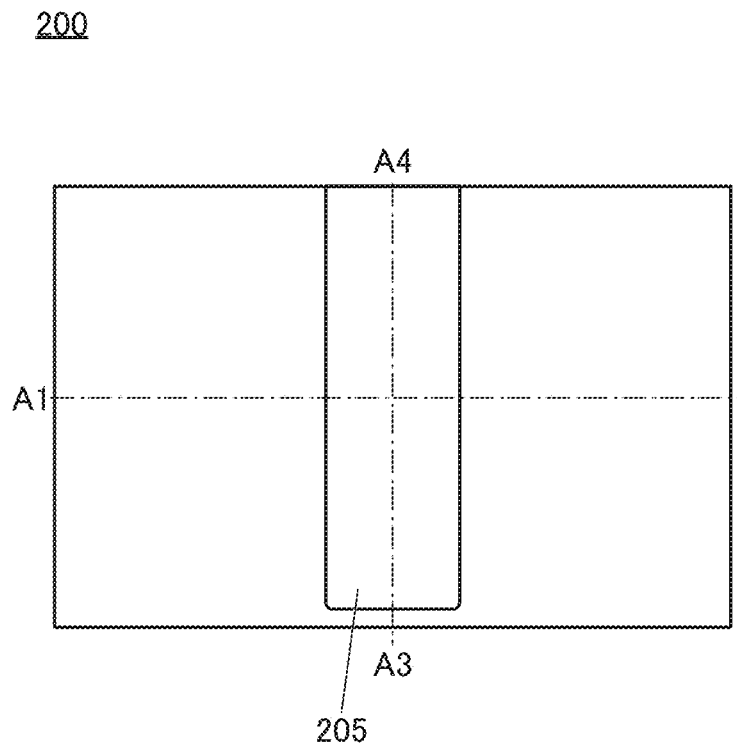
FIGS. 5A-5C A top view and cross-sectional views illustrating a method for manufacturing a semiconductor device of one embodiment of the present invention.
Figure 5C:
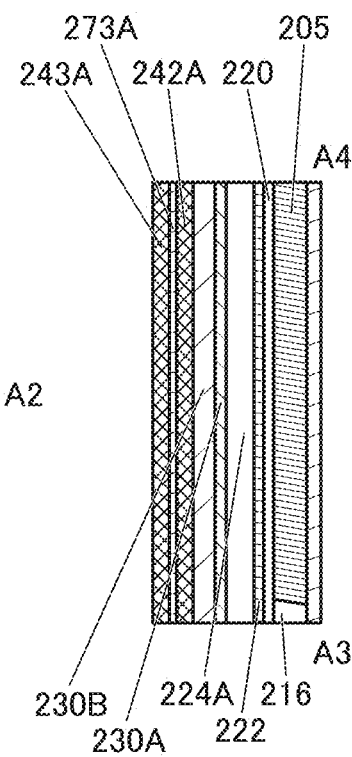
Figure 5B:
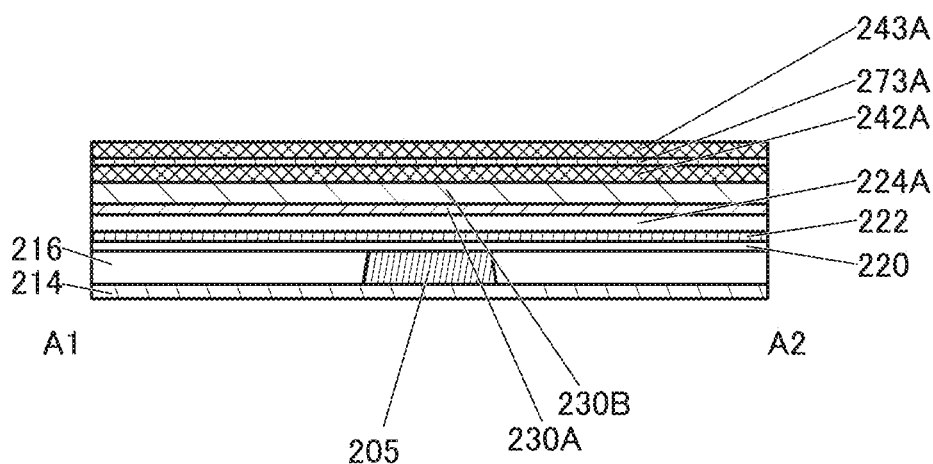

Next, the insulator 220, the insulator 222, the insulating film 224A, the oxide film 230A, the oxide film 230B, the insulating film 242A, the insulating film 273A, and the conductive film 243A are successively formed in this order over the insulator 216 and the conductor 205 (see FIG. 5).

When the insulator 220, the insulator 222, the insulating film 224A, the oxide film 230A, the oxide film 230B, the conductive film 242A, the insulating film 273A, and the conductive film 243A are successively formed without exposure to the air, water or the like can be prevented from being adsorbed onto each surface of the insulating film, the oxide film, and the conductive film. Thus, each interface between the stacked films is not exposed to the air; thus, the impurity concentration is reduced. Furthermore, impurities such as water or hydrogen can be prevented from entering the insulating film, the oxide film, the conductive film, and the like.

To deposit the insulator 220, the insulator 222, the insulating film 224A, the oxide film 230A, the oxide film 230B, the conductive film 242A, the insulating film 273A, and the conductive film 243A in this order without exposure to the air, a multi-chamber apparatus including a plurality of treatment chambers that enable successive deposition of different kinds of films is preferably used.

First, heat treatment may be performed under reduced pressure in a heat treatment chamber using the multi-chamber apparatus. The heat treatment is preferably performed because water adsorbed on a surface of the insulator 216 and a surface of the conductor 205 can be removed. After that, while the state in which the surface adsorption water is removed is kept, the insulator 220 can be deposited, and furthermore, the insulator 222, the insulating film 224A, the oxide film 230A, the oxide film 230B, the conductive film 242A, the insulating film 273A, and the conductive film 243A can be deposited in this order; thus, entry of impurities such as water or hydrogen into the insulating film, the oxide film, the conductive film, and the like can be suppressed.

Embodiment 2 can be referred to for the details of the multi-chamber apparatus including a plurality of treatment chambers. Hereinafter, the details of the insulator 220, the insulator 222, the insulating film 224A, the oxide film 230A, the oxide film 230B, the conductive film 242A, the insulating film 273A, and the conductive film 243A are described.

For the insulator 220, silicon oxide, silicon oxynitride, silicon nitride, silicon nitride oxide, or the like is preferably used. The insulator 220 can be deposited by a sputtering method, a CVD method, an MBE method, a PLD method, an ALD method, or the like.

An insulator containing an oxide of one or both of aluminum and hafnium is preferably deposited for the insulator 222. Note that it is preferable to use aluminum oxide, hafnium oxide, an oxide containing aluminum and hafnium (hafnium aluminate), or the like as an insulator containing an oxide of one or both of aluminum and hafnium. The insulator containing an oxide of one or both of aluminum and hafnium has a barrier property against oxygen, hydrogen, and water. When the insulator 222 has a barrier property against hydrogen and water, hydrogen and water contained in structure bodies provided around the transistor 200 are inhibited from diffusing into the transistor 200 through the insulator 222, and generation of oxygen vacancies in the oxide 230 can be inhibited. The insulator 222 can be deposited by a sputtering method, a CVD method, an MBE method, a PLD method, an ALD method, or the like.

The insulating film 224A can be deposited by a sputtering method, a CVD method, an MBE method, a PLD method, an ALD method, or the like.

The oxide film 230A and the oxide film 230B can be deposited by a sputtering method, a CVD method, an MBE method, a PLD method, an ALD method, or the like.

In the case where the oxide film 230A and the oxide film 230B are deposited by a sputtering method, for example, oxygen or a mixed gas of oxygen and a rare gas is used as a sputtering gas. By increasing the proportion of oxygen contained in the sputtering gas, the amount of excess oxygen in the oxide film to be deposited can be increased. In the case where the above oxide film is deposited by a sputtering method, the above In-M-Zn oxide target can be used.

In particular, when the oxide film 230A is deposited, part of oxygen contained in the sputtering gas is supplied to the insulator 224 in some cases. Therefore, the proportion of oxygen contained in the sputtering gas for the oxide film 230A is preferably 70% or higher, further preferably 80% or higher, still further preferably 100%.

In the case where the oxide film 230B is formed by a sputtering method, when the proportion of oxygen contained in the sputtering gas is higher than or equal to 1% and lower than or equal to 30%, preferably higher than or equal to 5% and lower than or equal to 20% during the deposition, an oxygen-deficient oxide semiconductor is formed. In a transistor using an oxygen-deficient oxide semiconductor for its channel formation region, relatively high field-effect mobility can be obtained. However, one embodiment of the present invention is not limited thereto. In the case where the oxide film 230B is formed by a sputtering method and the proportion of oxygen in the sputtering gas is higher than or equal to 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained.

In this embodiment, the oxide film 230A is deposited by a sputtering method using a target with In:Ga:Zn=1:1:0.5 [atomic ratio] or a target with In:Ga:Zn=1:3:4 [atomic ratio]. The oxide film 230B is deposited by a sputtering method using a target with In:Ga:Zn=4:2:4.1 [atomic ratio]. Note that each of the oxide films is preferably formed in accordance with characteristics required for the oxide 230 by appropriate selection of deposition conditions and an atomic ratio.

Note that the conductive film 242A can be deposited by a sputtering method, a CVD method, an MBE method, a PLD method, an ALD method, or the like.

An insulating film containing an oxide of one or both of aluminum and hafnium is preferably deposited as the insulating film 273A. Note that it is preferable to use aluminum oxide, hafnium oxide, an oxide containing aluminum and hafnium (hafnium aluminate), or the like as an insulator containing an oxide of one or both of aluminum and hafnium. The insulating film containing an oxide of one or both of aluminum and hafnium has a barrier property against oxygen, hydrogen, and water. The insulating film 273A can be deposited by a sputtering method, a CVD method, an MBE method, a PLD method, an ALD method, or the like.

The conductive film 243A can be deposited by a sputtering method, a CVD method, an MBE method, a PLD method, an ALD method, or the like.

Figure 6A:
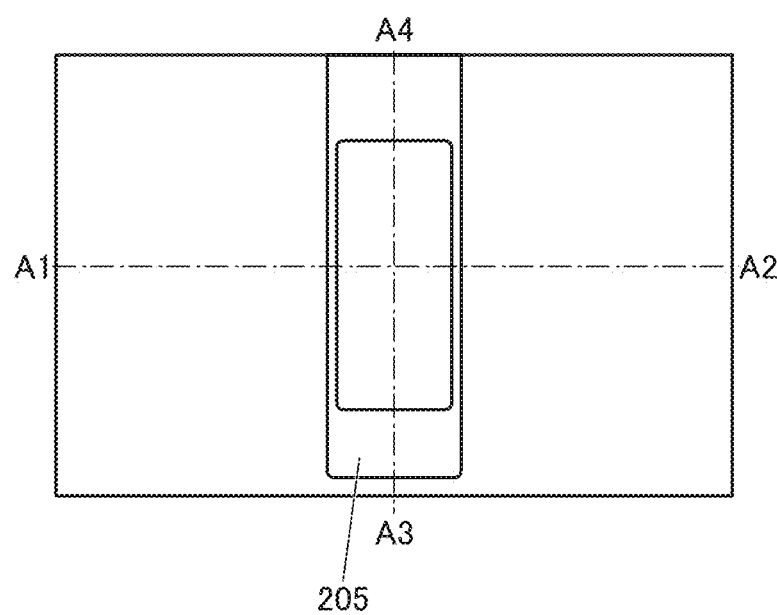
FIGS. 6A-6C A top view and cross-sectional views illustrating a method for manufacturing a semiconductor device of one embodiment of the present invention.
Figure 6C:
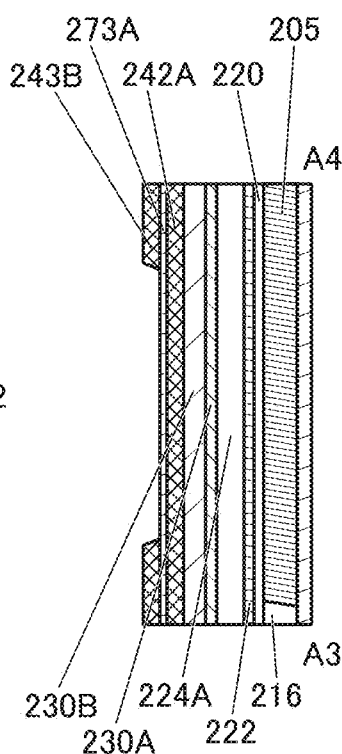
Figure 6B:
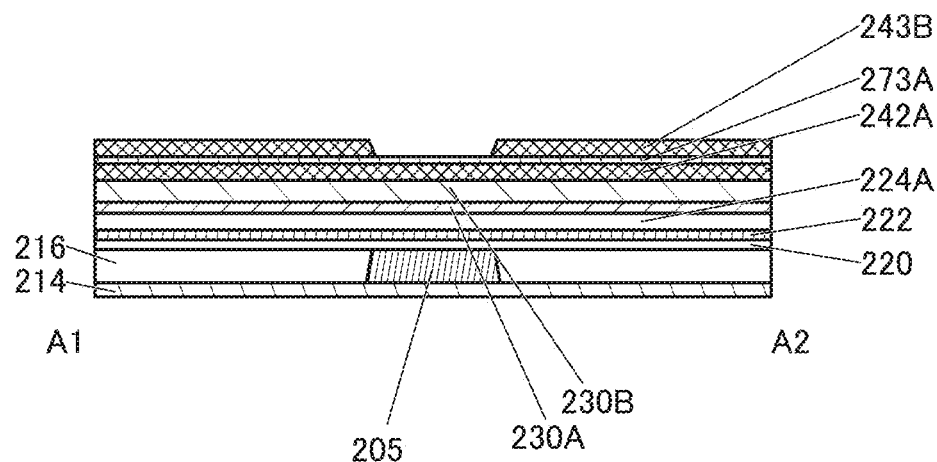

Then, the conductive film 243A is processed by a lithography method to form the conductor layer 243B (see FIG. 6). Through the processing, a cross section preferably has a tapered shape. The taper angle with respect to a plane parallel to the bottom surface of the substrate is greater than or equal to 30° and less than 75°, preferably greater than or equal to 30° and less than 70°. With such a taper angle, coverage with films deposited in the following process can be improved. In addition, the processing is preferably performed by a dry etching method. The processing by a dry etching method is suitable for microfabrication and the processing for the above-described formation of a tapered shape.

Figure 7A:
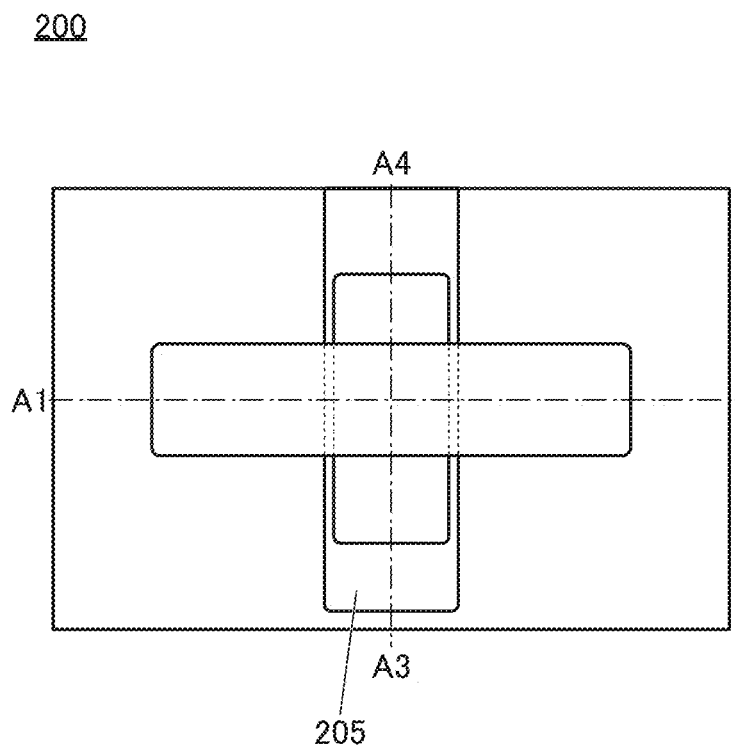
FIGS. 7A-7C A top view and cross-sectional views illustrating a method for manufacturing a semiconductor device of one embodiment of the present invention.
Figure 7C:
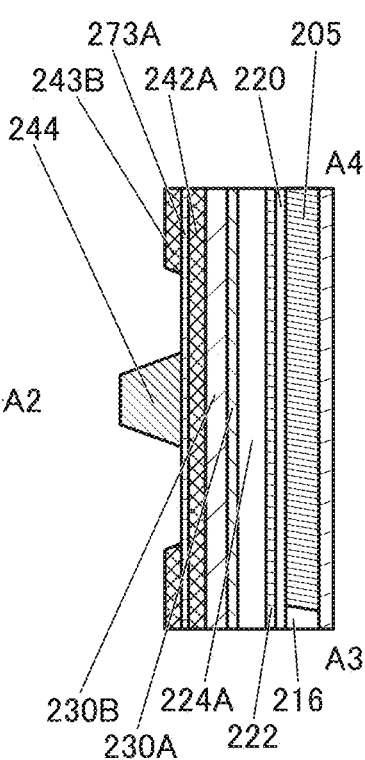
Figure 7B:
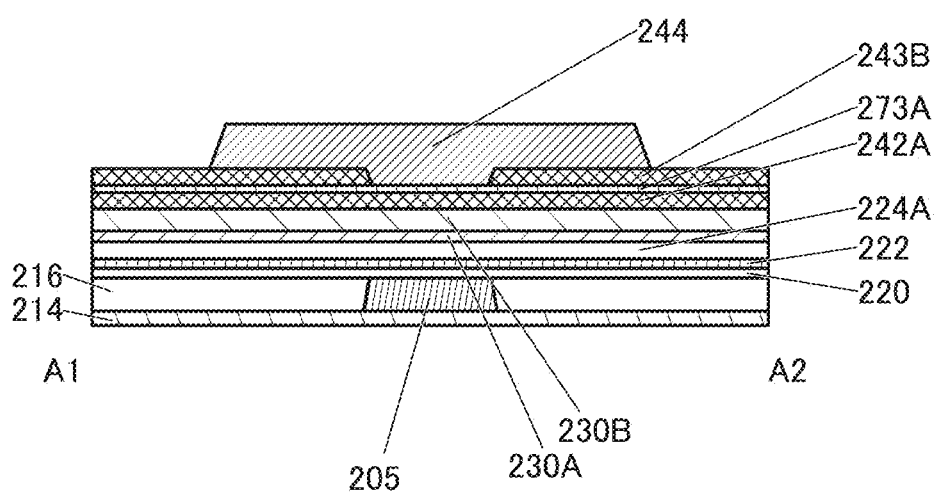

Next, a resist 244 is formed by a lithography method (see FIG. 7).

Figure 8A:
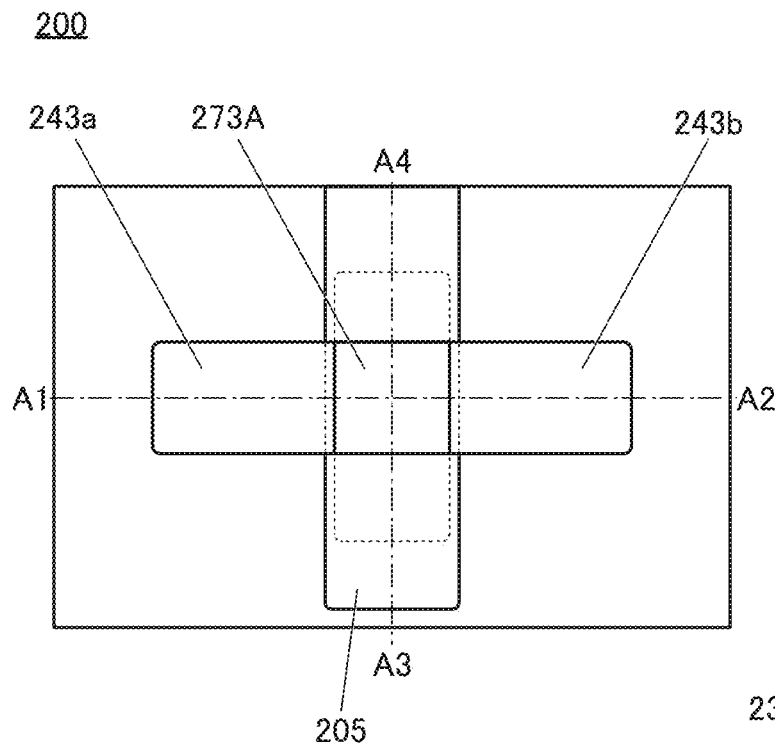
FIGS. 8A-8C A top view and cross-sectional views illustrating a method for manufacturing a semiconductor device of one embodiment of the present invention.
Figure 8C:
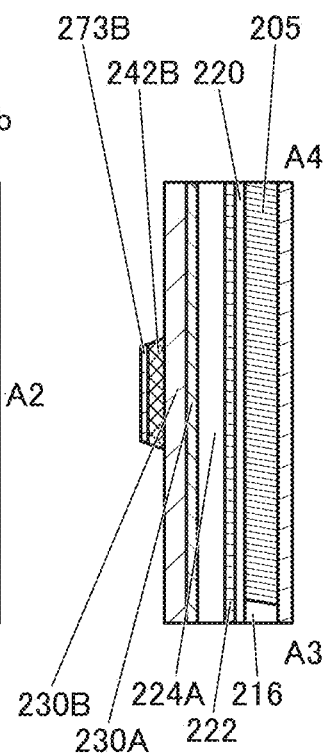
Figure 8B:
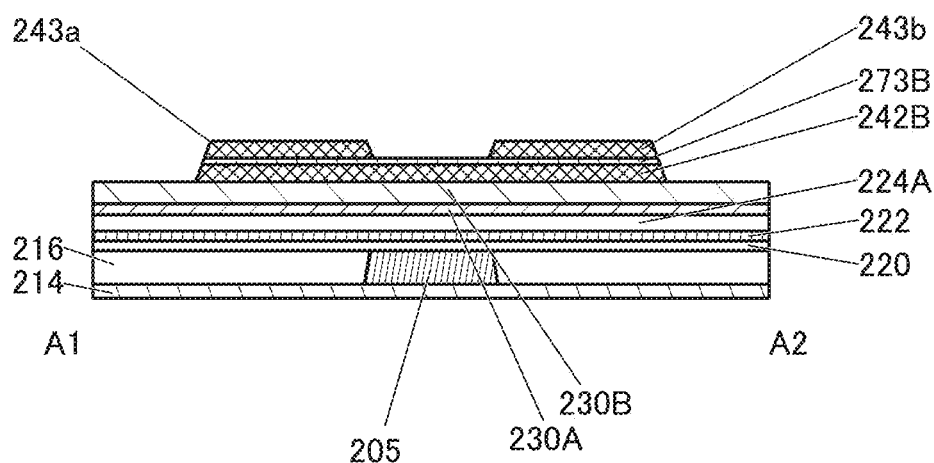
Figure 9A:
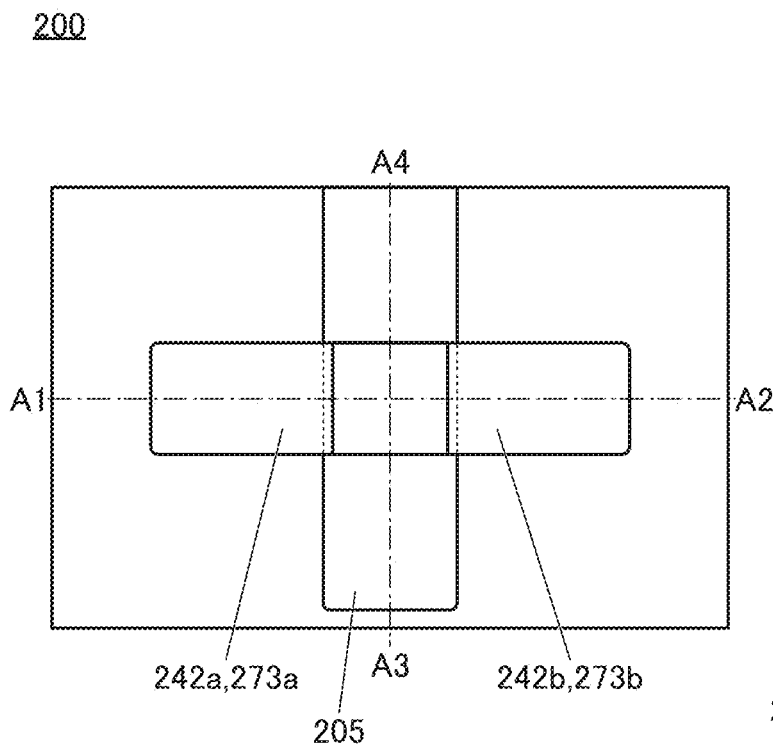
FIGS. 9A-9C A top view and cross-sectional views illustrating a method for manufacturing a semiconductor device of one embodiment of the present invention.
Figure 9C:
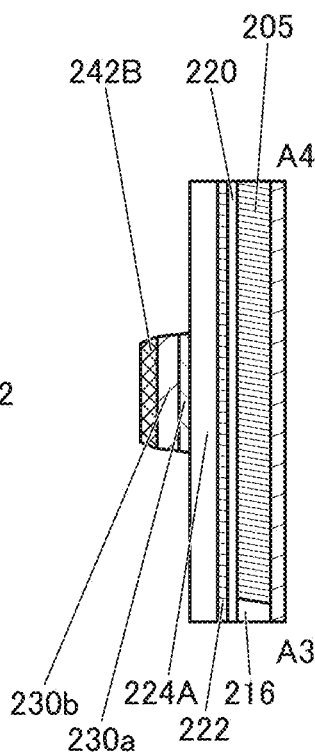
Figure 9B:
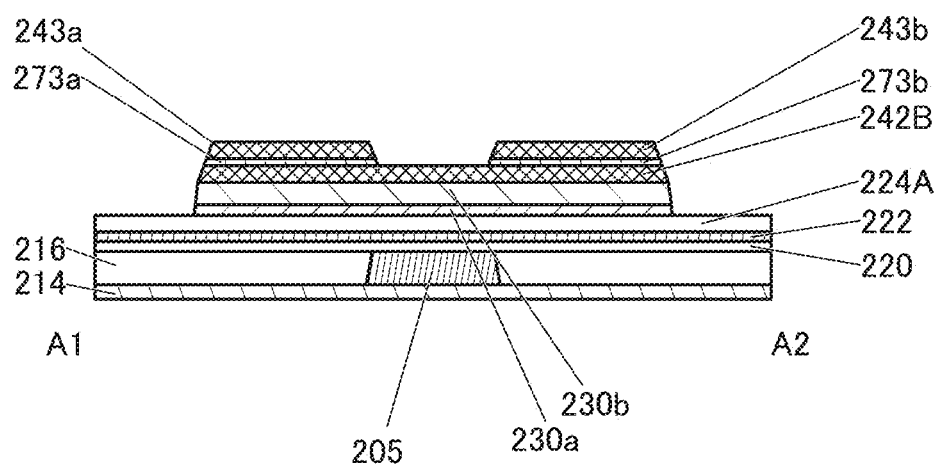
Figure 10A:
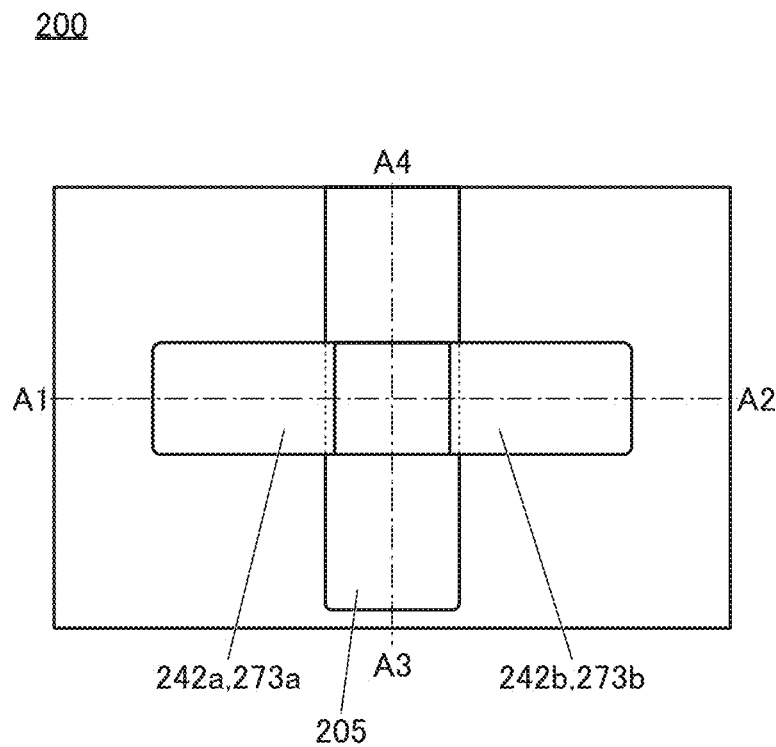
FIGS. 10A-10C A top view and cross-sectional views illustrating a method for manufacturing a semiconductor device of one embodiment of the present invention.
Figure 10C:
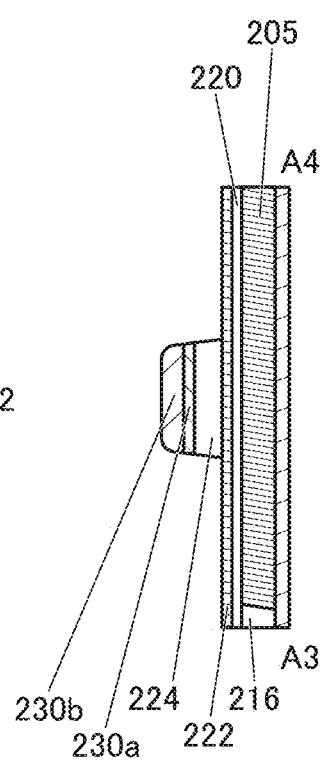
Figure 10B:
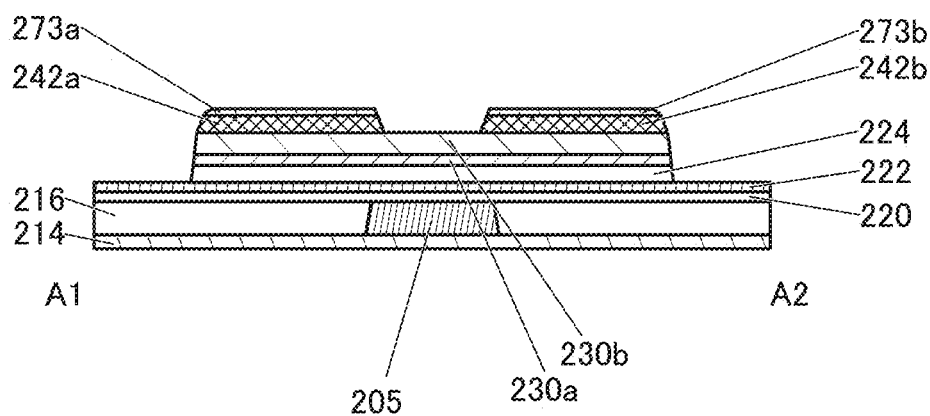
Figure 12A:
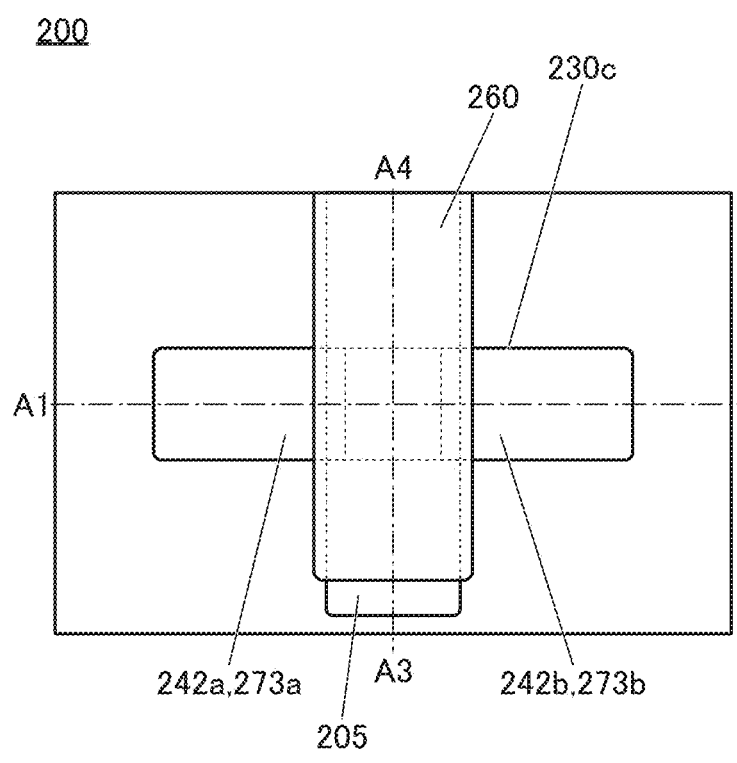
FIGS. 12A-12C A top view and cross-sectional views illustrating a method for manufacturing a semiconductor device of one embodiment of the present invention.
Figure 12C:
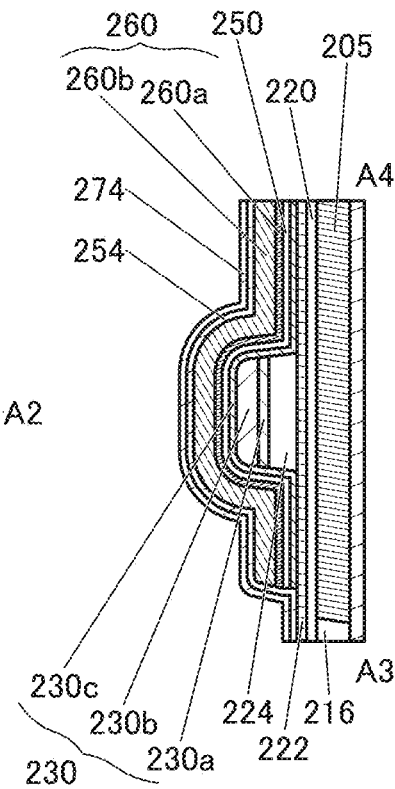
Figure 12B:
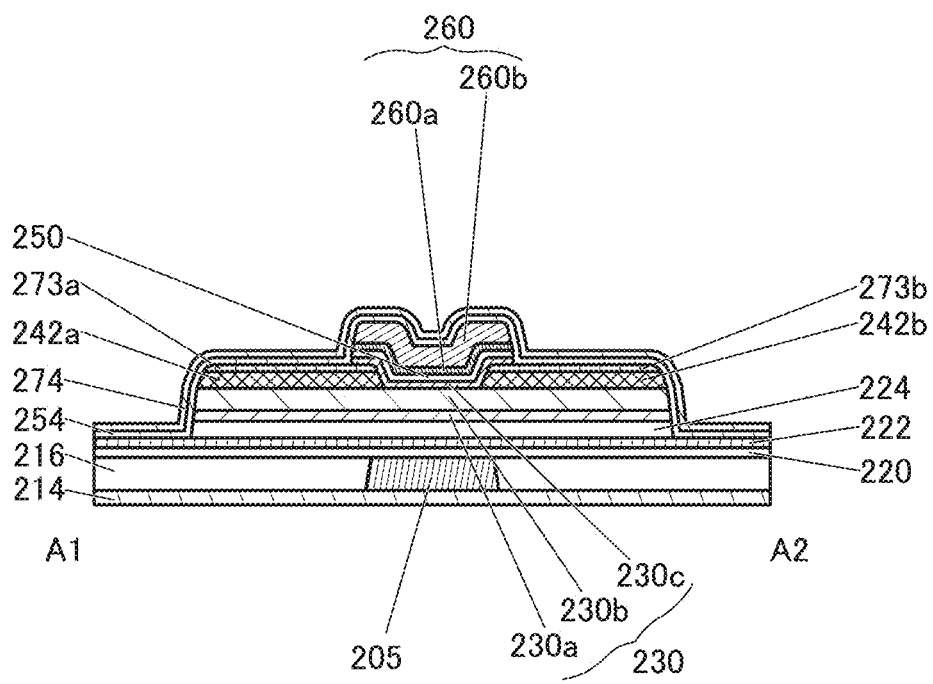
Figure 13A:
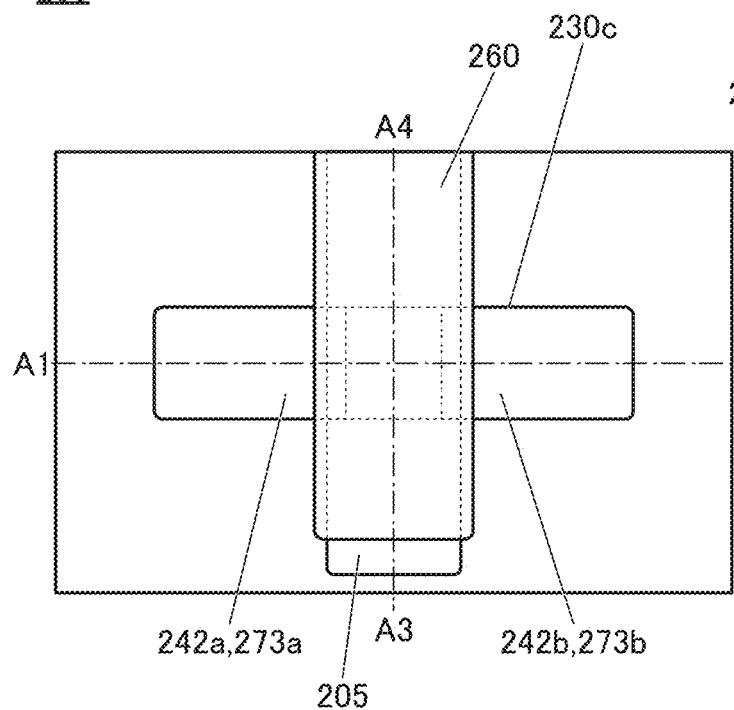
FIGS. 13A-13C A top view and cross-sectional views illustrating a method for manufacturing a semiconductor device of one embodiment of the present invention.
Figure 13C:
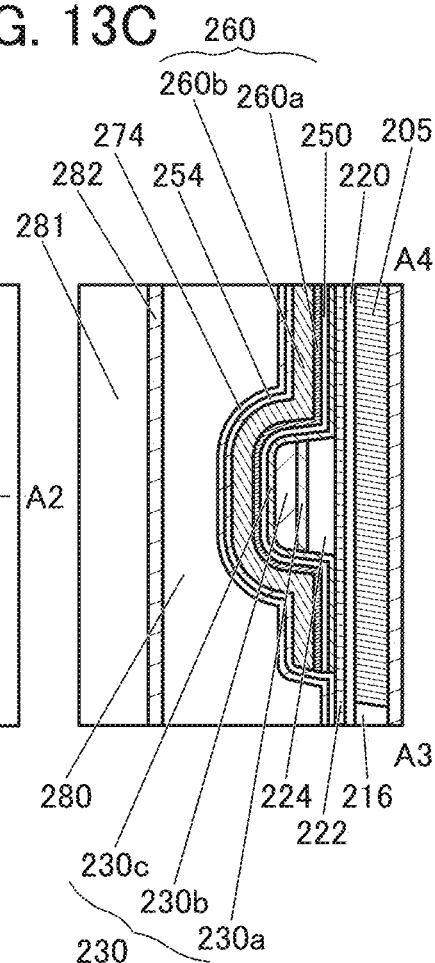
Figure 13B:
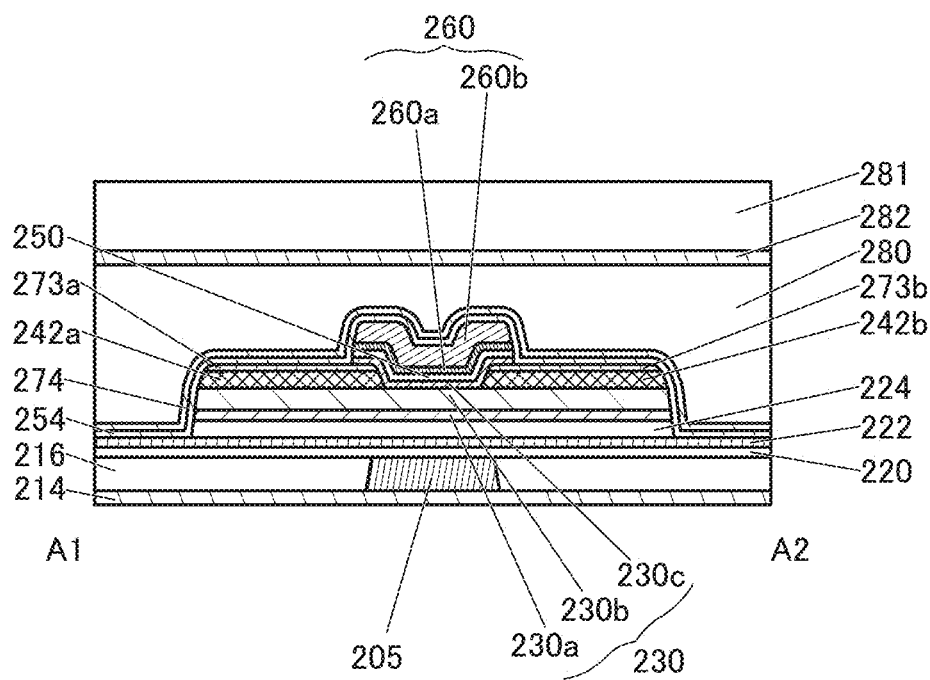

Next, the conductor layer 243B, the insulating film 273A, and the conductive film 242A are etched with the use of the resist 244 as an etching mask, the conductor 243a, the conductor 243b, the insulating layer 273B, and the conductor layer 242B are formed, and then the resist 244 is removed (see FIG. 8).

Next, the oxide film 230A and the oxide film 230B are etched using exposed portions of the surfaces of the conductor 243a, the conductor 243b, and the insulating layer 273B as the etching mask to form the oxide 230a and the oxide 230b. At the same time, a region of the insulating layer 273B which is over the conductor layer 242B and is between the conductor 243a and the conductor 243b is etched, so that the insulator 273a and the insulator 273b are formed (see FIG. 9).

Processing is preferably performed with the etching condition that the etching rate of the oxide film 230A and the oxide film 230B is higher than the etching rate of the conductor 243a, the conductor 243b, and the conductor layer 242B. When the etching rate of the conductor 243a, the conductor 243b, and the conductor layer 242B is assumed as 1, the etching rate of the oxide film 230A and the oxide film 230B is set to 3 to 50, preferably 5 to 30 inclusive.

Next, portions where the surfaces of the conductor 243a, the conductor 243b, and the conductor layer 242B are exposed are etched, so that the conductor 242a and the conductor 242b are formed. Next, the insulating film 224A is etched until the surface of the insulator 222 is exposed, whereby the insulator 224 is formed (see FIG. 10).

Here, the oxide 230a, the oxide 230b, the conductor 242a and the conductor 242b are formed to at least partly overlap with the conductor 205. It is preferable that the side surface of the oxide 230a, the side surface of the oxide 230b, the side surface of the conductor 242a, and the side surface of the conductor 242a be each substantially perpendicular to the top surface of the insulator 222. When they are substantially perpendicular to the insulator 222, a plurality of the transistors 200 can be provided with high density in a small area. Alternatively, a structure may be employed in which an angle formed by the side surface of the oxide 230a, the side surface of the oxide 230b, the side surface of the conductor 242a, and the side surface of the conductor 242b and the top surface of the insulator 222 is a small angle. In that case, the angle formed between each of the side surface of the oxide 230a, the side surface of the oxide 230b, the side surface of the conductor 242a, and the side surface of the conductor 242b and the top surface of the insulator 222 is preferably larger than or equal to 60° and smaller than 70°. With such a shape, in a later step, the coverage with the insulator 273 and the like can be improved, so that defects such as a void can be reduced.

Note that for the processing of the oxide films and the conductive film, a lithography method can be employed. The processing can be performed by a dry etching method or a wet etching method. The processing by a dry etching method is suitable for microfabrication.

In some cases, treatment such as dry etching performed in the above process causes the attachment or diffusion of impurities due to an etching gas or the like to a surface or an inside of the oxide 230a, the oxide 230b, or the like. Examples of the impurities include fluorine and chlorine.

In order to remove the above impurities and the like, cleaning is performed. Examples of the cleaning method include wet cleaning using a cleaning solution, plasma treatment using plasma, and cleaning by heat treatment, and any of these cleanings may be performed in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed.

Next, heat treatment may be performed. The heat treatment may be performed under a reduced pressure, and an oxide film to be the oxide 230c may be successively formed without exposure to the air. The treatment removes moisture and hydrogen absorbed onto the surface of the oxide 230b and the like, and reduces moisture concentration and hydrogen concentration in the oxide 230a and the oxide 230b. The heat treatment is preferably performed at a temperature higher than or equal to 100° C. and lower than or equal to 400° C. In this embodiment, the heat treatment is performed at 200° C.

The oxide film to be the oxide 230c can be deposited by a sputtering method, a CVD method, an MBE method, a PLD method, an ALD method, or the like. The oxide film to be the oxide 230c may be deposited by a deposition method similar to that for the oxide film 230A or the oxide film 230B in accordance with the characteristics required for the oxide 230c. In this embodiment, the oxide film to be the oxide 230c is deposited by a sputtering method using a target with In:Ga:Zn=1:3:4 [atomic ratio] or In:Ga:Zn=4:2:4.1 [atomic ratio].

In particular, in the deposition of the oxide film to be the oxide 230c, part of oxygen contained in a sputtering gas is supplied to the oxide 230a and the oxide 230b, in some cases. Note that the proportion of oxygen contained in the sputtering gas for the oxide film to be the oxide 230c is higher than or equal to 70%, preferably higher than or equal to 80%, and further preferably 100%.

Next, heat treatment may be performed. The heat treatment may be performed under a reduced pressure, and an insulating film to be the insulator 250 may be successively formed without exposure to the air. By such treatment, moisture and hydrogen adsorbed on the surface of the oxide film to be the oxide 230c and the like can be removed, and the moisture concentration and the hydrogen concentration in the oxide films to be the oxide 230a, the oxide 230b, and the oxide 230c can be reduced. The heat treatment is preferably performed at a temperature higher than or equal to 100° C. and lower than or equal to 400° C.

The insulating film to be the insulator 250 can be deposited by a sputtering method, a CVD method, an MBE method, a PLD method, an ALD method, or the like. Silicon oxynitride is preferably deposited by a CVD method as the insulating film to be the insulator 250. Note that the deposition temperature at the time of the deposition of the insulating film to be the insulator 250 is preferably higher than or equal to 350° C. and lower than 450° C., particularly preferably approximately 400° C. When the insulating film to be the insulator 250 is deposited at 400° C., an insulator having few impurities can be deposited.

Next, a conductive film to be the conductor 260a and a conductive film to be the conductor 260b are deposited. The conductive film to be the conductor 260a and the conductive film to be the conductor 260b can be deposited by a sputtering method, a CVD method, an MBE method, a PLD method, an ALD method, or the like. A CVD method is preferably used, for example.

In this embodiment, titanium nitride is deposited by a sputtering method as the conductive film to be the conductor 260a, and tungsten is deposited by a sputtering method as the conductive film to be the conductor 260b.

Alternatively, as a different deposition method of an oxide film to be the oxide 230c, an insulating film to be the insulator 250, a conductive film to be the conductor 260a, and a conductive film to be the conductor 260b, for example, the oxide film to be the oxide 230c, the insulating film to be the insulator 250, the conductive film to be the conductor 260a, and the conductive film to be the conductor 260b may be successively deposited using a multi-chamber apparatus.

With the above structure, a stacked-layer film in which impurities (typically, water, hydrogen, or the like) are thoroughly removed can be formed. Embodiment 2 can be referred to for the details of the multi-chamber apparatus including the plurality of treatment chambers.

Next, the conductive film to be the conductor 260a, the conductive film to be the conductor 260b, the insulating film to be the insulator 250, and the oxide film to be the oxide 230c are sequentially processed by a lithography method, so that the conductor 260a, the conductor 260b, the insulator 250, and the oxide 230c are formed. Note that in this embodiment, the conductor 260a, the conductor 260b, and the insulator 250 are processed by a dry etching method and the oxide 230c is processed by a wet etching method (see FIG. 11).

Note that a side surface of the conductor 260a, a side surface of the conductor 260b, a side surface of the insulator 250, and a side surface of the oxide 230c are preferably aligned with each other.

Next, heat treatment may be performed. The heat treatment is preferably performed at higher than or equal to 300° C. and lower than or equal to 450° C. in a nitrogen atmosphere. In this embodiment, the treatment is performed at 400° C. in a nitrogen atmosphere for one hour.

Then, the insulator 254 is formed to cover the insulator 222, the oxide 230, the conductor 242a, the conductor 242b, the insulator 273a, the insulator 273b, the insulator 250, and the conductor 260.

The heat treatment may be performed before the insulator 254 is deposited. The heat treatment may be performed under a reduced pressure, and an insulating film to be the insulator 254 may be successively formed without exposure to the air. With the heat treatment performed as described above, surface adsorption water can be removed and the insulator 254 can be deposited without reattachment of the surface adsorption water, which is preferable.

The insulator 254 is preferably formed using an insulator having a function of suppressing transmission of impurities such as water or hydrogen and oxygen. The insulator 254 can be deposited by a sputtering method, a CVD method, an MBE method, a PLD method, an ALD method, or the like. In this embodiment, the heat treatment is performed under a reduced pressure, and then aluminum oxide is deposited by a sputtering method with a sputtering apparatus.

Next, the insulator 274 is deposited over the insulator 254. For the insulator 274, an insulator having a function of inhibiting the passage of oxygen and impurities such as water and hydrogen is preferably used. For example, silicon nitride, silicon nitride oxide, aluminum oxide, or the like can be used. The insulator 274 can be deposited by a sputtering method, a CVD method, an MBE method, a PLD method, an ALD method, or the like. In this embodiment, silicon nitride is deposited by a sputtering method (see FIG. 12).

Next, an insulating film to be the insulator 280 is deposited over the insulator 274. The insulating film to be the insulator 280 can be deposited by a sputtering method, a CVD method, an MBE method, a PLD method, an ALD method, or the like. Next, the insulating film to be the insulator 280 is subjected to CMP treatment, so that the insulator 280 having a flat top surface is formed.

Next, heat treatment may be performed. In this embodiment, the treatment is performed at 400° C. in a nitrogen atmosphere for one hour. The heat treatment can reduce the moisture concentration and the hydrogen concentration in the insulator 250 and the insulator 280.

Next, the insulator 282 may be formed over the insulator 280. The insulator 282 can be deposited by a sputtering method, a CVD method, an MBE method, a PLD method, an ALD method, or the like. As the insulator 282, an aluminum oxide film is preferably deposited by a sputtering method, for example. With an aluminum oxide film deposited by a sputtering method, hydrogen included in the insulator 280 can be inhibited from diffusing into the insulator 250 and the oxide 230 in some cases.

Next, heat treatment may be performed. In this embodiment, the treatment is performed at 400° C. in a nitrogen atmosphere for one hour. By the heat treatment, oxygen added by the formation of the insulator 282 can be injected into the insulator 250 and the insulator 280.

Next, the insulator 281 may be deposited over the insulator 282. The insulator 281 can be deposited by a sputtering method, a CVD method, an MBE method, a PLD method, an ALD method, or the like (see FIG. 13).

Next, an opening reaching the conductor 242a is formed in the insulator 273a, the insulator 254, the insulator 274, the insulator 280, the insulator 282, and the insulator 281. Moreover, an opening reaching the conductor 242b is formed in the insulator 273b, the insulator 254, the insulator 274, the insulator 280, the insulator 282, and the insulator 281. The openings are formed by a lithography method.

Next, an insulating film to be the insulator 241 is deposited and the insulating film is subjected to anisotropic etching, so that the insulator 241 is formed. The conductive film can be deposited by a sputtering method, a CVD method, an MBE method, a PLD method, an ALD method, or the like. As the insulating film to be the insulator 241, an insulating film having a function of inhibiting transmission of oxygen is preferably used. For example, an aluminum oxide film is preferably deposited by an ALD method. For the anisotropic etching, a dry etching method or the like is performed, for example. When the side wall portions of the openings have such a structure, transmission of oxygen from the outside can be inhibited and oxidation of the conductor 240a and conductor 240b to be formed next can be prevented. Furthermore, impurities such as water and hydrogen can be prevented from diffused from the conductor 240a and the conductor 240b to the outside.

Next, a conductive film to be the conductor 240a and the conductor 240b is deposited. The conductive film to be the conductor 240a and the conductor 240b desirably has a stacked-layer structure which includes a conductor having a function of inhibiting transmission of impurities such as water and hydrogen. For example, a stacked layer of tantalum nitride, titanium nitride, or the like and tungsten, molybdenum, copper, or the like can be employed. The conductive film to be the conductor 240 can be deposited by a sputtering method, a CVD method, an MBE method, a PLD method, an ALD method, or the like.

Next, CMP treatment is performed to remove part of the conductive film to be the conductor 240a and the conductor 240b, so that the insulator 281 is exposed. As a result, the conductive film remains only in the openings, so that the conductor 240a and the conductor 240b having planar top surfaces can be formed (see FIG. 1). Note that the insulator 281 is partly removed by the CMP treatment in some cases.

Through the above process, the semiconductor device including the transistor 200 illustrated in FIG. 1 can be fabricated. As illustrated in FIG. 4 to FIG. 13, with the use of the method of manufacturing the semiconductor device described in this embodiment, the transistor 200 can be fabricated.

According to one embodiment of the present invention, a semiconductor device having a high on-state current can be provided. Alternatively, according to one embodiment of the present invention, a semiconductor device having excellent frequency characteristics can be provided. Alternatively, according to one embodiment of the present invention, a semiconductor device having favorable reliability can be provided. Alternatively, according to one embodiment of the present invention, a semiconductor device that can be miniaturized or highly integrated can be provided. Alternatively, according to one embodiment of the present invention, a semiconductor device having favorable electrical characteristics can be provided. Alternatively, according to one embodiment of the present invention, a semiconductor device having a low off-state current can be provided. Alternatively, according to one embodiment of the present invention, a semiconductor device having reduced power consumption can be provided. Alternatively, according to one embodiment of the present invention, a semiconductor device with high productivity can be provided.

The structures, methods, and the like described above in this embodiment can be used in combination as appropriate with the structures, methods, and the like described in the other embodiments and an example.

Embodiment 2

In this embodiment, an apparatus that can be used for manufacturing the semiconductor device of one embodiment of the present invention will be described with reference to FIG. 14.

When the semiconductor device of one embodiment of the present invention is manufactured, a what is called multi-chamber apparatus including a plurality of treatment chambers which enable successive deposition of different kinds of films is preferably used. Deposition treatment by sputtering, CVD, ALD, or the like can be performed in each treatment chamber. For example, in the case where one treatment chamber is the sputtering chamber, the sputtering chamber can be connected to a gas supply device, a gas refiner, a vacuum pump, a target, or the like connected to the gas supply device, or the like.

In each treatment chamber, cleaning treatment of the substrate, plasma treatment, inverse sputtering treatment, etching treatment, ashing treatment, heat treatment, or the like may be performed. Different kinds of treatment is performed between the treatment chambers as appropriate, whereby the insulator, the conductor, and the semiconductor film can be deposited without being exposed to the air.

An oxide semiconductor film is given as a typical example of the semiconductor film used for one embodiment of the present invention. In particular, use of an oxide semiconductor film in which the impurity concentration is low and the density of defect states is low (oxygen vacancies are few) enables a transistor having excellent electrical characteristics to be manufactured. Here, the state in which the impurity concentration is low and the density of defect states is low is referred to as highly purified intrinsic or substantially highly purified intrinsic.

A highly purified intrinsic or substantially highly purified intrinsic oxide semiconductor film has few carrier generation sources, and thus the carrier density can be reduced. Thus, a transistor in which a channel formation region is formed in the oxide semiconductor film rarely has electrical characteristics in which the threshold voltage is negative (also referred to as normally on). In addition, a highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; even when an element has a channel width of $1\times10^6$ μm and a channel length L of 10 μm, the off-state current can be less than or equal to the measurement limit of a semiconductor parameter analyzer, i.e., less than or equal to $1\times10^{-13}$ A, within a range of the voltage between a source electrode and a drain electrode (drain voltage) from 1 V to 10 V.

Note that impurities in the oxide semiconductor film are typically water, hydrogen, and the like. In this specification and the like, reducing or removing water and hydrogen from an oxide semiconductor film may be referred to as dehydration or dehydrogenation. Moreover, adding oxygen to an oxide semiconductor film may be referred to as oxygen addition and a state in which oxygen in excess of the stoichiometric composition is contained due to the oxygen addition may be referred to as an oxygen-excess state.

Here, as an oxide semiconductor, an insulator or a conductor positioned under the oxide semiconductor, and an insulator or a conductor positioned over the oxide semiconductor, different kinds of films are successively deposited without being exposed to the air, whereby a substantially highly purified intrinsic oxide semiconductor film whose impurity (hydrogen and water, in particular) concentration is reduced can be formed.

First, a structure example of the apparatus that can be used for manufacturing the semiconductor device of one embodiment of the present invention will be described in detail with reference to FIG. 14. By using the apparatus illustrated in FIG. 14, a semiconductor film, an insulator or a conductor positioned under the semiconductor film, and an insulator or a conductor positioned over the semiconductor film can be successively deposited. Thus, impurities (particularly hydrogen and water) that may enter the semiconductor film can be prevented from being inhibited.

Figure 14:
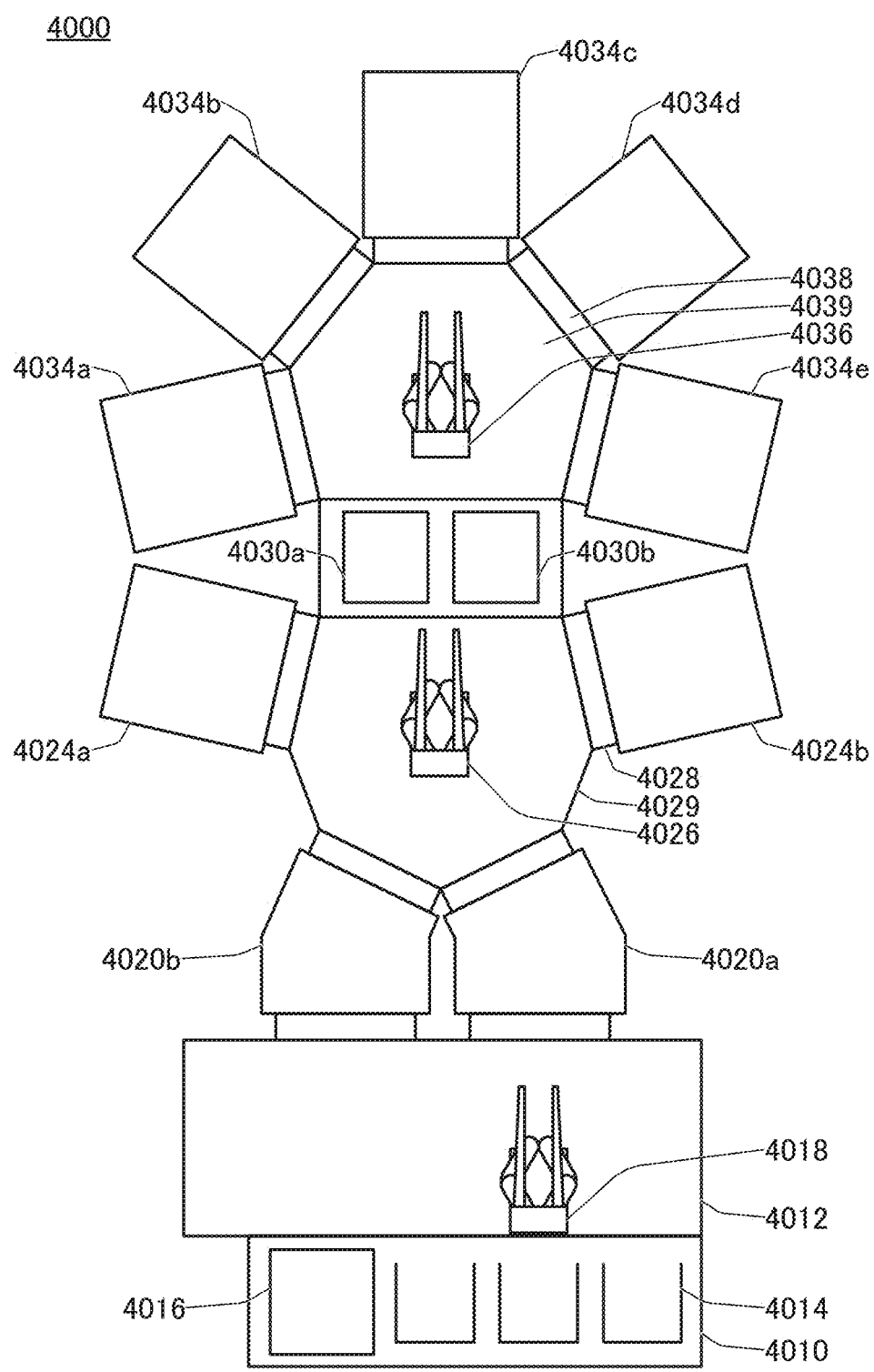
FIG. 14 A top view illustrating an apparatus for manufacturing a semiconductor device of one embodiment of the present invention.

FIG. 14 schematically shows a top view of a single wafer multi-chamber apparatus 4000.

The apparatus 4000 includes an atmosphere-side substrate supply chamber 4010, an atmosphere-side substrate transfer chamber 4012 that transfers a substrate from the atmosphere-side substrate supply chamber 4010, a load lock chamber 4020a that transfers a substrate and switches the pressure in the chamber from an atmospheric pressure to a reduced pressure or from a reduced pressure to an atmospheric pressure, an unload lock chamber 4020b that transfers a substrate and switches the pressure in the chamber from a reduced pressure to an atmospheric pressure or from an atmospheric pressure to a reduced pressure, a transfer chamber 4029 and a transfer chamber 4039 that transfer a substrate in vacuum, a transfer chamber 4030a and a transfer chamber 4030b that connect the transfer chamber 4029 and the transfer chamber 4039, and a treatment chamber 4024a, a treatment chamber 4024b, a treatment chamber 4034a, a treatment chamber 4034b, a treatment chamber 4034c, a treatment chamber 4034d, and a treatment chamber 4034e that perform deposition or heating.

Note that a plurality of treatment chambers can perform different treatments in parallel. Thus, a stacked-layer structure with different kinds of films can be easily fabricated. Note that the number of parallel treatments performed can be the number of the treatment chambers at the maximum.

For example, the apparatus 4000 illustrated in FIG. 14 is an apparatus that includes seven treatment chambers. Therefore, seven deposition treatments can be successively performed without being exposed to the air using one apparatus (which is referred to as "in-situ" in this specification).

On the other hand, the number of layers that can be fabricated without exposure to the air in a stacked-layer structure is not necessarily the same as the number of treatment chambers. For example, in the case where a desired stacked-layer structure includes a plurality of layers of the same material, the layers can be provided with the use of one treatment chamber; thus, it is possible to fabricate a stacked-layer structure in which the number of the stacked layers is larger than the number of the treatment chambers installed.

The atmosphere-side substrate supply chamber 4010 includes a cassette port 4014 that holds a substrate and an alignment port 4016 that aligns a substrate. Note that a plurality of the cassette ports 4014 may be provided (for example, there are three cassette ports in FIG. 14).

The atmosphere-side substrate transfer chamber 4012 is connected to the load lock chamber 4020a and the unload lock chamber 4020b. The transfer chamber 4029 is connected to the load lock chamber 4020a, the unload lock chamber 4020b, the transfer chamber 4030a, the transfer chamber 4030b, the treatment chamber 4024a, and the treatment chamber 4024b. The transfer chamber 4030a and the transfer chamber 4030b are connected to the transfer chamber 4029 and the transfer chamber 4039. The transfer chamber 4039 is connected to the transfer chamber 4030a, the transfer chamber 4030b, the treatment chamber 4034a, the treatment chamber 4034b, the treatment chamber 4034c, the treatment chamber 4034d, and the treatment chamber 4034e.

Note that a gate valve 4028 or a gate valve 4038 is provided for a connecting portion of each chamber so that each of the chambers except the atmosphere-side substrate supply chamber 4010 and the atmosphere-side substrate transfer chamber 4012 can be independently kept under vacuum. The atmosphere-side substrate transfer chamber 4012 includes a transfer robot 4018. The transfer chamber 4029 includes a transfer robot 4026 and the transfer chamber 4039 includes a transfer robot 4036. The transfer robot 4018, the transfer robot 4026, and the transfer robot 4036 include a plurality of movable portions and an arm for holding a substrate and can transfer a substrate to each chamber.

Note that the numbers of transfer chambers, treatment chambers, load lock chambers, unload lock chambers, and transfer chambers are not limited to the above and can be set as appropriate depending on the space for placement or the process conditions.

Particularly when there are a plurality of transfer chambers, two or more transfer chambers are preferably provided between one transfer chamber and another transfer chamber. For example, in the case where the transfer chamber 4029 and the transfer chamber 4039 are provided as illustrated in FIG. 14, the transfer chamber 4030a and the transfer chamber 4030b are preferably provided in parallel between the transfer chamber 4029 and the transfer chamber 4039.

When the transfer chamber 4030a and the transfer chamber 4030b are provided in parallel, for example, a step in which the transfer robot 4026 loads a substrate to the transfer chamber 4030a and a step in which the transfer robot 4036 loads a substrate to the transfer chamber 4030b can be performed at the same time. In addition, a step in which the transfer robot 4026 unloads a substrate from the transfer chamber 4030b and a step in which the transfer robot 4036 unloads a substrate from the transfer chamber 4030a can be performed at the same time. That is, driving a plurality of transfer robots at the same time improves production efficiency.

Although an example in which one transfer chamber includes one transfer robot and is connected to a plurality of treatment chambers is illustrated in FIG. 14, the present invention is not limited to this structure. A plurality of transfer robots may be provided per transfer chamber.

One or both of the transfer chamber 4029 and the transfer chamber 4039 are connected to a vacuum pump and a cryopump through valves. Accordingly, after the transfer chamber 4029 and the transfer chamber 4039 are evacuated with the use of the vacuum pump from an atmospheric pressure to a low vacuum or a medium vacuum (approximately several hundreds of pascals to 0.1 pascals), the valve is switched, whereby the transfer chamber 4029 and the transfer chamber 4039 can be evacuated from with the use of the cryopump from a medium vacuum to a high vacuum or an ultra-high vacuum (approximately 0.1 Pa to $1 \times 10^{-7}$ Pa).

Alternatively, two or more cryopumps may be connected in parallel to one transfer chamber, for example. With a plurality of cryopumps, even when one of the cryopumps is in regeneration, exhaust can be performed using the other cryopumps. Note that regeneration refers to a treatment for discharging molecules (or atoms) entrapped in the cryopump. When molecules (or atoms) are entrapped too much in a cryopump, the exhaust capability is lowered; therefore, it is preferable that regeneration be performed regularly.

The treatment chamber 4024a, the treatment chamber 4024b, the treatment chamber 4034a, the treatment chamber 4034b, the treatment chamber 4034c, the treatment chamber 4034d, and the treatment chamber 4034e can perform different treatments in parallel. In other words, the treatment chambers can perform, on the substrate provided, one or more treatments out of a deposition treatment by a sputtering method, a CVD method, an MBE method, a PLD method, an ALD method, or the like, a heat treatment, and a plasma treatment. In the treatment chamber, a deposition treatment may be performed after a heat treatment or a plasma treatment.

In the apparatus 4000, it is possible to transfer a substrate without exposure of the substrate to the air between treatments since a plurality of treatment chambers are provided; therefore, adsorption of impurities on the substrate can be inhibited. The treatment chambers can perform a deposition treatment for different kinds of films, a heat treatment, or a plasma treatment, which makes it possible to freely determine the order of deposition, a heat treatment, and the like.

Note that each treatment chamber may be connected to the vacuum pump through a valve. As the vacuum pump, a dry pump, a mechanical booster pump, and the like can be used, for example.

Furthermore, each treatment chamber may be connected to a power source capable of generating plasma. As the power source, a DC power source, an AC power source, a high-frequency (RF, microwave, or the like) power source, or the like may be provided. A pulsed generator may be connected to the DC power source.

Moreover, the treatment chamber may be connected to a gas refiner through a gas supply device. Note that the number of the gas supply devices and the number of gas refiners may be the same as the number of kinds of gases.

For example, in the case where the deposition treatment is performed by sputtering in the treatment chamber, the treatment chamber may include a target, a backing plate connected to the target, a cathode positioned to face the target with the backing plate therebetween, a deposition shield, a substrate stage, or the like. Furthermore, for example, the substrate stage may include a substrate holding mechanism that holds the substrate, a rear heater that heats the substrate from the back surface, or the like.

Note that the substrate stage is held substantially perpendicularly to a floor during deposition and is held substantially parallel to the floor when the substrate is delivered. Here, when the substrate stage is held substantially perpendicularly to the floor, the probability that dust or a particle mixed into the film during deposition is attached to the substrate can be lowered as compared to the case where the substrate stage is held parallel to the floor. However, there is a possibility that the substrate falls when the substrate stage is held perpendicularly (90°) to the floor; therefore, the angle of the substrate stage to the floor is preferably greater than or equal to 80° and less than 90°.

Note that the structure of the substrate stage is not limited to the above structure. A structure in which the substrate stage is substantially parallel to the floor may be employed, for example. In the case of such a structure, a target may be provided below the substrate stage, and a substrate may be provided between the target and the substrate stage. The substrate stage may be provided with a jig for fixing a substrate or a mechanism for fixing a substrate with which the substrate does not fall.

The treatment chamber including the deposition shield can suppress deposition of a particle which is sputtered from the target on a region where deposition is not needed. Moreover, the deposition shield is preferably processed to prevent accumulated sputtered particles from being separated. For example, blasting treatment which increases surface roughness or projections and depressions may be provided on the surfaces of the deposition shield.

The backing plate has a function of holding the target, and the cathode has a function of applying voltage (for example, negative voltage) to the target.

Note that a conductor, an insulator, or a semiconductor can be used for the target. For example, in the case where the target is an oxide semiconductor such as a metal oxide, the oxide semiconductor film can be formed in the treatment chamber. In addition, when a metal oxide is used for the target, an oxynitride semiconductor film can be formed by using a nitrogen gas as the deposition gas.

Each treatment chamber may be connected to the gas supply device through a gas heating mechanism. The gas heating mechanism is connected to the gas refiner through the gas supply device. As the gas introduced to the treatment chamber, a gas whose dew point is lower than or equal to −80° C., preferably lower than or equal to −100° C., further preferably lower than or equal to −120° C. can be used; for example, an oxygen gas, a nitrogen gas, and a rare gas (e.g., an argon gas) are used. With the gas heating mechanism, a gas which is introduced to the treatment chamber can be heated to a temperature higher than or equal to 40° C. and lower than or equal to 400° C. Note that the number of gas heating mechanisms, the number of gas supply devices, and the number of gas refiners may to the same as the number of kinds of gases.

Each treatment chamber may be connected to a turbo molecular pump and a vacuum pump through valves. In each treatment chamber, a cryotrap may be provided.

Note that the cryotrap is a mechanism which can adsorb a molecule (or an atom) having a relatively high melting point, such as water. The turbo molecular pump has excellent productivity because it stably exhausts a large-sized molecule (or atom) and needs low frequency of maintenance, whereas it has a low capability in removing hydrogen and water. Thus, a cryotrap can be used to improve the evacuation capability with respect to water or the like. The temperature of a freezer of the cryotrap is set lower than or equal to 100 K, preferably lower than or equal to 80 K. Furthermore, in the case where the cryotrap has a plurality of freezers, it is preferable to set the freezers at different temperatures because efficient exhaust is possible. For example, the temperature of a first-stage freezer is set lower than or equal to 100 K and the temperature of a second-stage freezer is set lower than or equal to 20 K.

Note that the exhaust method for the treatment chamber is not limited thereto, and a system similar to that in the exhaust method described for the transfer chamber connected thereto (the exhaust method using the cryopump and the vacuum pump) may be employed. Note that the exhaust method for the transfer chamber may have a structure similar to that of the treatment chamber (the exhaust method using the turbo molecular pump and the vacuum pump).

In particular, the vacuum pump and the cryotrap may be combined as the exhaust method for the treatment chamber in which the oxide semiconductor film is deposited. The exhaust method for the treatment chamber in which the oxide semiconductor film is deposited preferably has at least a function of adsorbing water molecules.

In the treatment chamber in which the oxide semiconductor film is deposited, the partial pressure of hydrogen molecules is preferably lower than or equal to $1\times10^{-2}$ Pa, and the partial pressure of water molecules is preferably lower than or equal to $1\times10^{-4}$ Pa. In the treatment chamber in which the oxide semiconductor film is deposited in a standby state, the pressure is lower than or equal to $8.0\times10^{-5}$ Pa, preferably lower than or equal to $5.0\times10^{-5}$ Pa, more preferably lower than or equal to $1.0\times10^{-5}$ Pa. The above values of the partial pressure of hydrogen molecules and the partial pressure of water molecules are the values of both of the standby state and in the deposition state (a plasma discharge state) of the treatment chamber in which sputtering is performed.

Note that a total pressure and a partial pressure in the treatment chamber can be measured using a mass analyzer. For example, Qulee CGM-051, a quadrupole mass analyzer (also referred to as Q-mass) produced by ULVAC, Inc. can be used.

The partial pressure of hydrogen molecules, the partial pressure of water molecules, and the pressure in a standby state in the treatment chamber are set to the values in above ranges, the impurity concentration of an oxide semiconductor film to be formed can be reduced.

In particular, each treatment chamber is used for deposition treatment by sputtering, so that part of the structure of the transistor 200 described in the above embodiment can be manufactured with a stacked-layer structure by successive in-situ deposition.

For example, in the case where the transistor 200 is manufactured, at least the insulator 220, the insulator 222, the insulating film 224A, the oxide film 230A, the oxide film 230B, the conductive film 242A, and the insulating film 273A can be successively formed using the apparatus 4000. Furthermore, when the conductive film 243A is deposited using the same material and the same condition as those of and the conductive film 242A, the conductive film 243A can be deposited in the treatment chamber in which the conductive film 242A is deposited. That is, the insulator 220, the insulator 222, the insulating film 224A, the oxide film 230A, the oxide film 230B, the conductive film 242A, the insulating film 273A, and the conductive film 243A can be successively deposited without being exposed to the air.

Furthermore, for example, the oxide film to be the oxide 230c, the insulating film to be the insulator 250, the conductive film to be the conductor 260a, and the conductive film to be the conductor 260b can be successively formed.

With the above structure, a stacked layer film in which impurities (typically, water, hydrogen, or the like) are thoroughly removed can be formed. Furthermore, each interface between the stacked films is not exposed to the air; thus, the impurity concentration is reduced.

Alternatively, in the case where heat treatment is performed in a treatment chamber, for example, the treatment chamber may have a plurality of heating stages that can hold a substrate. For example, the heating stage may have several stages. By increasing the number of the heating stages, a plurality of substrates can be subjected to heat treatment at the same time, which leads to an increase in productivity.

Furthermore, a heating mechanism which can be used for the treatment chamber may be a heating mechanism which performs heating with a resistance heater or the like, for example. Alternatively, a heating mechanism that uses heat conduction or heat radiation from a medium such as a heated gas for heating may be used. For example, an RTA (Rapid Thermal Anneal) apparatus such as a GRTA (Gas Rapid Thermal Anneal) apparatus or an LRTA (Lamp Rapid Thermal Anneal) apparatus can be used. In the LRTA, an object is heated by radiation of light (electromagnetic wave) emitted from a lamp such as a halogen lamp, a metal halide lamp, a xenon arc lamp, a carbon arc lamp, a high-pressure sodium lamp, or a high-pressure mercury lamp. In GRTA, heat treatment is performed using a high-temperature gas. An inert gas is used as the gas.

The load lock chamber 4020a may include a substrate delivery stage, a rear heater for heating a substrate from the back surface, or the like. When a pressure in the load lock chamber 4020a is increased from a reduced pressure state to an atmospheric pressure and the pressure in the load lock chamber 4020a becomes an atmospheric pressure, the substrate delivery stage in the load lock chamber 4020a receives a substrate from the transfer robot 4018 provided in the atmosphere-side substrate transfer chamber 4012. After that, the load lock chamber 4020a is evacuated into vacuum to be turned into a reduced pressure state, and then the transfer robot 4026 provided in the transfer chamber 4029 receives the substrate from the substrate delivery stage.

Furthermore, the load lock chamber 4020a is connected to a vacuum pump and a cryopump through valves. Note that the unload lock chamber 4020b can have a structure similar to that of the load lock chamber 4020a.

Since the atmosphere-side substrate transfer chamber 4012 includes the transfer robot 4018, delivery and receipt of a substrate between the cassette port 4014 and the load lock chamber 4020a can be performed using the transfer robot 4018. Furthermore, a mechanism, such as an HEPA filter (High Efficiency Particulate Air Filter), for inhibiting entry of dust or a particle may be provided above the atmosphere-side substrate transfer chamber 4012 and the atmosphere-side substrate supply chamber 4010. The cassette port 4014 can hold a plurality of substrates.

Entry of impurities into a semiconductor film can be suitably inhibited when an insulating film, a semiconductor film, and a conductive film are successively deposited without exposure to the air with the use of the apparatus 4000 described above.

As described above, a stacked-layer structure including a semiconductor film can be formed by successive deposition by the use of the apparatus of one embodiment of the present invention. Therefore, impurities such as hydrogen, water, or the like that might enter a semiconductor film can be inhibited and a semiconductor film with a low density of defect states can be formed.

At least part of this embodiment can be implemented in combination with any of the other embodiments and the example described in this specification as appropriate.

Embodiment 3

In this embodiment, one embodiment of a semiconductor device will be described using FIG. 15 and FIG. 16.

[Memory Device 1]

Figure 15:
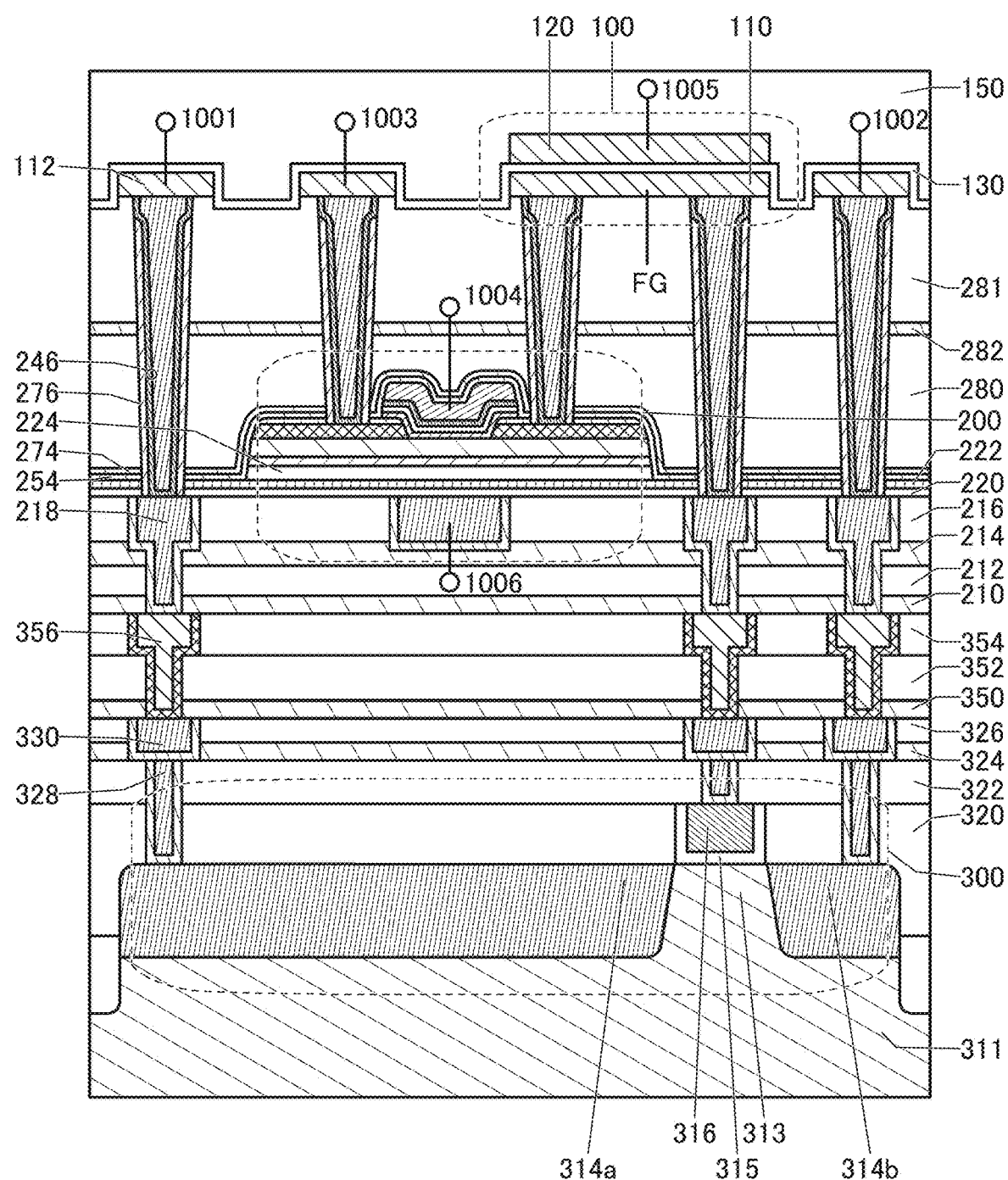
FIG. 15 A cross-sectional view illustrating a structure of a memory device of one embodiment of the present invention.

FIG. 15 illustrates an example of a semiconductor device (memory device) using a capacitor which is one embodiment of the present invention. In the semiconductor device of one embodiment of the present invention, the transistor 200 is provided above a transistor 300, and a capacitor 100 is provided above the transistor 300 and the transistor 200. The transistor 200 described in the above embodiment can be used as the transistor 200.

The transistor 200 is a transistor whose channel is formed in a semiconductor layer including an oxide semiconductor. Since the transistor 200 has a low off-state current, a memory device which is the transistor 200 can retain stored data for a long time. In other words, such a memory device does not require refresh operation or has an extremely low frequency of the refresh operation, which leads to a sufficient reduction in power consumption of the memory device.

In the semiconductor device illustrated in FIG. 15, a wiring 1001 is electrically connected to a source of the transistor 300, and a wiring 1002 is electrically connected to a drain of the transistor 300. A wiring 1003 is electrically connected to one of the source and the drain of the transistor 200. A wiring 1004 is electrically connected to a first gate of the transistor 200. A wiring 1006 is electrically connected to a second gate of the transistor 200. A gate of the transistor 300 and the other of the source and the drain of the transistor 200 are electrically connected to one electrode of the capacitor 100. A wiring 1005 is electrically connected to the other electrode of the capacitor 100.

The memory devices illustrated in FIG. 15 can form a memory cell array when arranged in a matrix.

<Transistor 300>

The transistor 300 is provided over a substrate 311 and includes a conductor 316 functioning as a gate electrode, an insulator 315 functioning as a gate insulator, a semiconductor region 313 formed of a part of the substrate 311, and a low-resistance region 314a and a low-resistance region 314b functioning as the source region and the drain region. The transistor 300 may be a p-channel type or an n-channel type.

In the transistor 300 illustrated in FIG. 15, the semiconductor region 313 (part of the substrate 311) in which a channel is formed has a projecting shape. Furthermore, the conductor 316 is provided to cover top and side surfaces of the semiconductor region 313 with the insulator 315 therebetween. Note that a material adjusting the work function may be used for the conductor 316. The transistor 300 having such a structure is also referred to as a FIN transistor because the projecting portion of the semiconductor substrate is utilized. An insulator functioning as a mask for forming the projecting portion may be included in contact with the top surface of the projecting portion. Although the case where the projecting portion is formed by processing part of the semiconductor substrate is described here, a semiconductor film having a projecting shape may be formed by processing an SOI substrate.

Note that the transistor 300 illustrated in FIG. 15 is an example and the structure is not limited thereto; an appropriate transistor is used in accordance with a circuit configuration or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

For example, a conductor 112 and the conductor 110 over the conductor 246 can be formed at the same time. Note that the conductor 112 functions as a plug or a wiring that is electrically connected to the capacitor 100, the transistor 200, or the transistor 300.

Although the conductor 112 and the conductor 110 having a single-layer structure are illustrated in FIG. 15, the structure is not limited thereto; a stacked-layer structure of two or more layers may be employed. For example, between a conductor having a barrier property and a conductor having high conductivity, a conductor which is highly adhesive to the conductor having a barrier property and the conductor having high conductivity may be formed.

For the insulator 130, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like is used, and a stacked layer or a single layer can be provided.

For example, for the insulator 130, a stacked-layer structure using a material with high dielectric strength such as silicon oxynitride and a high dielectric constant (high-k) material is preferably used. In the capacitor 100 having such a structure, a sufficient capacitance can be ensured owing to the high dielectric constant (high-k) insulator, and the dielectric strength can be increased owing to the insulator with high dielectric strength, so that the electrostatic breakdown of the capacitor 100 can be inhibited.

As the insulator of a high dielectric constant (high-k) material (a material having a high dielectric constant), gallium oxide, hafnium oxide, zirconium oxide, an oxide including aluminum and hafnium, an oxynitride including aluminum and hafnium, an oxide including silicon and hafnium, an oxynitride including silicon and hafnium, a nitride including silicon and hafnium, or the like can be given.

As the material having a high dielectric strength (a material having a low dielectric constant), silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

<Wiring Layers>

Wiring layers provided with an interlayer film, a wiring, a plug, and the like may be provided between the structure bodies. A plurality of wiring layers can be provided in accordance with the design. Here, a plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases and part of a conductor functions as a plug in other cases.

For example, an insulator 320, an insulator 322, an insulator 324, and an insulator 326 are stacked over the transistor 300 in this order as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring.

The insulator functioning as an interlayer film may function as a planarization film that covers projecting and depressed shapes thereunder. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 15, an insulator 350, an insulator 352, and an insulator 354 are stacked sequentially. Furthermore, a conductor 356 is formed in the insulator 350, the insulator 352, and the insulator 354. The conductor 356 functions as a plug or a wiring.

Similarly, a conductor (conductor 205) included in the transistor 200, and the like are embedded in the insulator 210, the insulator 212, the insulator 214, and the insulator 216. Note that the conductor 218 functions as a plug or a wiring that is electrically connected to the capacitor 100 or the transistor 300. In addition, an insulator 150 is provided over the conductor 120 and the insulator 130.

As an insulator that can be used as an interlayer film, an insulating oxide, an insulating nitride, an insulating oxynitride, an insulating nitride oxide, an insulating metal oxide, an insulating metal oxynitride, an insulating metal nitride oxide, or the like is given.

For example, when a material having a low dielectric constant is used for the insulator functioning as an interlayer film, the parasitic capacitance between wirings can be reduced. Accordingly, a material is preferably selected in accordance with the function of an insulator.

For example, the insulator 216, the insulator 212, the insulator 352, the insulator 354, or the like preferably includes an insulator having a low dielectric constant. For example, the insulator preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Because silicon oxide and silicon oxynitride have thermal stability, a combination of silicon oxide or silicon oxynitride with a resin allows the stacked-layer structure to be thermally stable and have a low dielectric constant. Examples of the resin include polyester, polyolefin, polyamide (e.g., nylon and aramid), polyimide, polycarbonate, and acrylic.

When the transistor using an oxide semiconductor is surrounded by an insulator having a function of inhibiting transmission of oxygen and impurities such as hydrogen, the electrical characteristics of the transistor can be stabilized. Thus, the insulator having a function of inhibiting transmission of oxygen and impurities such as hydrogen can be used for the insulator 210, the insulator 350, and the like.

The insulator having a function of inhibiting transmission of oxygen and impurities such as hydrogen can have, for example, a single-layer structure or a stacked-layer structure of an insulator including boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For the conductors that can be used for wirings or plugs, a material including one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Alternatively, a semiconductor having a high electric conductivity typified by polycrystalline silicon including an impurity element such as phosphorus, or silicide such as nickel silicide may be used.

For example, for the conductor 328, the conductor 330, the conductor 356, the conductor 218, the conductor 112, and the like, a single-layer structure or a stacked-layer structure using a conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<<Wirings or Plugs in Layer Provided with Oxide Semiconductor>>

In the case where an oxide semiconductor is used in the transistor 200, an insulator including an excess oxygen region is provided in the vicinity of the oxide semiconductor in some cases. In that case, an insulator having a barrier property is preferably provided between the insulator including the excess oxygen region and the conductor provided in the insulator including the excess oxygen region.

For example, in FIG. 15, the insulator 224 and the transistor 200 can be sealed with the insulator 220, the insulator 254, and the insulator 274 having barrier properties. The insulator 276 is in contact with part of the conductor 246 and the insulator 280, and can prevent impurities such as water or hydrogen or impurities such as water or hydrogen and the oxygen in the conductor 246.

That is, the insulator 276 can inhibit excess oxygen included in the insulator 280 from being absorbed by the conductor 246. In addition, the insulator 276 can inhibit diffusion of hydrogen, which is an impurity, into the transistor 200 through the conductor 246.

The insulator 276 is preferably formed using an insulating material having a function of inhibiting diffusion of impurities such as water or hydrogen and oxygen. For example, aluminum oxide, hafnium oxide, or the like is preferably used. Other than that, a metal oxide such as magnesium oxide, gallium oxide, germanium oxide, yttrium oxide, zirconium oxide, lanthanum oxide, neodymium oxide, or tantalum oxide, silicon nitride oxide, silicon nitride, or the like can be used, for example.

The above is the description of the structure example. With the use of the structure, a semiconductor device using a transistor including an oxide semiconductor can have a small variation in electrical characteristics and higher reliability. Alternatively, a transistor including an oxide semiconductor with a high on-state current can be provided. Alternatively, a transistor including an oxide semiconductor with low off-state current can be provided. Alternatively, a semiconductor device with low power consumption can be provided.

[Memory Device 2]

Figure 16:
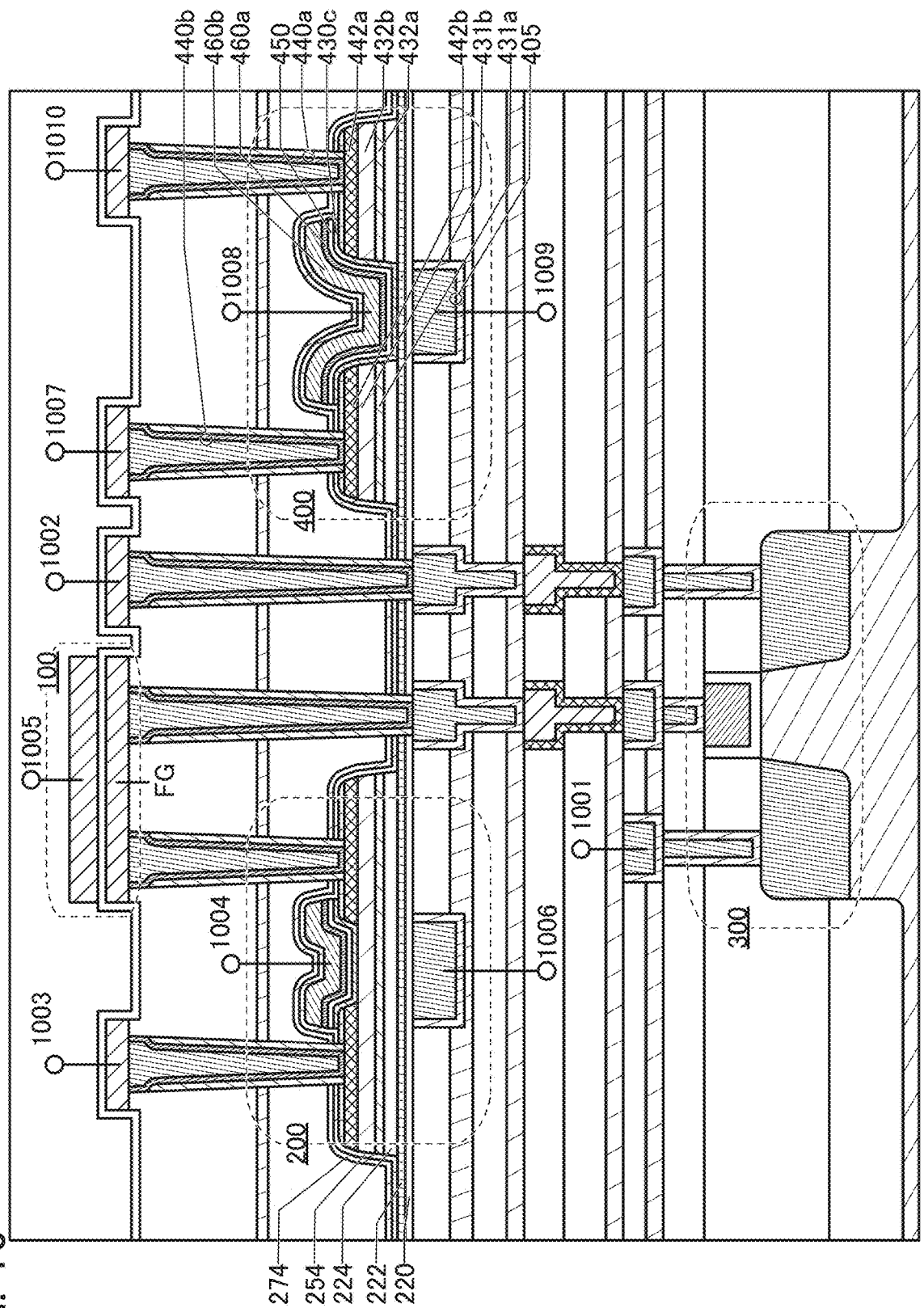
FIG. 16 A cross sectional view illustrating a structure of a memory device of one embodiment of the present invention.

FIG. 16 illustrates an example of a memory device using the semiconductor device which is one embodiment of the present invention. The memory device illustrated in FIG. 16 includes a transistor 400 in addition to the semiconductor device including the transistor 200, the transistor 300, and the capacitor 100 illustrated in FIG. 15.

The transistor 400 can change a second gate voltage of the transistor 200. For example, a first gate and a second gate of the transistor 400 are diode-connected to a source, and the source of the transistor 400 is connected to the second gate of the transistor 200. When a negative potential of the second gate of the transistor 200 is held in this structure, a first gate-source voltage and a second gate-source voltage of the transistor 400 are 0 V. In the transistor 400, a drain current when the second gate voltage and the first gate voltage are 0 V is extremely low; thus, the negative potential of the second gate of the transistor 200 can be held for a long time even without power supply to the transistor 200 and the transistor 400. Accordingly, the memory device including the transistor 200 and the transistor 400 can retain stored data for a long time.

In FIG. 16, the wiring 1001 is electrically connected to the source of the transistor 300, and the wiring 1002 is electrically connected to the drain of the transistor 300. The wiring 1003 is electrically connected to one of the source and the drain of the transistor 200, the wiring 1004 is electrically connected to the gate of the transistor 200, and the wiring 1006 is electrically connected to a back gate of the transistor 200. The gate of the transistor 300 and the other of the source and the drain of the transistor 200 are electrically connected to one electrode of the capacitor 100. The wiring 1005 is electrically connected to the other electrode of the capacitor 100. A wiring 1007 is electrically connected to the source of the transistor 400. A wiring 1008 is electrically connected to a gate of the transistor 400. A wiring 1009 is electrically connected to a back gate of the transistor 400. A wiring 1010 is electrically connected to the drain of the transistor 400. The wiring 1006, the wiring 1007, the wiring 1008, and the wiring 1009 are electrically connected to each other.

When the memory devices illustrated in FIG. 16 are arranged in a matrix like the memory devices illustrated in FIG. 15, a memory cell array can be formed. Note that one transistor 400 can change second gate voltages of a plurality of transistors 200. For this reason, the number of transistors 400 is preferably smaller than the number of transistors 200.

<Transistor 400>

The transistor 400 and the transistors 200 are formed in the same layer and thus can be fabricated in parallel. The transistor 400 includes a conductor 460 (a conductor 460a and a conductor 460b) functioning as a first gate electrode; a conductor 405 functioning as a second gate electrode; the insulator 220, the insulator 222, the insulator 224, and an insulator 450 functioning as a gate insulating layer; an oxide 430c including a channel formation region; a conductor 442a, an oxide 432b, and an oxide 432a, which functions as a drain; a conductor 442b, an oxide 431b, and an oxide 431a, which functions as a source; and a conductor 440 (a conductor 440a and a conductor 440b).

In the transistor 400, the conductor 405 is in the same layer as the conductor 205. The oxide 431a and the oxide 432a are in the same layer as the oxide 230a, and the oxide 431b and the oxide 432b are in the same layer as the oxide 230b. The conductor 442a and the conductor 442b are in the same layer as the conductor 242. The oxide 430c is in the same layer as the oxide 230c. The insulator 450 is in the same layer as the insulator 250. The conductor 460 is in the same layer as the conductor 260.

Note that the structure body in the same layer can be formed at the same time. For example, the oxide 430c can be formed by processing an oxide film to be the oxide 230c.

In the oxide 430c functioning as an active layer of the transistor 400, oxygen vacancies and impurities such as hydrogen or water are reduced, as in the oxide 230 or the like. Accordingly, the threshold voltage of the transistor 400 can be higher than 0 V, an off-state current can be reduced, and the drain current when the second gate voltage and the first gate voltage are 0 V can be extremely low.

<<Dicing Line>>

Here, a dicing line (referred to as a scribe line, a dividing line, or a cutting line in some cases) which is provided when a large-sized substrate is divided into semiconductor elements so that a plurality of semiconductor devices are each formed in a chip form is described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as illustrated in FIG. 16, it is preferable that a region in which the insulator 254 and the insulator 222 are in contact with each other be the dicing line. That is, an opening is provided in the insulator 224 in the vicinity of the region to be the dicing line that is provided in an outer edge of the transistor 400 and the memory cell including a plurality of transistors 200. The insulator 254 is provided to cover the side surface of the insulator 224.

That is, in the opening provided in the insulator 224, the insulator 222 is in contact with the insulator 254. For example, the insulator 222 and the insulator 254 may be formed using the same material and the same method. When the insulator 222 and the insulator 254 are formed using the same material and the same method, the adhesion therebetween can be increased. For example, aluminum oxide is preferably used.

With such a structure, the insulator 224, the transistor 200 and the transistor 400 can be enclosed with the insulator 222, the insulator 254, and the insulator 274. Since the insulator 222, the insulator 254, and the insulator 274 have a function of inhibiting diffusion of oxygen, hydrogen, and water even when the substrate is divided into circuit regions each of which is provided with the semiconductor elements in this embodiment to form a plurality of chips, the entry and diffusion of impurities such as hydrogen or water from the direction of a side surface of the divided substrate to the transistor 200 or the transistor 400 can be inhibited.

In the structure, excess oxygen in the insulator 224 can be inhibited from diffusing into the outside of the insulator 274 and the insulator 222. Accordingly, excess oxygen in the insulator 224 is efficiently supplied to the oxide where the channel is formed in the transistor 200 or the transistor 400. The oxygen can reduce oxygen vacancies in the oxide where the channel is formed in the transistor 200 or the transistor 400. Thus, the oxide where the channel is formed in the transistor 200 or the transistor 400 can be an oxide semiconductor with a low density of defect states and stable characteristics. That is, the transistor 200 or the transistor 400 can have a small variation in the electrical characteristics and higher reliability.

This embodiment can be implemented in an appropriate combination with the structures described in the other embodiments, examples, and the like.

Embodiment 4

In this embodiment, a memory device of one embodiment of the present invention including a transistor in which an oxide is used for a semiconductor (hereinafter referred to as an OS transistor in some cases) and a capacitor (hereinafter, such a memory device is also referred to as an OS memory device in some cases), will be described with reference to FIG. 17 and FIG. 18. The OS memory device includes at least a capacitor and an OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 17A:
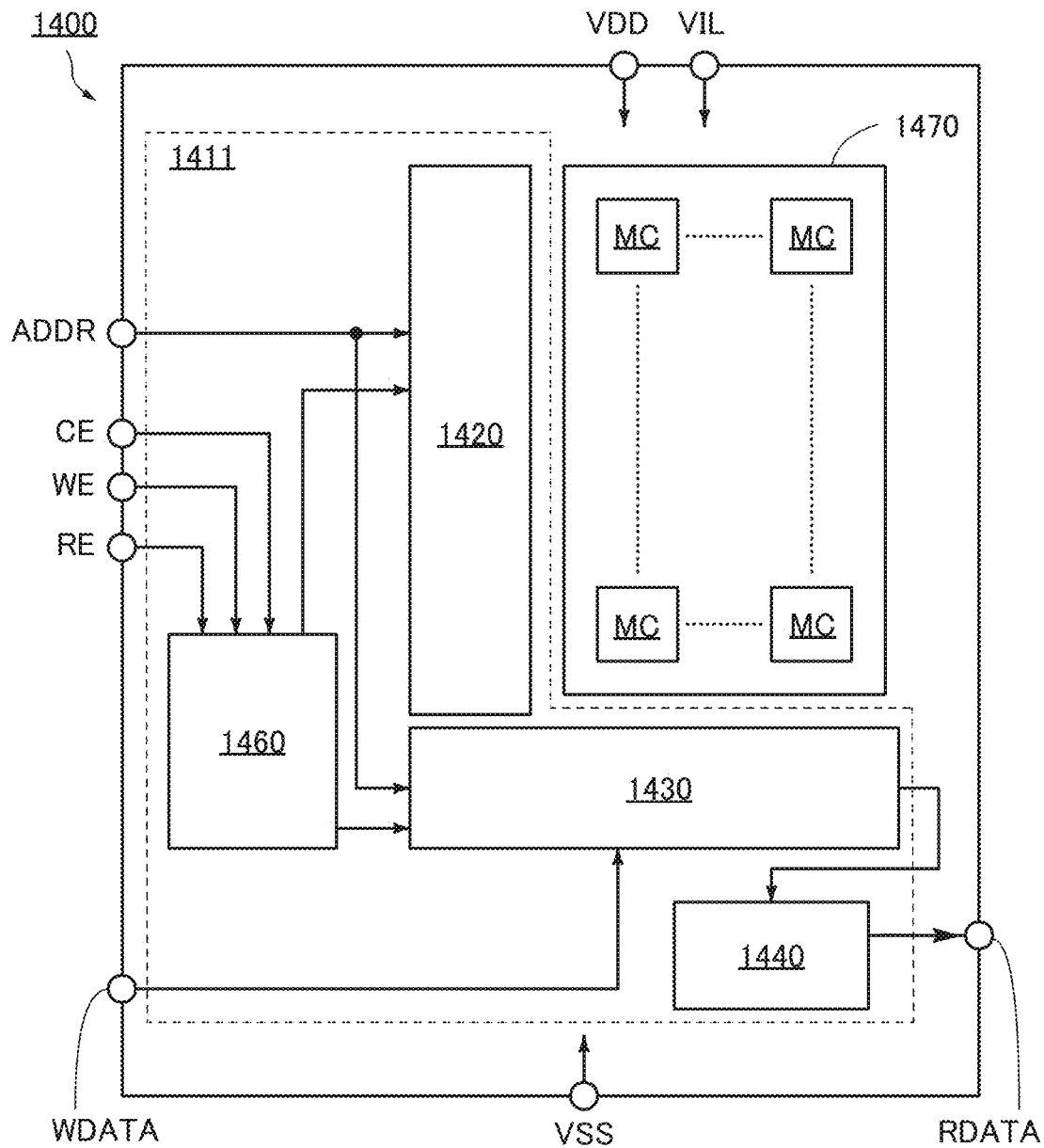
FIGS. 17A-17B Block diagrams illustrating a structure example of a memory device of one embodiment of the present invention.

FIG. 17(A) illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and will be described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and WDATA is input to the write circuit.

The control logic circuit 1460 processes the input signals (CE, WE, and RE) input from the outside, and generates control signals for the row decoder and the column decoder. CE is a chip enable signal, WE is a write enable signal, and RE is a read enable signal. Signals processed by the control logic circuit 1460 are not limited thereto, and other control signals may be input as necessary.

The memory cell array 1470 includes a plurality of memory cells MC and a plurality of wirings arranged in a matrix. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 17B:
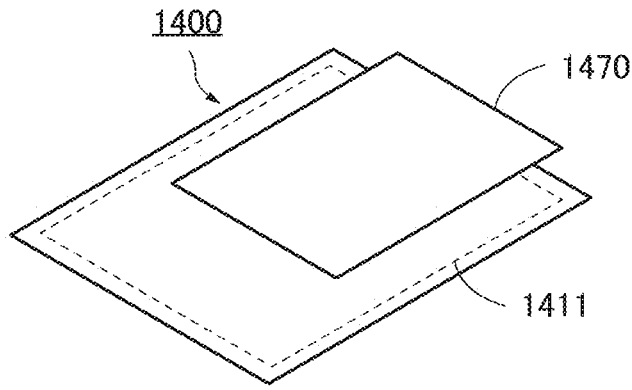

Note that FIG. 17(A) illustrates an example in which the peripheral circuit 1411 and the memory cell array 1470 are formed on the same plane; however, this embodiment is not limited thereto. For example, as illustrated in FIG. 17(B), the memory cell array 1470 may be provided over part of the peripheral circuit 1411 so that they overlap with each other. For example, the sense amplifier may be provided below the memory cell array 1470 so that they overlap with each other.

FIG. 18 illustrates structure examples of a memory cell applicable to the memory cell MC.

[DOSRAM]

Figure 18A:
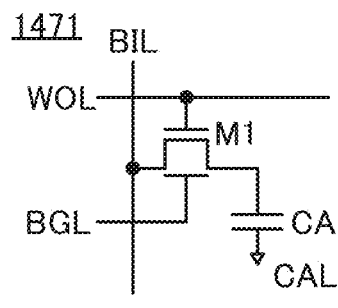
FIGS. 18A-18H Circuit diagrams illustrating structure examples of a memory device of one embodiment of the present invention.
Figure 18B:
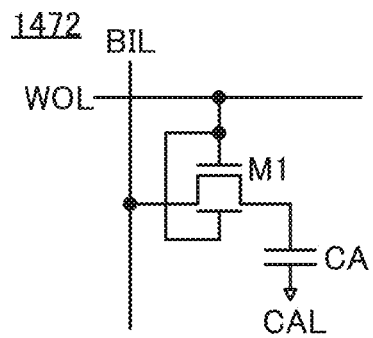
Figure 18C:
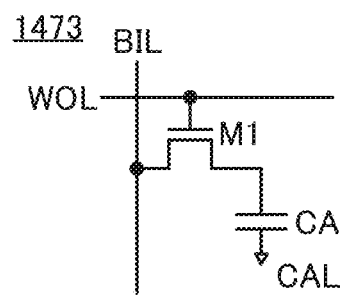
Figure 18D:
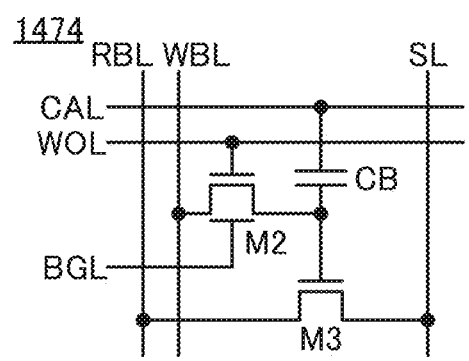
Figure 18E:
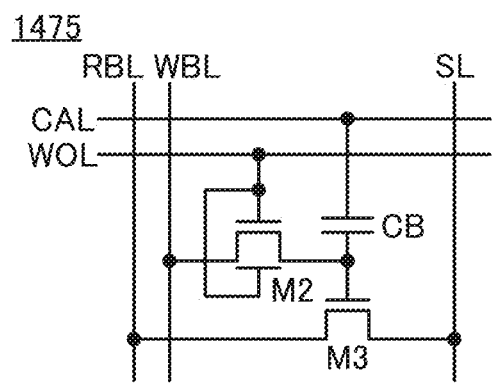
Figure 18F:
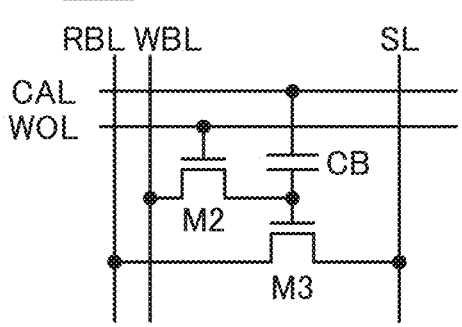
Figure 18G:
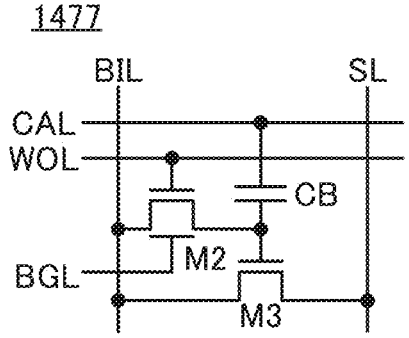

FIGS. 18(A) to 18(C) each illustrate a circuit structure example of a memory cell of a DRAM. In this specification and the like, a DRAM using a memory cell including one OS transistor and one capacitor is referred to as DOSRAM (Dynamic Oxide Semiconductor Random Access Memory) in some cases. A memory cell 1471 illustrated in FIG. 18(A) includes a transistor M1 and a capacitor CA. Note that the transistor M1 includes a gate (also referred to as a front gate in some cases) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. Applying a given potential to the wiring BGL can increase or decrease the threshold voltage of the transistor M1.

The memory cell MC is not limited to the memory cell 1471, and the circuit structure can be changed. For example, as in a memory cell 1472 illustrated in FIG. 18(B), the back gate of the transistor M1 may be connected not to the wiring BGL but to the wiring WOL in the memory cell MC. Alternatively, for example, the memory cell MC may be a memory cell including a single-gate transistor, that is, the transistor M1 not including a back gate, as in a memory cell 1473 illustrated in FIG. 18(C).

In the case where the semiconductor device described in any of the above embodiments is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long time, and thus the frequency of the refresh operation for the memory cell can be decreased. In addition, refresh operation of the memory cell can be unnecessary. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. Thus, the bit line capacitance can be small, and the storage capacitance of the memory cell can be reduced.

[NOSRAM]

FIGS. 18(D) to 18(H) each illustrate a circuit structure example of a gain-cell memory cell including two transistors and one capacitor. A memory cell 1474 illustrated in FIG. 18(D) includes a transistor M2, a transistor M3, and a capacitor CB. Note that the transistor M2 includes a front gate (simply referred to as a gate in some cases) and a back gate. In this specification and the like, a memory device including a gain-cell memory cell using an OS transistor as the transistor M2 is referred to as NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. A gate of the transistor M2 is connected to the wiring WOL. A back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing, data retaining, and data reading, a low-level potential is preferably applied to the wiring CAL. The wiring BGL functions as a wiring for applying a potential to the back gate of the transistor M2. By application of a given potential to the wiring BGL, the threshold voltage of the transistor M2 can be increased or decreased.

The memory cell MC is not limited to the memory cell 1474, and the circuit structure can be changed as appropriate. For example, as in a memory cell 1475 illustrated in FIG. 18(E), the back gate of the transistor M2 may be connected not to the wiring BGL but to the wiring WOL in the memory cell MC. Alternatively, for example, the memory cell MC may be a memory cell including as single-gate transistor, that is, the transistor M2 not including a back gate, as in a memory cell 1476 illustrated in FIG. 18(F). Alternatively, for example, in the memory cell MC, the wiring WBL and the wiring RBL may be combined into one wiring BIL, as in a memory cell 1477 illustrated in FIG. 18(G).

In the case where the semiconductor device described in any of the above embodiments is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. That is, with the use of the transistor M1, written data can be retained for a long time, and thus the frequency of the refresh operation for the memory cell can be decreased. In addition, refresh operation of the memory cell can be unnecessary. In addition, since the transistor M2 has an extremely low leakage current, multi-level data or analog data can be retained in the memory cell 1474. The same applies to the memory cells 1475 to 1477.

Note that the transistor M3 may be a transistor containing silicon in a channel formation region (hereinafter, also referred to as a Si transistor in some cases). The conductivity type of the Si transistor may be of either an n-channel type or a p-channel type. The Si transistor has higher field-effect mobility than the OS transistor in some cases. Therefore, a Si transistor may be used as the transistor M3 functioning as a reading transistor. Furthermore, the transistor M2 can be provided to be stacked over the transistor M3 when a Si transistor is used as the transistor M3; therefore, the area occupied by the memory cell can be reduced, leading to high integration of the memory device.

Alternatively, the transistor M3 may be an OS transistor. When an OS transistor is used as each of the transistors M2 and M3, the circuit of the memory cell array 1470 can be formed using only n-channel transistors.

Figure 18H:
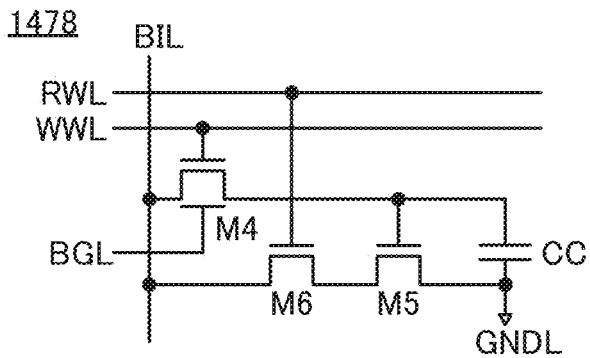

FIG. 18(H) illustrates an example of a gain-cell memory cell including three transistors and one capacitor. A memory cell 1478 illustrated in FIG. 18(H) includes transistors M4 to M6 and a capacitor CC. The capacitor CC is provided as appropriate. The memory cell 1478 is electrically connected to the wirings BIL, RWL, WWL, BGL, and GNDL. The wiring GNDL is a wiring for supplying a low-level potential. Note that the memory cell 1478 may be electrically connected to the wirings RBL and WBL instead of the wiring BIL.

The transistor M4 is an OS transistor including a back gate that is electrically connected to the wiring BGL. Note that the back gate and the gate of the transistor M4 may be electrically connected to each other. Alternatively, the transistor M4 does not necessarily include the back gate.

Note that each of the transistors M5 and M6 may be an n-channel Si transistor or a p-channel Si transistor. Alternatively, the transistors M4 to M6 may be OS transistors, in which case the circuit of the memory cell array 1470 can be formed using only n-channel transistors.

In the case where the semiconductor device described in any of the above embodiments is used in the memory cell 1478, the transistor 200 can be used as the transistor M4, the transistor 300 can be used as the transistors M5 and M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. Positions and functions of these circuits, wirings connected to the circuits, circuit elements, and the like can be changed, deleted, or added as needed.

The structure described in this embodiment can be used in an appropriate combination with the structures described in the other embodiments, examples, and the like.

Embodiment 5

In this embodiment, an example of a chip 1200 on which the semiconductor device of the present invention is mounted will be described with reference to FIG. 19. A plurality of circuits (systems) are mounted on the chip 1200. The technique for integrating a plurality of circuits (systems) on one chip as described above is referred to as system on chip (SoC) in some cases.

Figure 19A:
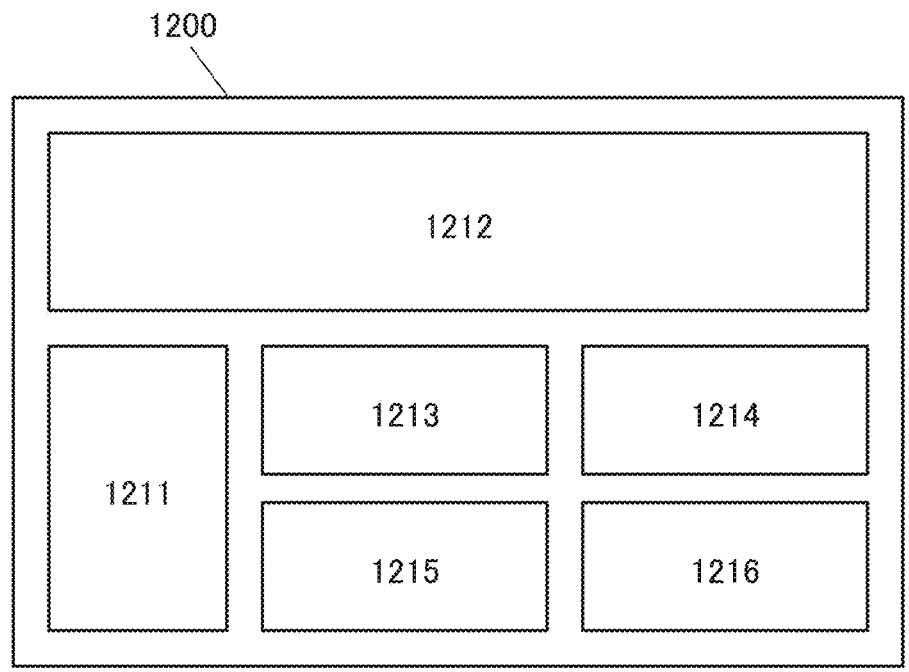
FIGS. 19A-19B A block diagram and a schematic view of a semiconductor device of one embodiment of the present invention.

As illustrated in FIG. 19(A), the chip 1200 includes a CPU (Central Processing Unit) 1211, a GPU (Graphics Processing Unit) 1212, one or more of analog arithmetic units 1213, one or more of memory controllers 1214, one or more of interfaces 1215, one or more of network circuits 1216, and the like.

Figure 19B:
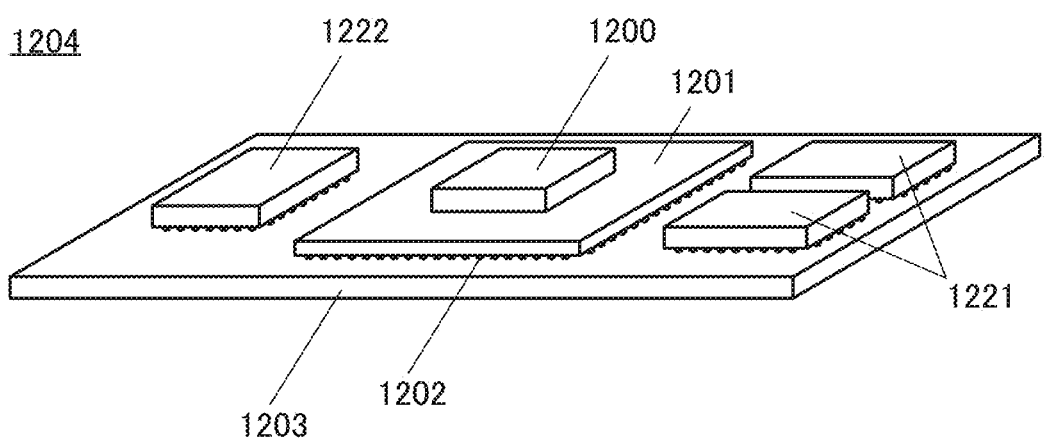

A bump (not illustrated) is provided on the chip 1200, and as illustrated in FIG. 19(B), the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for connection with an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). Furthermore, the network circuit 1216 may include a circuit for network security.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable game console. Furthermore, the product-sum operation circuit using the GPU 1212 can implement an arithmetic operation such as a deep neural network (DNN), a convolutional neural network (CNN), a recurrent neural network (RNN), an autoencorder, a deep Boltzmann machine (DBM), or a deep belief network (DBN); thus, the chip 1200 can be used as an AI chip or the GPU module 1204 can be used as an AI system module.

The structure described in this embodiment can be used in an appropriate combination with the structures described in the other embodiments and the example.

Embodiment 6

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 20 schematically illustrates some structure examples of removable memory devices. The semiconductor device described in the above embodiment is processed into a packaged memory chip and used in a variety of storage devices and removable memories, for example.

Figure 20A:
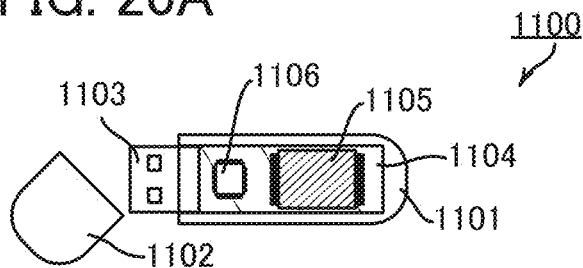
FIGS. 20A-20E Schematic views of a memory device of one embodiment of the present invention.

FIG. 20(A) is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like on the substrate 1104.

Figure 20B:
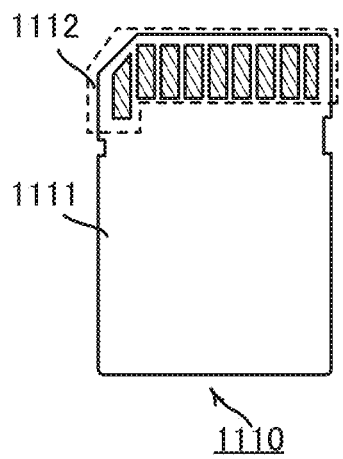
Figure 20C:
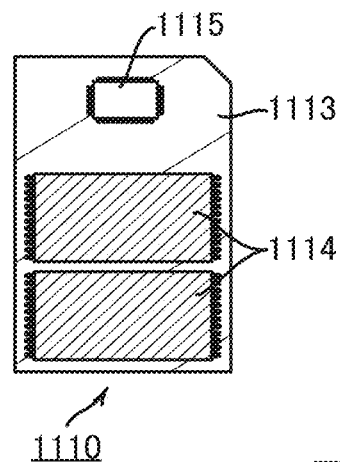

FIG. 20(B) is a schematic external view of an SD card, and FIG. 20(C) is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like on the substrate 1113.

Figure 20D:
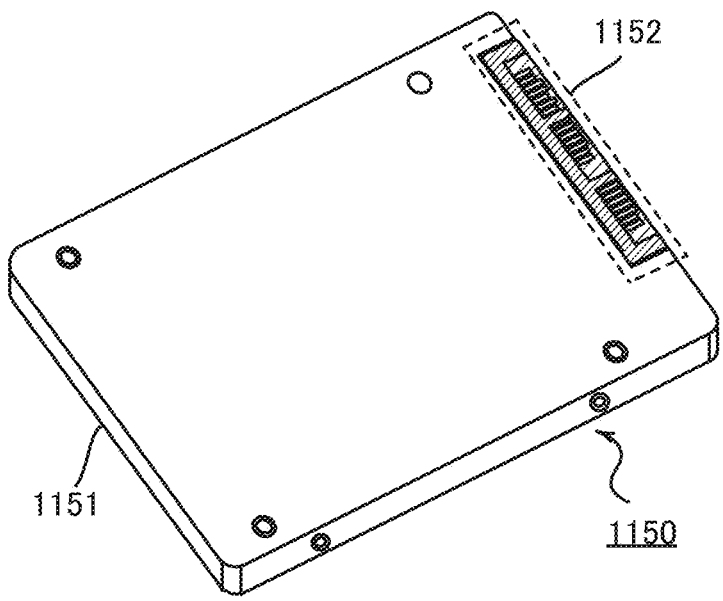
Figure 20E:
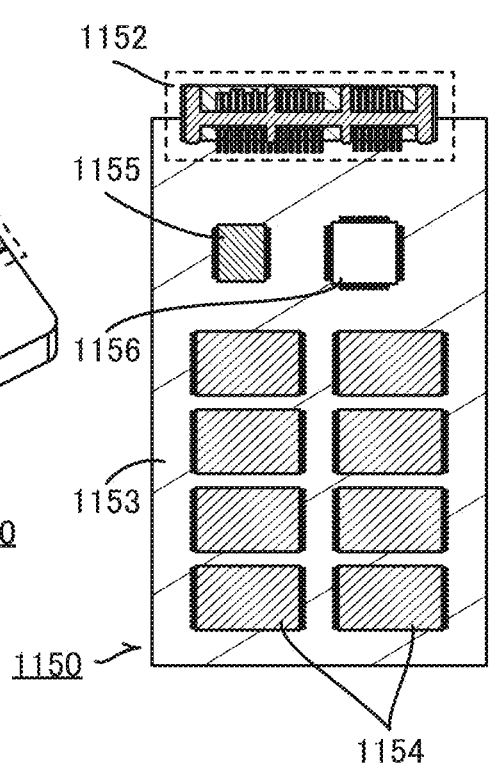

FIG. 20(D) is a schematic external view of an SSD, and FIG. 20(E) is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The semiconductor device described in the above embodiment can be incorporated in the memory chip 1154 or the like on the substrate 1153.

This embodiment can be implemented in an appropriate combination with the structures described in the other embodiments, examples, and the like.

Embodiment 7

The semiconductor device of one embodiment of the present invention can be used for a processor such as a CPU and a GPU or a chip. FIG. 21 illustrates specific examples of electronic devices including a processor such as a CPU and a GPU or a chip of one embodiment of the present invention.

<Electronic Device and System>

The GPU or the chip of one embodiment of the present invention can be mounted on a variety of electronic devices. Examples of electronic devices include a digital camera, a digital video camera, a digital photo frame, a mobile phone, a portable game machine, a portable information terminal, and an audio reproducing device in addition to electronic devices provided with a relatively large screen, such as a television device, a desktop or laptop personal computer, a monitor for a computer and the like, digital signage, and a large game machine like a pachinko machine. In addition, when the integrated circuit or the chip of one embodiment of the present invention is provided in the electronic device, the electronic device can include artificial intelligence.

The electronic device of one embodiment of the present invention may include an antenna. When a signal is received by the antenna, a video, data, or the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, a position, speed, acceleration, angular velocity, rotational frequency, distance, light, liquid, magnetism, temperature, a chemical substance, sound, time, hardness, an electric field, current, voltage, electric power, radioactive rays, a flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 21 illustrates examples of the electronic device.

[Mobile Phone]

FIG. 21(A) illustrates a mobile phone (smartphone) which is a type of an information terminal. An information terminal 5500 includes a housing 5510 and a display portion 5511, and as input interfaces, a touch panel is provided in the display portion 5511 and a button is provided in the housing 5510.

The information terminal 5500 can execute an application utilizing artificial intelligence with the use of the chip of one embodiment of the present invention. Examples of the application utilizing artificial intelligence include an application for recognizing a conversation and displaying the contents of the conversation on the display portion 5511; an application for recognizing letters, figures, and the like input to the touch panel of the display portion 5511 by a user and displaying them on the display portion 5511; and an application for performing biometric authentication using fingerprints, voice prints, or the like.

[Information Terminal 1]

FIG. 21(B) illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with the use of the chip of one embodiment of the present invention as the information terminal 5500 described above. Examples of the application utilizing artificial intelligence include design-support software, text correction software, and software for automatic menu generation. Furthermore, with the use of the desktop information terminal 5300, novel artificial intelligence can be developed.

Note that in the above description, although the smartphone and the desktop information terminal are respectively illustrated in FIGS. 21(A) and 21(B) as examples of the electronic device, the chip of one embodiment of the present invention can also be applied to an information terminal other than the smartphone and the desktop information terminal. Examples of an information terminal other than a smartphone and a desktop information terminal include a PDA (Personal Digital Assistant), a laptop information terminal, and a workstation.

[Electrical Appliance]

FIG. 21(C) illustrates an electric refrigerator-freezer 5800 which is an example of an electrical appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting the temperature to be appropriate for the foods stored in the electric refrigerator-freezer 5800, and the like.

Although the electric refrigerator-freezer is described as an electrical appliance in the example, other examples of the electrical appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

FIG. 21(D) illustrates a portable game machine 5200 which is an example of a game machine. The portable game machine includes a housing 5201, a display portion 5202, a button 5203, and the like.

With the use of the GPU or the chip of one embodiment of the present invention in the portable game machine 5200, the portable game machine 5200 with low power consumption can be obtained. Furthermore, heat generation from a circuit can be reduced owing to low power consumption; thus, the influence of heat generation on the circuit itself, the peripheral circuit, and the module can be reduced.

Moreover, with the use of the GPU or the chip of one embodiment of the present invention in the portable game machine 5200, the portable game machine 5200 including artificial intelligence can be obtained.

Basically, the progress of a game, the actions and words of game characters, and a phenomenon or the like that occurs in the game are determined by a program of the game; however, the use of artificial intelligence in the portable game machine 5200 enables expressions not limited by the program of the game. For example, questions posed by the player, the progress of the game, time, and the actions and words of game characters can be changed.

When a game requiring a plurality of players is played on the portable game machine 5200, the artificial intelligence can create a virtual game player; thus, the game can be played alone with the game player created by the artificial intelligence as an opponent.

Although the portable game machine is illustrated in FIG. 21(D) as an example of a game machine, the game machine using the GPU or the chip of one embodiment of the present invention is not limited thereto. Examples of the game machine using the GPU or the chip of one embodiment of the present invention include a home video game machine, an arcade game machine installed in entertainment facilities (a game center, an amusement park, or the like), a throwing machine for batting practice installed in sports facilities, and the like.

[Moving Vehicle]

The GPU or the chip of one embodiment of the present invention can be used in an automobile, which is a moving vehicle, and around a driver's seat in the automobile.

FIG. 21(E1) illustrates an automobile 5700 which is an example of a moving vehicle, and FIG. 21(E2) illustrates the periphery of a windshield inside the automobile. FIG. 21(E2) illustrates a display panel 5701, a display panel 5702, and a display panel 5703 that are attached to a dashboard and a display panel 5704 that is attached to a pillar.

The display panel 5701 to the display panel 5703 can display a variety of kinds of information by displaying a speedometer, a tachometer, a mileage, a fuel meter, a gearshift indicator, air-condition setting, and the like. The content, layout, or the like of the display on the display panels can be changed appropriately to suit the user's preferences, so that the design can be improved. The display panel 5701 to the display panel 5703 can also be used as lighting devices.

The display panel 5704 displays an image taken by an imaging device (not illustrated) provided for the automobile 5700, whereby the view obstructed by the pillar (blind areas) can be complemented. That is, display of an image taken by an imaging device provided on the outside of the automobile 5700 can fill in blind areas and improve safety. In addition, display of an image that complements the area that cannot be seen makes it possible to confirm safety more naturally and comfortably. The display panel 5704 can also be used as a lighting device.

Because the GPU or the chip of one embodiment of the present invention can be used as a component of artificial intelligence, the chip can be used in an automatic driving system of the automobile 5700, for example. The chip can also be used for a system for navigation, risk prediction, or the like. The display panel 5701 to the display panel 5704 may display information regarding navigation, risk prediction, and the like.

Although an automobile is described above as an example of a moving vehicle, moving vehicles are not limited to an automobile. Examples of a moving vehicle include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Broadcasting System]

The GPU or the chip of one embodiment of the present invention can be used in a broadcasting system.

FIG. 21(F) schematically illustrates data transmission in a broadcasting system. Specifically, FIG. 21(F) illustrates a path in which a radio wave (a broadcasting signal) transmitted from a broadcast station 5680 reaches a television receiver (TV) 5600 of each household. The TV 5600 includes a receiving device (not illustrated), and the broadcast signal received by an antenna 5650 is transmitted to the TV 5600 through the receiving device.

Although an UHF (Ultra High Frequency) antenna is illustrated as the antenna 5650 in FIG. 21(F), a BS•110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 21(F) and may be satellite broadcasting using an artificial satellite, data broadcasting using an optical line, or the like.

The above-described broadcasting system may be a broadcasting system utilizing artificial intelligence by including the chip of one embodiment of the present invention. When the broadcast data is transmitted from the broadcast station 5680 to the TV 5600 of each household, the broadcast data is compressed by an encoder. The antenna 5650 receives the compressed broadcast data, and then the broadcast data is decompressed by a decoder of the receiving device in the TV 5600. Utilizing the artificial intelligence enables, for example, recognition of a display pattern included in a displayed image in motion compensation prediction, which is one of the compressing methods for the encoder. In addition, in-frame prediction or the like can also be performed utilizing the artificial intelligence. Furthermore, for example, when the broadcast data with low resolution is received and the broadcast data is displayed on the TV 5600 with high resolution, image interpolation processing such as upconversion can be performed in the broadcast data decompression by the decoder.

The above-described broadcasting system utilizing artificial intelligence is suitable for ultra-high definition television (UHDTV: 4K and 8K) broadcasting, which needs a large amount of broadcast data.

As the application of artificial intelligence in the TV 5600, a recording device with artificial intelligence may be provided in the TV 5600, for example. With such a structure, the artificial intelligence can learn the user's preference, so that TV programs that suit the user's preference can be recorded automatically in the recording device.

The electronic device and the functions of the electronic device, the application example of the artificial intelligence and its effects, and the like described in this embodiment can be combined as appropriate with the description of another electronic device.

This embodiment can be implemented in an appropriate combination with any of the structures described in the other embodiments, examples, and the like.

EXAMPLE

In this example, a semiconductor device including the transistor 200 illustrated in FIG. 2, which is one embodiment of the present invention, was fabricated as Sample A. The electrical characteristics of Sample A that was fabricated were measured. Specifically, the Id-Vg characteristics of three transistors (a transistor 1A to a transistor 3A) among the plurality of transistors included in Sample A were measured. Note that the channel length of the transistor 1A to the transistor 3A was 65 nm and the channel width was 62 nm.

After the electrical characteristics were measured, the transistor 1A to the transistor 3A were subjected to thinning treatment to evaluate the crystallinity of the oxide contained in the transistor 1A to the transistor 3A.

<Method for Manufacturing Transistor Included in Sample A>

Methods for fabricating the transistors included in Sample A will be described below.

A stacked-layer structure including a tantalum nitride film, a titanium nitride film, a tungsten film, a titanium nitride film, and a tungsten film was used as the conductor 205. A silicon oxynitride film, a hafnium oxide film, and a silicon oxynitride film were deposited as the insulator 220, the insulator 222, and the insulator 224 that function as a second gate insulator, respectively.

As a first oxide to be the oxide 230a, an In—Ga—Zn oxide was deposited by a sputtering method. The first oxide was deposited under the following conditions: an In—Ga—Zn oxide target with In:Ga:Zn=1:3:4 [atomic ratio] was used, the oxygen gas flow rate was 45 sccm, the pressure was 0.7 Pa, and the substrate temperature was 200° C.

Subsequently, as a second oxide to be the oxide 230b, an In—Ga—Zn oxide was deposited over the first oxide by a sputtering method. The second oxide was deposited under the following conditions: an In—Ga—Zn oxide target with In:Ga:Zn=4:2:4.1 [atomic ratio] was used, the argon gas flow rate was 30 sccm, the oxygen gas flow rate was 15 sccm, the pressure was 0.7 Pa, and the substrate temperature was 200° C. Note that the first oxide and the second oxide were successively deposited.

Next, heat treatment was performed. As the heat treatment, treatment was performed at 400° C. in an atmosphere containing nitrogen for one hour, and subsequently treatment was performed at 400° C. in an atmosphere containing oxygen for one hour.

Next, a tantalum nitride film was formed as a conductor to be the conductor 242 over the second oxide, and an aluminum oxide film serving as a barrier film was formed over the conductor to be the conductor 242. After that, the aluminum oxide film, the tantalum nitride film, the second oxide, and the first oxide were processed to form a barrier film, a conductor 242, an oxide 230b, and an oxide 230a.

Next, in a vacuum atmosphere, a heat treatment at a temperature of 200° C. for 5 minutes was performed, and then an In—Ga—Zn oxide was deposited as the third oxide film to be the oxide 230c by a sputtering method using an In—Ga—Zn oxide target with In:Ga:Zn=4:2:4.1 [atomic ratio].

Next, a silicon oxynitride film was deposited as the insulator to be the insulator 250.

Next, a titanium nitride film was deposited over the insulator to be the insulator 250 and the conductive film to be the conductor 260a. Then, a tungsten film was deposited as the conductive film to be the conductor 260b. Note that the titanium nitride film and the tungsten film were successively formed. After that, the tungsten film, the titanium nitride film, the silicon oxynitride film, and the third oxide were processed to form the conductor 260b, the conductor 260a, the insulator 250, and the oxide 230c.

Next, an aluminum oxide film was formed as the insulator 254, and an aluminum oxide film was formed as the insulator 274.

Through the above process, the transistor included in Sample A was fabricated.

<Electrical Characteristics of Transistors>

Next, Id-Vg characteristics of the transistor 1A to the transistor 3A were measured as electrical characteristics of Sample A.

In the measurement of the Id-Vg characteristics, a change in a current between the conductor 242a functioning as a source electrode and the conductor 242b functioning as a drain electrode (hereinafter, also referred to as a drain current (Id)) when a potential applied to the conductor 260 functioning as a first gate electrode of the transistor (hereinafter, also referred to as a gate potential (Vg)) is changed from a first value to a second value is measured.

Here, a change in a drain current (Id) when a voltage (hereinafter, also referred to as a drain voltage) that was a difference between a potential applied to the conductor 242a (hereinafter, also referred to as a source potential Vs) and a potential applied to the conductor 242b (hereinafter, also referred to as a drain potential Vd) was set to +0.1 V or +1.2 V and a voltage (hereinafter, also referred to as a gate voltage) that was a difference between the source potential and the gate potential was changed from −4.0 V to +4.0 V was measured.

Note that in this measurement, the potential of the conductor 205 (hereinafter, also referred to as a back gate potential (Vbg)) that functions as a second gate electrode (back gate electrode) was set to 0.00 V.

Figure 22:
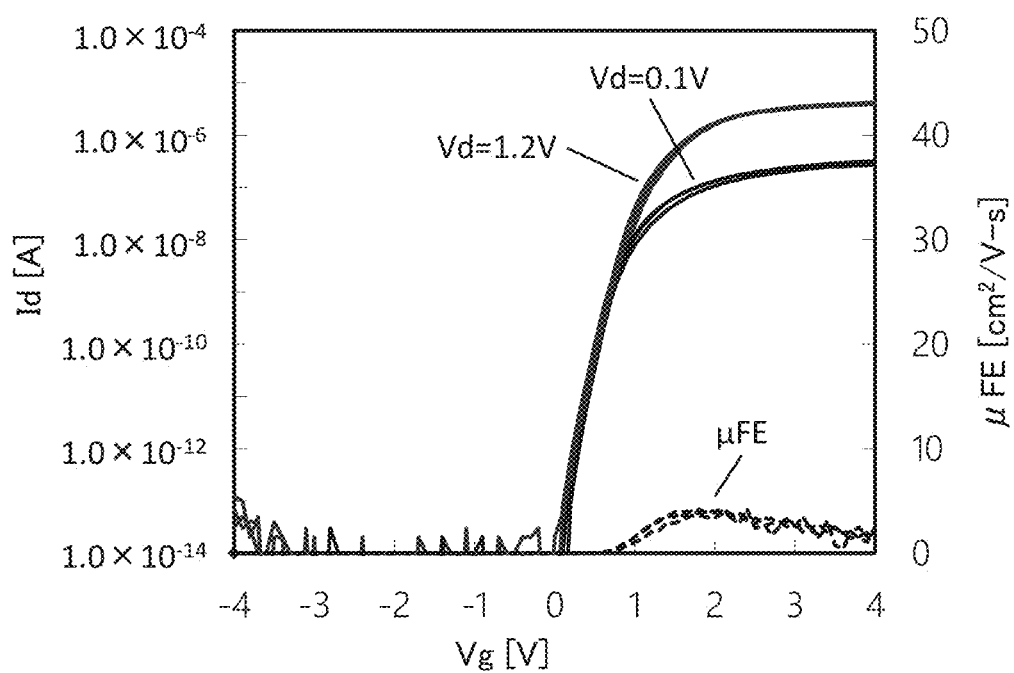
FIG. 22 A graph showing electrical characteristics of a sample of Example.

FIG. 22 shows Id-Vg characteristics of the transistor 1A to the transistor 3A. Note that FIG. 22 shows Id-Vg characteristics denoted by a solid line, and field-effect mobility (μFE) which was calculated from the channel length and the channel width of the transistors and the thickness and the dielectric constant of the gate insulators and denoted by a dashed line. In FIG. 22, the horizontal axis represents Vg, the left vertical axis represents Id, and the right vertical axis represents μFE.

FIG. 22 shows that variations in transistor characteristics (Id-Vg and μFE) of the transistor 1A to the transistor 3A are small.

<Image Analysis of Transmission Electron Microscope (TEM) Image>

In this section, analysis results of the oxides included in the transistor 1A to the transistor 3A with a high-angle annular dark field scanning transmission electron microscopy (HAADF-STEM) are described.

The results of image analysis of plan-view TEM images are described. The plan-view TEM images were observed with a spherical aberration corrector function. Note that the plan-view TEM images were obtained using an atomic resolution analytical electron microscope JEM-ARM200F manufactured by JEOL Ltd. under the conditions of irradiation with an electron beam with an acceleration voltage of 200 kV.

Image processing and image analyzing methods are described. First, as image processing, the plan-view TEM image was subjected to fast Fourier transform (FFT), so that an FFT image was obtained. Then, the obtained FFT image was subjected to mask processing except for a range from 2.8 nm$^{-1}$ to 5.0 nm$^{-1}$. After that, the FFT image subjected to mask processing was subjected to inverse fast Fourier transform (IFFT) to obtain an FFT filtering image.

To conduct the image analysis, first, lattice points were extracted from the FFT filtering image. The extraction of lattice points was performed in the following manner. First, noise in the FFT filtering image was removed. To remove the noise, the luminance of a region within a 0.05-nm radius was smoothed using the following formula.

[Formula 1]

$$S\_Int(x, y) = \sum_{r \leq 0.05} \frac{Int(x', y')}{r} \quad (1)$$

Here, S_Int(x,y) represents the smoothed luminance at the coordinates (x,y), r represents the distance between the coordinates (x,y) and the coordinates (x',y'), and Int(x',y') represents the luminance at the coordinates (x',y'). In the calculation, r is regarded as 1 when it is 0.

Then, a search for lattice points was conducted. Here, a coordinate whose luminance is the highest among all the coordinates in a radius of 0.22 nm was regarded as a lattice point. Within a 0.22-nm radius, detection errors of lattice points due to noise can be less frequent. Note that lattice points are a certain distance away from each other in the TEM image; thus, two or more lattice points are unlikely to be observed within a 0.22-nm radius.

First, a candidate lattice point was extracted. Subsequently, coordinates with the highest luminance within a 0.22-nm radius from the extracted candidate lattice point were extracted to redetermine a candidate lattice point. The extraction of a candidate lattice point was repeated in this manner until no new candidate lattice point appeared; the coordinates at that point were determined as lattice points. Similarly, determination of another lattice point was performed at a position 0.22 nm or more away from the determined lattice point; thus, lattice points were determined in the entire region. The determined lattice points are collectively called a lattice point group.

Next, a method for deriving an orientation of a hexagonal lattice from the extracted lattice point group is described with reference to schematic diagrams in FIGS. 23(A) to 23(C) and a flow chart in FIG. 23(D).

Figure 23A:
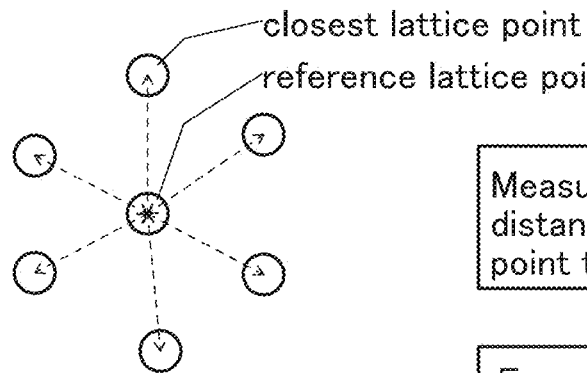
FIGS. 23A-23D Views showing a method for deriving a rotation angle of a hexagon.
Figure 23B:
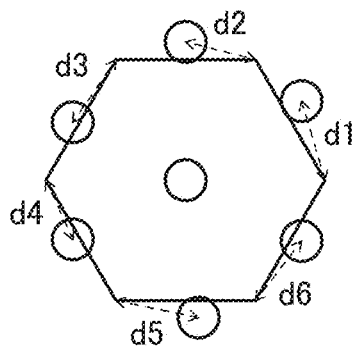
Figure 23C:
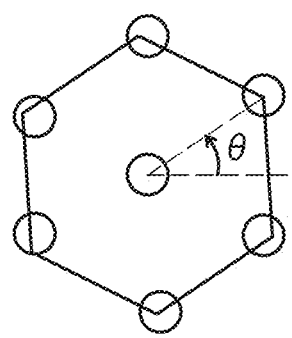
Figure 23D:
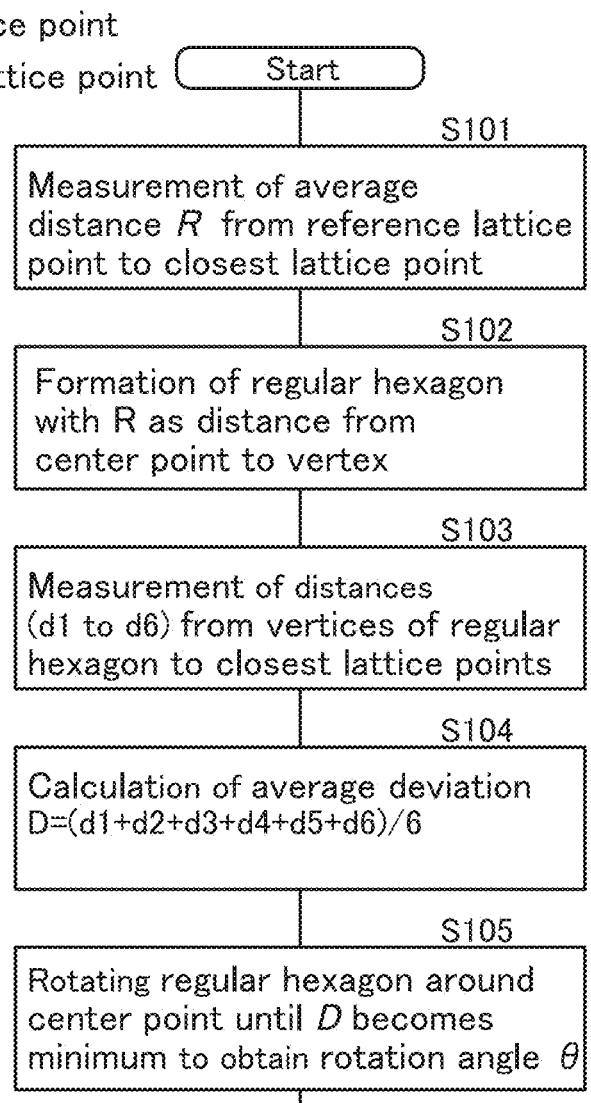

First, a reference lattice point was determined and the six closest lattice points to the reference lattice point were connected to form a hexagonal lattice (see FIG. 23(A) and Step S101 in FIG. 23(D)). After that, an average distance R between the reference lattice point, which was the center point of the hexagonal lattice, and each of the lattice points, which is a vertex, was calculated. Then, a regular hexagon was formed with the use of the reference lattice point as the center point and the calculated distance R as the distance from the center point to each vertex (see Step S102 in FIG. 23(D)). The distances from the vertexes of the regular hexagon to their respective closest lattice points were regarded as a distance d1, a distance d2, a distance d3, a distance d4, a distance d5, and a distance d6 (see FIG. 23(B) and Step S103 in FIG. 23(D)).

Next, the regular hexagon was rotated around the center point through 60° by 0.1°, and the average deviation between the hexagonal lattice and the rotated regular hexagon [D=(d1+d2+d3+d4+d5+d6)/6] was calculated (see Step S104 in FIG. 23(D)). Then, a rotation angle θ of the regular hexagon when the average deviation D becomes minimum was calculated as the orientation of the hexagonal lattice (see Step S105 in FIG. 23(D)). Here, the average orientation of hexagonal lattice within a 1-nm radius was calculated. Note that when the direction of a straight line connecting the reference lattice point and one of the vertexes of the regular hexagon overlapped with the L length direction, the angle of the hexagonal lattices was 0°.

The plan-view TEM image obtained through image processing was then shown in such a manner that color or gradation changes in accordance with the angle of the hexagonal lattice in the region. The image obtained through image processing of the plan-view TEM image is an image obtained by performing image analysis on the plan-view TEM image by the above method and applying gradation in accordance with the angle of the hexagonal lattice. In other words, the image obtained through the image processing of the plan-view TEM image is an image in which the orientations of lattice points in certain wavenumber ranges are extracted by color-coding the certain wavenumber ranges in an FFT filtering image of the plan-view TEM image.

Figure 24A:
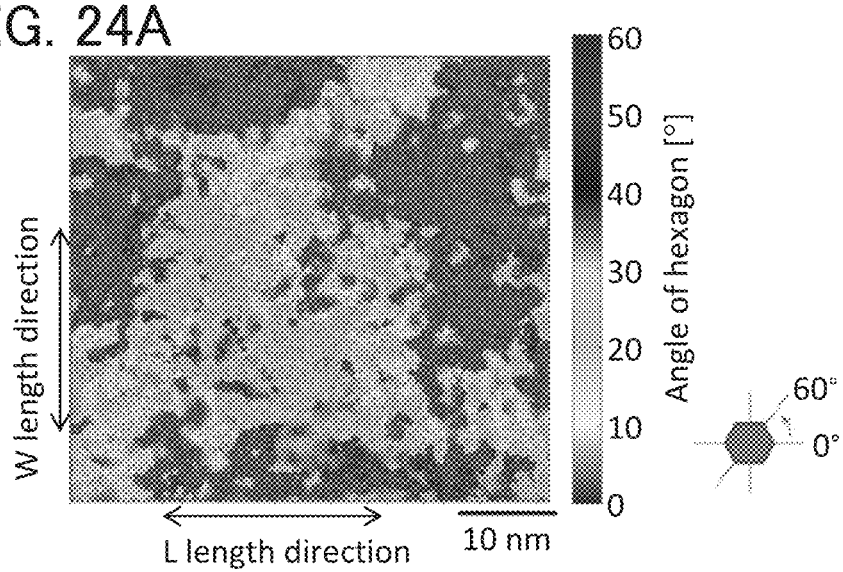
FIGS. 24A-24C Views illustrating plan-view TEM images to which image processing is subjected of a sample of Example.
Figure 24B:
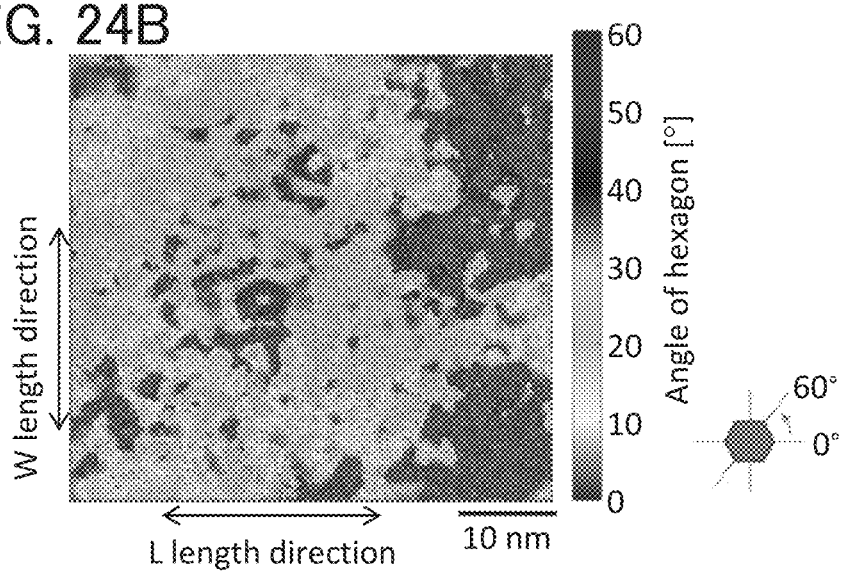
Figure 24C:
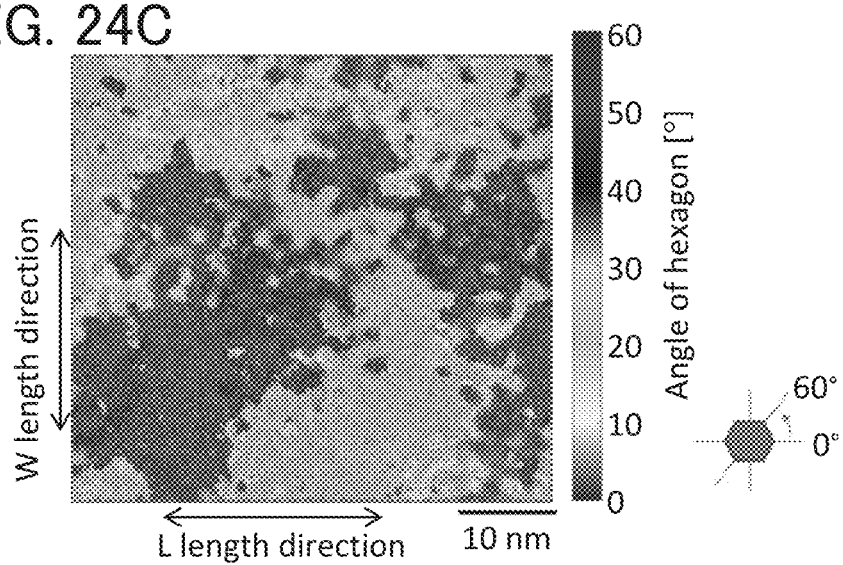

FIG. 24 shows an image processing of the plan-view TEM images of the oxides of the transistor 1A to the transistor 3A. FIG. 24(A) is an image processing image of the oxide of the transistor 1A, FIG. 24(B) is an image processing image processing image of the oxide of the transistor 2A, and FIG. 24(C) is an image processing image of the oxide included in the transistor 3A.

It is found from FIG. 24 that in any of the oxides included in the transistor 1A to the transistor 3A, a region where the angles of the hexagonal lattices are the same angle exists in a broader area than the size of the nanocrystal (a minute region having a periodic atomic order). Furthermore, since the variations in transistor characteristics shown in FIG. 22 are small even when the distribution of the angles of the hexagonal lattices are different between the transistor 1A to the transistor 3A, it can be assumed that there is little or no effect of the difference in distribution of the angles of the hexagonal lattices on the transistor characteristics.

Next, Voronoi diagrams were formed from the lattice point groups of oxides included in the transistor 1A to the transistor 3A. A Voronoi diagram is an image partitioned by regions including a lattice point group. Each lattice point is the closest from a region surrounding the lattice points. A method for forming a Voronoi diagram is described below in detail using schematic diagrams in FIGS. 25(A) to 25(D) and a flow chart in FIG. 25(E).

Figure 25A:
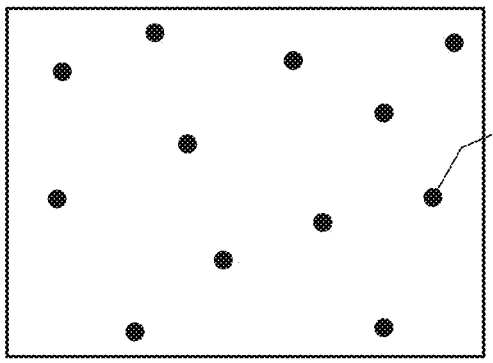
FIGS. 25A-25E Views illustrating a method for forming a Voronoi diagram.
Figure 25B:
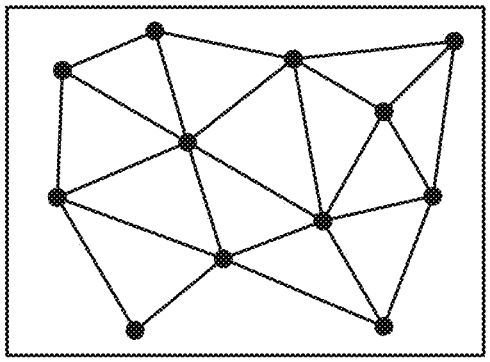
Figure 25C:
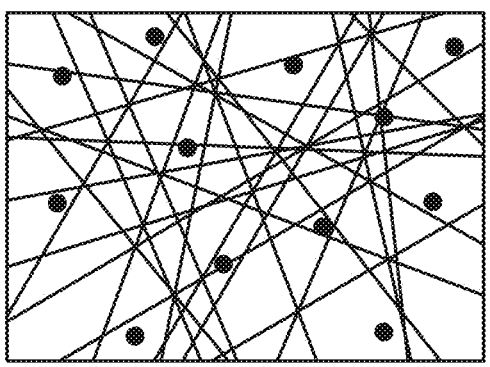
Figure 25D:
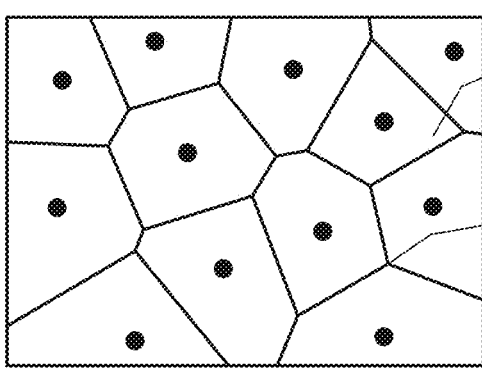
Figure 25E:
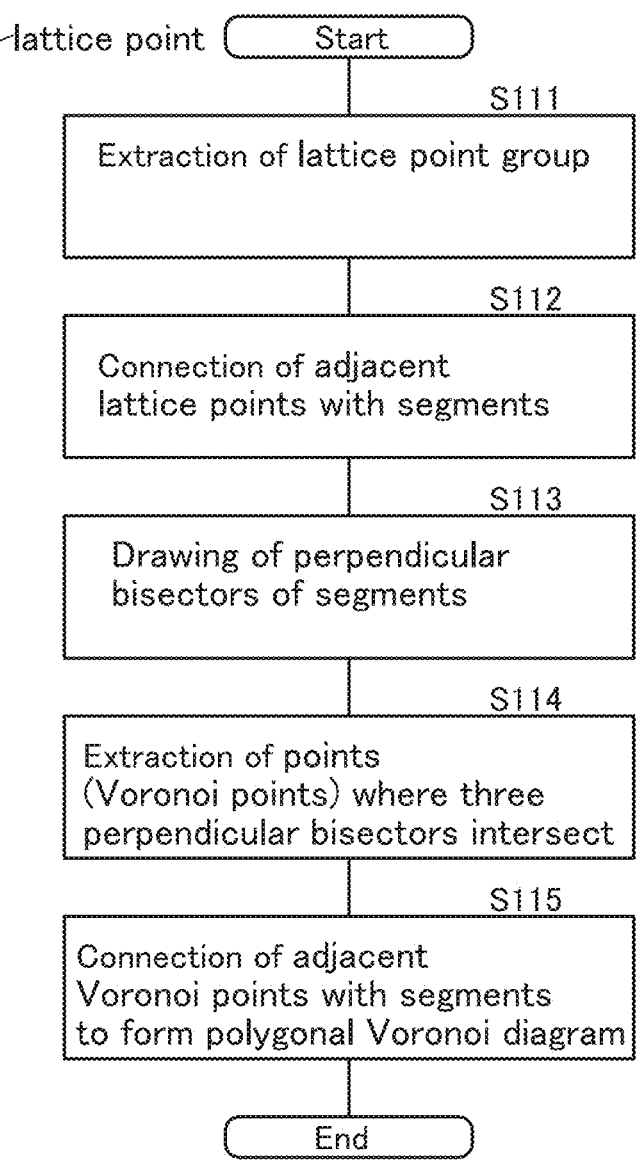

First, a lattice point group was extracted by the method shown in FIG. 23 or the like (see FIG. 25(A) and Step S111 in FIG. 25(E)). Next, adjacent lattice points were connected with line segments (see FIG. 25(B) and Step S112 in FIG. 25(E)). Then, perpendicular bisectors of the line segments were drawn (see FIG. 25(C) and Step S113 in FIG. 25(E)). Subsequently, points where three perpendicular bisectors intersect were extracted (see Step S114 in FIG. 25(E)). The points are called Voronoi points. After that, adjacent Voronoi points were connected with line segments (see FIG. 25(D) and Step S115 in FIG. 25(E)). A polygonal region surrounded by the segments at this point is called a Voronoi region. In the above method, a Voronoi diagram was formed.

In the case where a crystal structure of the oxide has a hexagonal lattice, a trigonal lattice, or a rhombohedral lattice as a Bravais lattice, the proportion of the Voronoi region with a hexagonal shape in a single crystal oxide is 100%. When the oxide has crystallinity, for example, the CAAC structure or the nc structure, the shape of the Voronoi region is a polygon other than a hexagon in the distortion of the oxide in some cases. Therefore, the proportion of the hexagonal Voronoi regions in the oxide is assumed to be high; however, the proportion of polygons other than a hexagon is assumed to exist. The proportion of the hexagonal Voronoi regions iangles, for example, 50% to 90% inclusive.

Figure 26A:
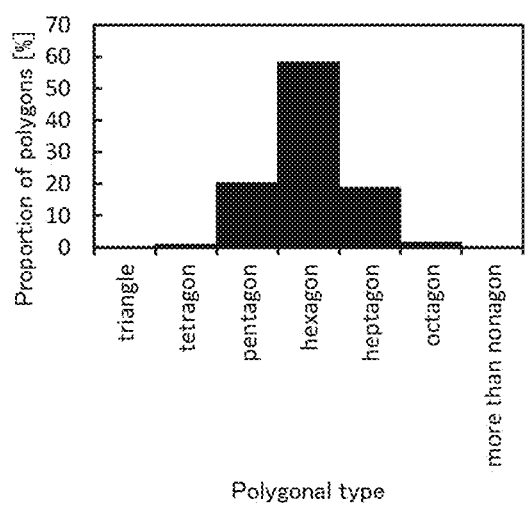
FIGS. 26A-26C Views showing the proportion of shapes of Voronoi regions in a sample of Example.
Figure 26B:
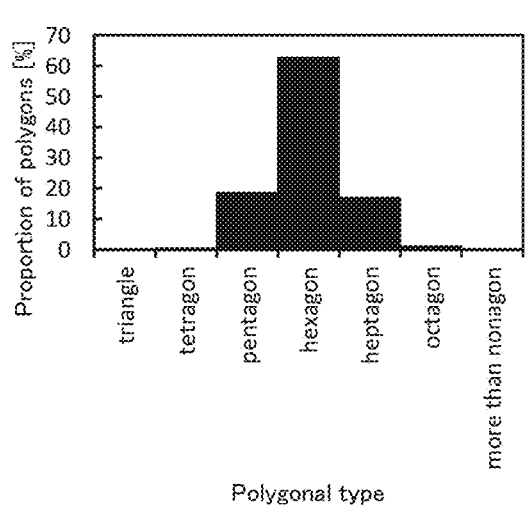
Figure 26C:
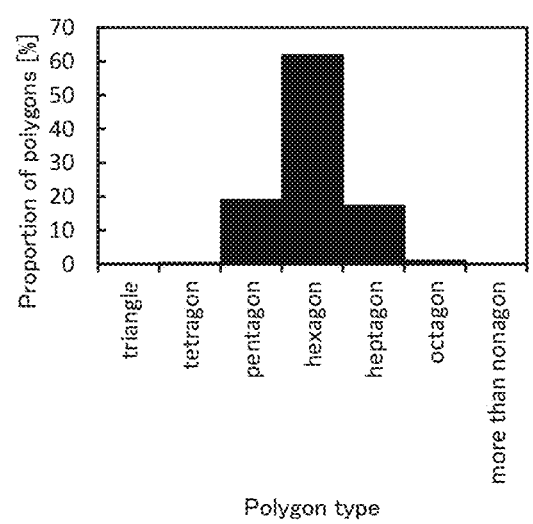

FIG. 26 shows the proportion of the Voronoi regions with trigonal to octagonal shapes and a polygon shape more than nonagon in the oxides included in the transistor 1A to the transistor 3A. FIG. 26(A) shows the proportion in the oxide included in the transistor 1A, FIG. 26(B) shows the proportion in the oxide included in the transistor 2A, and FIG. 26(C) shows the proportion in the oxide included in the transistor 3A. Note that both the bar graphs and the tables shown in FIG. 26 show the proportion of the Voronoi regions with trigonal to octagonal shapes and a polygon shape more than nonagon in the oxides included in the transistors.

According to FIG. 26, it is found that in all of the transistor 1A to the transistor 3A, the proportion of hexagons is the highest, the proportion of pentagons or heptagons is the second highest, and the proportion of polygons less than tetragon or polygons more than octagon is low. In addition, the proportions of hexagons in the transistor 1A, the transistor 2A, and the transistor 3A were 58%, 63%, and 62%, respectively.

At least part of this example can be implemented in combination with any of the other embodiments described in this specification as appropriate.

REFERENCE NUMERALS

100: capacitor, 110: conductor, 112: conductor, 120: conductor, 130: insulator, 150: insulator, 200: transistor, 205: conductor, 210: insulator, 212: insulator, 214: insulator, 216: insulator, 218: conductor, 220: insulator, 222: insulator, 224: insulator, 224A: insulating film, 230: oxide, 230*a*: oxide, 230A: oxide film, 230*b*: oxide, 230B: oxide film, 230*c*: oxide, 240: conductor, 240*a*: conductor, 240*b*: conductor, 241: insulator, 241*a*: insulator, 241*b*: insulator, 242: conductor, 242*a*: conductor, 242A: conductive film, 242*b*: conductor, 242B: conductor layer, 243*a*: conductor, 243A: conductive film, 243*b*: conductor, 243B: conductor layer, 244: resist, 246: conductor, 250: insulator, 254: insulator, 260: conductor, 260*a*: conductor, 260*b*: conductor, 273: insulator, 273*a*: insulator, 273A: insulating film, 273*b*: insulator, 273B: insulating layer, 274: insulator, 276: insulator, 280: insulator, 281: insulator, 282: insulator, 300: transistor, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 400: transistor, 405: conductor, 405*a*: conductor, 405*b*: conductor, 430*c*: oxide, 431*a*: oxide, 431*b*: oxide, 432*a*: oxide, 432*b*: oxide, 440: conductor, 440*a*: conductor, 440*b*: conductor, 442*a*: conductor, 442*b*: conductor, 450: insulator, 460: conductor, 460*a*: conductor, 460*b*: conductor, 1001: wiring, 1002: wiring, 1003: wiring, 1004: wiring, 1005: wiring, 1006: wiring, 1007: wiring, 1008: wiring, 1009: wiring, 1010: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1200: chip, 1201: PCB, 1202: bump, 1203: motherboard, 1204: GPU module, 1211: CPU, 1212: GPU, 1213: analog arithmetic portion, 1214: memory controller, 1215: interface, 1216: network circuit, 1221: DRAM, 1222: flash memory, 1400: memory device, 1411: peripheral circuit, 1420: row circuit, 1430: column circuit, 1440: output circuit, 1460: control logic circuit, 1470: memory cell array, 1471: memory cell, 1472: memory cell, 1473: memory cell, 1474: memory cell, 1475: memory cell, 1476: memory cell, 1477:

memory cell, 1478: memory cell, 4000: device, 4010: atmosphere-side substrate supply chamber, 4012: atmosphere-side substrate transfer chamber, 4014: cassette port, 4016: alignment port, 4018: transfer robot, 4020a: load lock chamber, 4020b: unload lock chamber, 4024a: treatment chamber, 4024b: treatment chamber, 4026: transfer robot, 4028: gate valve, 4029: transfer chamber, 4030a: transfer chamber, 4030b: transfer chamber, 4034a: treatment chamber, 4034b: treatment chamber, 4034c: treatment chamber, 4034d: treatment chamber, 4034e: treatment chamber, 4036: transfer robot, 4038: gate valve, 4039: transfer chamber, 5200: portable game machine, 5201: housing, 5202: display portion, 5203: button, 5300: desktop information terminal, 5301: main body, 5302: display, 5303: keyboard, 5500: information terminal, 5510: housing, 5511: display portion, 5600: TV, 5650: antenna, 5670: radio wave tower, 5675A: radio wave, 5675B: radio wave, 5680: broadcast station, 5700: automobile, 5701: display panel, 5702: display panel, 5703: display panel, 5704: display panel, 5800: refrigerator-freezer, 5801: housing, 5802: refrigerator door, 5803: freezer door

The invention claimed is:
1. A semiconductor device comprising:
a first insulator;
a second insulator over the first insulator;
a first oxide over the first insulator;
a second oxide over the first oxide;
a first conductor and a second conductor over the second oxide;
a third insulator over the first conductor;
a fourth insulator over the second conductor;
a third oxide over the second oxide;
a fifth insulator over the third oxide;
a third conductor that is positioned over the fifth insulator and overlaps with the third oxide;
a sixth insulator covering the first to fifth insulators, the first oxide, the second oxide, the third oxide, and the first to third conductors; and
a seventh insulator over the sixth insulator;
wherein the sixth insulator is in contact with part of a top surface of the first insulator, a side surface of the second insulator, a side surface of the fifth insulator, side surfaces of the first to third oxides, side surfaces of the first to third conductors, and a top surface of the third conductor.

2. The semiconductor device according to claim 1, wherein each of the first insulator, the sixth insulator, and the seventh insulator suppresses transmission of one or both of oxygen and hydrogen more than the second insulator.

3. The semiconductor device according to claim 1, wherein each of the first insulator, the sixth insulator, and the seventh insulator transmits one or both of oxygen and hydrogen to a lesser extent than the fifth insulator.

4. The semiconductor device according to claim 1, wherein each of the first insulator and the sixth insulator is an oxide including one or both of aluminum and hafnium.

5. The semiconductor device according to claim 1, wherein each of the first insulator and the sixth insulator is aluminum oxide.

6. The semiconductor device according to claim 1, wherein the seventh insulator includes silicon and nitrogen.

7. The semiconductor device according claim 1, wherein the first to third oxides contain In, an element M (M is Al, Ga, Y, or Sn), and Zn.

8. The semiconductor device according to claim 7,
wherein the second oxide includes a lattice point group obtained by analyzing a transmission electron microscope image of a top surface of the second oxide, and
wherein the proportion of hexagon Voronoi regions in a Voronoi diagram composed of the lattice point group is higher than or equal to 50% and lower than or equal to 80%.

9. A method for manufacturing a semiconductor device, comprising the steps of:
depositing a first insulating film;
depositing a second insulating film over the first insulating film;
depositing a third insulating film over the second insulating film;
depositing a first oxide over the third insulating film;
depositing a second oxide over the first oxide;
depositing a first conductive film over the second oxide;
depositing a fourth insulating film over the first conductive film;
depositing a second conductive film over the fourth insulating film;
processing part of the second conductive film by a lithography method to form an opening in which the fourth insulating film is exposed in the second conductive film;
processing the second conductive film, the fourth insulating film, and the first conductive film by a lithography method to form a first layer including the second conductive film including the opening, the fourth insulating film, and the first conductive film;
processing the second oxide and the first oxide using the first layer as an etching mask;
removing the fourth insulating film exposed in the opening to expose the first conductive film in the opening;
removing the second conductive film and the first conductive film exposed in the opening to expose the second oxide in the opening, divide the first conductive film into a first conductor and a second conductor, and divide the fourth insulating film into a first insulator and a second insulator;
processing the second insulating film to form a second layer including the second insulating film, the first oxide, the second oxide, the first conductor, the second conductor, the first insulator, and second insulator;
depositing a third oxide over the first insulating film and the second layer;
depositing a fifth insulating film over the third oxide;
depositing a third conductive film over the fifth insulating film;
processing the third conductive film, the fifth insulating film, and the third oxide by a lithography method to form a third layer including the third conductive film, the fifth insulating film, and the third oxide; and
depositing a sixth insulating film over the first insulating film, the second layer, and the third layer.

10. The method for manufacturing a semiconductor device according to claim 9, wherein the deposition of the third oxide, the deposition of the fifth insulating film, and the deposition of the third conductive film are successively deposited under a reduced pressure using a deposition apparatus including a plurality of treatment chambers.

11. The method for manufacturing a semiconductor device according to claim 9, wherein the deposition of the first insulating film, the deposition of the second insulating film, the deposition of the third insulating film, the deposition of the first oxide, the deposition of the second oxide, the deposition of the first conductive film, the deposition of the fourth insulating film, and the deposition of the second conductive film are successively deposited under a reduced pressure using a deposition apparatus including a plurality of treatment chambers.

12. The method for manufacturing a semiconductor device according to claim 11, wherein in the treatment chamber, deposition is performed by a sputtering method.

\* \* \* \* \*